US010388897B2

(12) United States Patent
Snaith et al.

(10) Patent No.: US 10,388,897 B2
(45) Date of Patent: Aug. 20, 2019

(54) OPTOELECTRONIC DEVICE COMPRISING POROUS SCAFFOLD MATERIAL AND PEROVSKITES

(71) Applicant: ISIS INNOVATION LIMITED, Oxford (GB)

(72) Inventors: Henry Snaith, Oxfordshire (GB); Michael Lee, Oxfordshire (GB)

(73) Assignee: OXFORD UNIVERSITY INNOVATION LIMITED, Oxford (GB)

( * ) Notice: Subject to any disclaimer, the term of this patent is extended or adjusted under 35 U.S.C. 154(b) by 215 days.

(21) Appl. No.: 14/401,394

(22) PCT Filed: May 20, 2013

(86) PCT No.: PCT/GB2013/051307
§ 371 (c)(1),
(2) Date: Nov. 14, 2014

(87) PCT Pub. No.: WO2013/171518
PCT Pub. Date: Nov. 21, 2013

(65) Prior Publication Data
US 2015/0122314 A1   May 7, 2015

(30) Foreign Application Priority Data

May 18, 2012  (GB) .................................. 1208794.6
Jun. 13, 2012  (GB) .................................. 1210489.9

(51) Int. Cl.
*H01L 51/42*   (2006.01)
*H01L 31/032*  (2006.01)
*H01L 31/0256* (2006.01)

(52) U.S. Cl.
CPC ...... *H01L 51/4213* (2013.01); *H01L 31/0324* (2013.01); *H01L 51/422* (2013.01);
(Continued)

(58) Field of Classification Search
CPC ............. H01L 51/4213; H01L 51/4253; H01L 51/424; H01L 51/422
See application file for complete search history.

(56) References Cited

U.S. PATENT DOCUMENTS

| 5,084,365 A | * | 1/1992 | Gratzel ................ H01G 9/2031 429/111 |
| 5,550,391 A | | 8/1996 | Yamaguchi |

(Continued)

FOREIGN PATENT DOCUMENTS

| CN | 1280394   | 1/2001 |
| CN | 101635203 | 9/2011 |

(Continued)

OTHER PUBLICATIONS

Tamboli, Sikander H; Studies on mechanical and optical properties of magnesium oxide, aluminum oxide and their co-deposited mixed thin films—Chapter 4: Experimental results of aluminum oxide (Al2O3) thin films; Kolhapur; published May 4, 2012; pp. 145-169; http://shodhganga.inflibnet.ac.in/bitstream/10603/4037/10/10_chapter%204.pdf.*

(Continued)

*Primary Examiner* — Edward J. Schmiedel
(74) *Attorney, Agent, or Firm* — Kenneth H. Sonnenfeld; Rajesh D. Patel; King & Spalding LLP

(57) ABSTRACT

The invention provides an optoelectronic device comprising: (i) a porous dielectric scaffold material; and (ii) a semiconductor having a band gap of less than or equal to 3.0 eV, in contact with the scaffold material. Typically the semiconductor, which may be a perovskite, is disposed on the surface of the porous dielectric scaffold material, so that it is supported on the surfaces of pores within the scaffold. In one embodiment, the optoelectronic device is an optoelectronic device which comprises a photoactive layer, wherein the photoactive layer comprises: (a) said porous (Continued)

dielectric scaffold material; (b) said semiconductor; and (c) a charge transporting material. The invention further provides the use, as a photoactive material in an optoelectronic device, of: (i) a porous dielectric scaffold material; and (ii) a semiconductor having a band gap of less than or equal to 3.0 eV, in contact with the scaffold material. Further provided is the use of a layer comprising: (i) a porous dielectric scaffold material; and (ii) a semiconductor having a band gap of less than or equal to 3.0 eV, in contact with the scaffold material; as a photoactive layer in an optoelectronic device. In another aspect, the invention provides a photoactive layer for an optoelectronic device comprising (a) a porous dielectric scaffold material; (b) a semiconductor having a band gap of less than or equal to 3.0 eV, in contact with the scaffold material; and (c) a charge transporting material.

32 Claims, 14 Drawing Sheets

(52) U.S. Cl.
CPC .. *H01L 51/4226* (2013.01); *H01L 2031/0344* (2013.01); *Y02E 10/549* (2013.01)

(56) References Cited

U.S. PATENT DOCUMENTS

| | | | |
|---|---|---|---|
| 5,721,634 A | 2/1998 | Rosker | |
| 5,871,579 A | 2/1999 | Liang et al. | |
| 5,882,548 A | 3/1999 | Liang | |
| 6,097,040 A | 8/2000 | Morimoto et al. | |
| 6,150,536 A | 11/2000 | Chondroudis et al. | |
| 6,180,956 B1 | 1/2001 | Chondroudis et al. | |
| 6,281,429 B1 | 8/2001 | Takada et al. | |
| 6,429,318 B1 | 8/2002 | Mitzi | |
| 7,045,205 B1 | 5/2006 | Sager | |
| 7,511,298 B2* | 3/2009 | Kawaraya | C23C 24/00 257/43 |
| 2003/0010971 A1 | 1/2003 | Zhang | |
| 2005/0236033 A1 | 10/2005 | Lawandy | |
| 2006/0032529 A1 | 2/2006 | Rand et al. | |
| 2007/0007538 A1 | 1/2007 | Ono et al. | |
| 2007/0082227 A1 | 4/2007 | Kobayashi et al. | |
| 2007/0194311 A1 | 8/2007 | Kojima et al. | |
| 2008/0185037 A1* | 8/2008 | Kim | H01G 9/2031 136/252 |
| 2008/0202583 A1 | 8/2008 | Lee | |
| 2009/0032097 A1* | 2/2009 | Bigioni | H01G 9/2027 136/256 |
| 2010/0213440 A1 | 8/2010 | Shieh et al. | |
| 2010/0294350 A1 | 11/2010 | Ko et al. | |
| 2011/0089402 A1 | 4/2011 | Qi | |
| 2011/0277818 A1* | 11/2011 | Shimura | H01G 9/2068 136/246 |
| 2011/0287939 A1 | 11/2011 | Goyal | |
| 2013/0233377 A1 | 9/2013 | Kanatzidis et al. | |
| 2015/0034150 A1 | 2/2015 | Snaith et al. | |

FOREIGN PATENT DOCUMENTS

| | | |
|---|---|---|
| CN | 102468413 | 5/2012 |
| EP | 1207556 | 5/2002 |
| JP | H07147428 | 6/1995 |
| JP | 1140854 | 2/1999 |
| JP | 2002198551 | 7/2002 |
| JP | 2004 134581 | 4/2004 |
| JP | 3 542 077 | 7/2004 |
| JP | 2005093485 | 4/2005 |
| JP | 2007 031178 | 2/2007 |
| JP | 2008-189947 | 8/2008 |
| JP | 2010 009786 | 1/2010 |
| JP | 2011 076791 | 4/2011 |
| KR | 10-2003-0020854 | 3/2003 |
| KR | 10-2011-0076046 | 7/2011 |
| KR | 10-1172374 | 8/2012 |
| WO | WO 99/65085 | 12/1999 |
| WO | WO 2006/034561 | 4/2006 |
| WO | WO 2010/118321 | 10/2010 |
| WO | WO 2011/030117 | 3/2011 |
| WO | WO 2011/064601 | 6/2011 |
| WO | WO 2011/110869 | 9/2011 |
| WO | WO 2012/073010 | 6/2012 |
| WO | WO 2013/126537 | 8/2013 |
| WO | WO 2013/171517 | 11/2013 |
| WO | WO 2013/171520 | 11/2013 |

OTHER PUBLICATIONS

P. N. Nirmala, et al.; Synthesis and Characterization of Barium Titanate, Calcium Titanate and Strontium Titanate Thin Films; International Journal of Scientific & Engineering Research; vol. 5; issue 7; Jul. 2014; pp. 587-594; http://www.ijser.org/researchpaper%5CSynthesis-and-Characterization-of-Barium-Titanate-Calcium.pdf.*

Edri, Eran et al.; High Open-Circuit Voltage Solar Cells Based on Organic-Inorganic Lead Bromide Perovskite; J. Phys Chem. Lett. 2013, 4, 897-902.*

Choi, Joshua J. et al.; Structure of methylammonium leadio iodide within mesoporous titanium dioxide: Active material in high-performance perovskite solar cells; Nano Lett. 2014, 14, 127-133.*

Ding, I-Kang, et al.; Pore-filling of spiro-OMeTAD in solid-state dye sensitized solar cells: quantificiation, mechanism, and consequences for device performance; Adv. Funct. Mater. 2009, 19, 2431-2436.*

Kojima, Akihiro, et al.; Highly Luminescent Lead Bromide Perovskite Nanoparticles Synthesized with Porous Alumina Media; Chem. Lett., 2012, 41, pp. 397-399 (Year: 2012).*

Kim, Hui-Seon et al.; Lead Iodide Perovskite Sensitized All-Solid-State Submicron Thin Film Mesoscopic Solar Cell with Efficiency Exceeding 9%; Scientific Reports; Nature; 2: 59; pp. 1-7 (Year: 2012).*

Aaron et al., "Device Characteristics of a 10.1% hydrazine-processed $Cu_2ZnSn(Se,S)_4$ Solar Cell," Progress in Photovoltaics: Research and Applications, 20, pp. 6-11, 2012.

Abrusci et al., "Facile Infiltration of Semiconducting Polymer into Mesoporous Electrodes for Hybrid Solar Cells," Energy Environ. Sci. 4, pp. 3051-3058, 2011.

Antila et al., "ALD Grown Aluminum Oxide Submonolayers in Dye-Sensitized Solar Cells: The Effect on Interfacial Electron Transfer and Performance," J. Phys. Chem. C, 115, pp. 16720-16729, 2011.

Bach et al., "Solid-State Dye-Sensitized Mesoporous $TiO_2$ Solar Cells with High Photon-to-Electron Conversion Efficiencies," Nature 395, pp. 583-585, 1998.

Bogush, et al., "Preparation of Monodisperse Silica Particles: Control of Size and Mass Fraction," Journal of Non-Crystalline Solids, 104, pp. 95-106, 1988.

Brown et al., "Surface Energy Relay Between Cosensitized Molecules in Solid-State Dye-Sensitized Solar Cells," J. Phys. Chem. C, 115, pp. 23204-23208, 2011.

Burschka et al., "Tris(2-(1H-pyrazol-1-yl)pyridine)cobalt(III) as p-Type Dopant for Organic Semiconductors and Its Application in Highly Efficient Solid-State Dye-Sensitized Solar Cells," J. Am. Chem. Soc., 133 (45), pp. 18042-18045, 2011.

Chang et al., "Panchromatic Photon-Harvesting by Hole-Conducting Materials in Inorganic-Organic Heterojunction Sensitized-Solar Cell Through the Formation of Nanostructured Electron Channels," Nano Lett. 12, pp. 1863-1867 2012.

Chondroudis et al., "Electroluminescence from an Organic-Inroganic Perovskite Incorporating a Quaterthiophene Dye Within Lead Halide Perovskite Layers," Chem. Mater., 11, pp. 3028-3030, 1999.

Chung et al, "All-Solid-State Dye-Sensitized Solar Cells with High Efficiency," Nature, vol. 485, pp. 486-489, 2012.

(56) References Cited

OTHER PUBLICATIONS

Dennler, et al., "Polymer-Fullerene Bulk-Heterojunction Solar Cells," Advanced Materials 21, pp. 1323-1338, 2009.
Ding et al., "Pore-Filling of Spiro-OMeTAD in Solid-State Dye Sensitized Solar Cells: Quantification, Mechanism, and Consequences for Device Performance," Adv. Funct. Mater. 19, pp. 2431-2436, 2009.
Era et al., "Organicinorganic Heterostructure Electroluminescent Device Using a Layered Perovskite Semiconductor," Appl. Phys. Lett., 65, pp. 676-678, 1994.
Era et al., "Polarized Electroluminescence from Oriented p-sexiphenyl Vacuum-deposited Film," Appl. Phys. Lett. 67(17), pp. 2436-2438, 1995.
Era et al., "Enhanced Phosphorescence from Naphthalene-Chromophore Incorporated into Lead Bromide-Based Layered Perovskite Having Organic-Inorganic Superlattice Structure," Chem. Phys. Lett. 296, pp. 417-420, 1998.
Era et al., "PbBr-Based Layer Perovskite Organic-Inorganic Superlattice Having Hole-Transporting Carbazole Chromophore in Organic Layer," Curr. Appl. Phys., 5, pp. 67-70, 2005.
Green et al., "Solar Cell Efficiency Tables (Version 38)," Prog. Photovolt: Res. Appl., 19, pp. 565-572, 2011.
Green, et al., "Solar Cell Efficiency Tables (version 39)," Progress in Photovoltaics: Research and Applications, 20, pp. 12-20, 2012.
Hagfeldt et al., "Light-Induced Redox Reactions in Nanocrystalline Systems," Chem. Rev., 95, pp. 49-68, 1995.
Halls, et al., "Efficient Photodiodes from Interpenerating Polymer Networks," Nature, 376, pp. 498-500, 1995.
Hines, et al., "Colloidal PbS Nanocrystals with Size-Tunable Near-Infrared Emission: Observation of Post-Synthesis Self-Narrowing of the Particle Size Distribution," Adv. Mater., 15 (21), pp. 1844-1849, 2003.
Im, et al., "6.5% Efficient Perovskite Quantum-dot-Sensitized Solar Cell," Nanoscale 3, pp. 4088-4093, 2011.
Ishihara, "Optical Properties of PbI-based Perovskite Structures," Journal of Luminescence, 60&61, pp. 269-274, 1994.
Itzhaik, et al., "Sb253-Sensitized Nanoporous $TiO_2$ Solar Cells," J. Phys. Chem. C, 113, pp. 4254-4256, 2009.
Kagan, et al., "Organic-Inorganic Hybrid Materials as Semiconducting Channels in Thin-Film Field-Effect Transistors," Science 286, pp. 945-947, 1999.
Kavan, et al., "Highly Efficient Semiconducting $TiO_2$ Photoelectrodes Prepared by Aerosol Pyrolysis," Electrochim. Acta, 40, pp. 643-652, 1995.
Kay et al., "Artificial Photosynthesis. 2. Investigations on the Mechanism of Photsensitization of Nanocrystalline $TiO_2$ Solar Cells by Chlorophyll Derivatives," J. Phys. Chem., 98, pp. 952-959, 1994.
Kitazawa et al., "Optical Properties of $CH_3NH_3PbX_3$ (X=halogen) and Their Mixed-Halide Cystals," J. Mat Sci., 37, pp. 3585-3587, 2002.
Knop et al., "Alkylammonium Lead Halides. Part 2. $CH_3NH_3PbX_3$(X= Cl, Br, I) Perovskites: Cuboctahedral Halide Cages with Isotropic Cation Reorientation," Can. J. Chem., 68, pp. 412-422, 1990.
Knutson et al., "Tuning the Band Gap in Hybrid Tin Iodide Perovskite Semiconductors Using Structural Templating," Inorg. Chem., 44, pp. 4699-4705, 2005.
Kojima et al., "Organometal Halide Perovskites as Visible-Light Sensitizers for Photovoltaic Cells," J. Am. Chem. Soc. 131, pp. 6050-6051, 2009.
Kojima et al, "Novel Photoelectrochemical Cell with Mesoscopic Electrodes Sensitized by Lead-Halide Compounds," 214th ECS Meeting, Abstract #27, downloaded on Nov. 30, 2015.
Koops et al., "Transient Emission Studies of Electron Injection in Dye Sensitised Solar Cells," Inorganica Chimica Acta, 361, pp. 663-670, 2008.
Koops et al., "Parameters Influencing the Efficiency of Electron Injection in Dye-Sensitized Solar Cells," JACS, 131(13), pp. 4808-4818, 2009.

Lee et al, "Efficient Hybrid Solar Cells Based on Meso-Superstructured Organometal Halide Perovskites", Science, vol. 338, pp. 643-647, 2012.
Lee et al., "Quantum-Dot-Sensitized Solar Cell With Uprecedentedly High Photocurrent," Scientific Reports, 3 (1050), pp. 1-8, 2013.
Leijtens et al., "Hole Transport Materials with Low Glass Transition Temperatures and High Solubility for Application in Solid-State Dye-Sensitized Solar Cells," ACS Nano, 6 (2), pp. 1455-1462, 2012.
Leventis et al., "Transient Optical Studies of Interfacial Charge Transfer at Nanostructured Metal Oxide/PbS Quantum Dot/Organic Hole Conductor Heterojunctions," JACS, 132, pp. 2743-2750, 2010.
Li et al., "Formability of $ABX_3$ (X=F, Cl, Br, I) Halide Perovskites," Acta Cryst., B64, pp. 702-707, 2008.
Lin et al., "Enhanced Performance of Dye-Sensitized Solar Cells by an $Al_2O_3$ Charge-Recombination Barrier Formed by Low-Temperature Atomic Layer Deposition," J. Mater. Chem., 19, pp. 2999-3003, 2009.
Martinson et al., "Radial Electron Collection in Dye-Sensitized Solar Cells," Nano Lett., vol. 8, No. 9, pp. 2862-2866, 2008.
Megaw, "Compounds of the Structural Type of Calcium Titanate," Nature 155, pp. 484-485, 1945.
Melas-Kyriazi et al., "The Effect of Hole Transport Material Pore Filling on Photovoltaic Performance in Solid-State Dye-Sensitized Solar Cells," Adv. Energy. Mater. 1, pp. 407-414, 2011.
Mitzi, "Synthesis, Structure, and Properties of Organic-Inorganic Perovskites and Related Materials," Prog. Inorg. Chem., 48, pp. 1-121, 1999.
Mitzi et al., "Design, Structure, and Optical Properties of Organic-Inorganic Perovskites Containing an Oligothiophene Chromophore," Inorg. Chem., 38, pp. 6246-6256, 1999.
Mitzi et al., "Conducting Tin Halides with a Layered Organic-Based Perovskite Structure," Nature., 369, pp. 467-469, 1994.
Mitzi et al., "Conducting Layered Organic-Inorganic Halides Containing <110>-Oriented Perovskite Sheets," Science., 267 (5203), pp. 1473-1476, 1995.
Mitzi et al., "High-Mobility Ultrathin Semiconducting Films Prepared by Spin Coating," Nature, 428, pp. 299-303, 2004.
O'Regan et al., "A Low-Cost, High-Efficiency Solar-Cell Based on Dye- Sensitized Colloidal TiO2 Films," Nature 353, pp. 737-740, 1991.
Palomares et al., "Slow Charge Recombination in Dye-Sensitised Solar Cells (DSSC) using $Al_2O_3$ Coated Nanoporous $TiO_2$ Films," Chemical Communications, pp. 1464-1465, 2002.
Peacock et al., "Band Offsets and Schottky Barrier Heights of High Dielectric Constant Oxides," J. Appl. Phys., vol. 92, No. 8, pp. 4712-4721, 2002.
Pernik et al., "Tracking the Adsorption and Electron Injection Rates of CdSe Quantum Dots on $TiO_2$: Linked Versus Direct Attachment," J. Phys. Chem. C, 115 (27), pp. 13511-13519, 2011.
Poglitsch et al., "Dynamic Disorder in Methylammoniumtrihalogenoplumbates (II) Observed by Millimeter-Wave Spectroscopy," J. Chem. Phys., 87(11), pp. 6373-6378, 1987.
Roelofs et al., "Effect of $Al_2O_3$ Recombination Barrier Layers Deposited by Atomic Layer Deposition in Solid State CdS Quantum Dot-Sensitized Solar Cells," J. Phys. Chem. C, 117, pp. 5584-5592, 2013.
Snaith et al., "The Role of a "Schottky Barrier" at an Electron-Collection Electrode in Solid-State Dye-Sensitized Solar Cells," Adv. Mater. 18, pp. 1910-1914, 2006.
Snaith et al., "Advances in Liquid-Electrolyte and Solid-State Dye-Sensitized Solar Cells," Advanced Materials, 19, pp. 3187-3200, 2007.
Snaith et al., "Charge Collection and Pore Filling in Solid-State Dye-Sensitized Solar Cells," Nanotechnology 19, pp. 424003-424015, 2008.
Snaith et al., "Charge Generation and Photovoltaic Operation of Solid-State Dye-Sensitized Solar Cells Incorporating a High Extinction Coefficient Indolene-Based Sensitizer," Adv. Func. Mater., 19, pp. 1-9, 2009.

(56) References Cited

OTHER PUBLICATIONS

Snaith, "Estimating the Maximum Attainable Efficiency in Dye-Sensitized Solar Cells," Adv. Funct. Mater. 20, pp. 13-19, 2010.
Sourisseau et al., "Hybrid Perovskite Resulting from the Solid-State Reaction between the Organic Cations and Perovskite Layers of $\alpha 1\text{-}(Br\text{-}(CH_2)_2\text{-}NH_3)_2PbI_4$," Inorg. Chem., 46, pp. 6148-6154, 2007.
Tang et al., "Colloidal-Quantum-dot Photovoltaics Using Atomic-Ligand Passivation," Nature Materials 10, pp. 765-771, 2011.
Todorov et al., "Efficiency Solar Cell with Earth-Abundant Liquid-Processed Absorber," Adv. Mater., 22, pp. E156-E159, 2010.
Tokito et al., "Structures and Optical Properties of Organic/Inorganic Superlattices," Appl. Phys. Lett. 64, pp. 1353-1355, 1994.
Vincent et al., "Alkylammonium Lead Halides. Part 1. Isolated $PbI_6^{4-}$ Ions in $(CH_3NH_3)_4PbI_6 \cdot 2H_2O$)," Can. J. Chem., 65, pp. 1042-1046, 1987.
Yamada et al., "Tunable Perovskite Semiconductor $CH_3NH_3SnX_3$ (X: Cl, Br, or I) Characterized by X-ray and DTA," Bull. Chem. Soc. Jpn., 84(9), pp. 926-932, 2011.
Yan et al., "A High-Mobility Electron-Transporting Polymer for Printed Transistors," Nature, vol. 457, pp. 679-687, Feb. 2009.
Yella, et al., "Porphyrin-Sensitized Solar Cells with Cobalt (II/III)-Based Redox Electrolyte Exceed 12 Percent Efficiency," Science 334, pp. 629-634, 2011.
Yu, et al., "Polymer Photovoltaic Cells: Enhanced Efficiencies via a Network of Internal Donor-Acceptor Heterojunctions," Science 270, pp. 1789-1791, 1995.
Zhang et al,. "Dye-sensitized Solar Cells Made from $BaTiO_3$-coated $TiO_2$ Nanoporous Electrodes," Journal of Photochemistry and Photobiology A: Chemistry 197, pp. 260-265, 2008.
Experimental Annex "A", pp. 1-6, Filed with the European Patent Office on Sep. 1, 2014 in Response to the Written Opinion of the International Preliminary Examining Authority of PCT Application No. PCT/GB2013/051307 dated May 30, 2014.
Isis Innovation Limited, Notification of Transmittal of the International Search Report and the Written Opinion of the International Searching Authority, or the Declaration for PCT/GB2013/051307, dated Aug. 6, 2013, 12 pages.
Isis Innovation Limited, PCT Demand for PCT/GB2013/051307, Mar. 17, 2014, 10 pages.
Isis Innovation Limited, Invitation to Submit Amendments for PCT/GB2013/051307, dated Apr. 2, 2014, 1 page.
Isis Innovation Limited, Amendments made under Article 34 for PCT/GB2013/051307, dated May 2, 2014, 36 pages.
Isis Innovation Limited, Written Opinion of the International Preliminary Examining Authority for PCT/GB2013/051307, dated May 30, 2014, 5 pages.
Isis Innovation Limited, Extension of Time for PCT/GB2013/051307, Jun. 20, 2014, 2 pages.
Isis Innovation Limited, Response to the Written Opinion of the International Preliminary Examining Authority for PCT/GB2013/051307, dated Sep. 1, 2014, 89 pages.
Isis Innovation Limited, Written Opinion of the International Preliminary Examining Authority for PCT/GB2013/051307, dated Sep. 16, 2014, 7 pages.
Isis Innovation Limited, Response to the Written Opinion of the International Preliminary Examining Authority for PCT/GB2013/051307, dated Oct. 16, 2014, 30 pages.
Isis Innovation Limited, Notification of Transmittal of the International Preliminary Report on Patentability for PCT/GB2013/051307, dated Nov. 18, 2014, 32 pages.
Isis Innovation Limited, European regional phase entry for European Patent Application No. 13723944.8, Nov. 26, 2014, 36 pages.
Isis Innovation Limited, Communication pursuant to Rules 161(1) and 162 EPC for European Patent Application No. 13723944.8, dated Jan. 7, 2015, 2 pages.
Isis Innovation Limited, Communication under Rule 71(3) EPC for European Patent Application No. 13723944.8, dated Oct. 23, 2015, 93 pages.
Isis Innovation Limited, Response to Communication pursuant to Rules 161(1) and 162 EPC for European Patent Application No. 13723944.8, dated Jul. 16, 2015, 153 pages.
Isis Innovation Limited, Third Party Observations for European Patent Application No. 13723944.8, dated Oct. 27, 2015, 30 pages.
Isis Innovation Limited, Communication pursuant to Rule 114(2) EPC for European Patent Application No. 13723944.8, dated Nov. 6, 2015, 31 pages.
Isis Innovation Limited, Comments on the observations filed by a third party under Article 115 EPC for European Patent Application No. 13723944.8, Nov. 30, 2015, 15 pages.
Isis Innovation Limited, Notice of Non-Final Rejection for Korean Patent Application No. 10-2014-7035536, with English translation, dated Sep. 22, 2016, 9 pages.
Isis Innovation Limited, Decision to Grant a European Patent Pursuant to Article 97(1) EPC for European Patent Application No. 13723944.8, dated Mar. 10, 2016, 2 pages.
Borriello et al., "Ab initio Investigation of Hybrid Organic-Inorganic Perovskites based on Tin Halides," Physical Review, B77, pp. 235214-1 through 235214-9, 2008.
O'Regan et al., "A Solid State Dye-Sensitized Solar Cell Fabricated with Pressure-Treated P25-$TiO_2$ and CuSCN: Analysis of Pore Filling and IV Characteristics," Chem. Mater., 14, pp. 5023-5029, 2002.
Cheng et al., "Layered Organic-Inorganic Hybrid Perovskites: Structure, Optical Properties, Film Preparation, Patterning and Templating Engineering," *CrystEngComm.* 12: 2646-2662, 2010.
Hashmi et al., "Air Processed Inkjet Infiltrated Carbon Based Printed Perovskite Solar Cells with High Stability and Reproducibility," *Adv. Mater. Technol.* 1600183, pp. 1-6, 2016.
Hashmi et al., "Air Processed Inkjet Infiltrated Carbon Based Printed Perovskite Solar Cells with High Stability and Reproducibility," *Adv. Mater. Technol.* 1600183, 2016, Supporting information.
Kashiwamura et al., "Thin Films of Microcrystalline $(CH_3NH_3)(C_6H_5C_2H_4NH_3)_2Pb_2Br_7$ and Related Compounds: Fabrication and Optical Properties," *Synthetic Metals.* 96(2): 133-136, 1998.
Kim, "Syntheses, Crystal Structures, and Dielectric Property of Oxynitride Perovskites," Dissertation, The Ohio State University, pp. 1-188, 2005.
Kitazawa, "Stability of $(C_6H_5C_2H_4NH_3)_2Pb(Br_xI_{4-x})$ Mixed Crystals," *Jpn. J. Appl. Phys.* 36: 6876-6879, 1997.
Kojima et al., "Organo Metal Halide Perovskites as Visible-Light Sensitizer for Photovoltaic Cells," *J. Am. Chem. Soc.* 131(17): 6050-6051, Supporting Information, 2009.
Liu et al., "Critical Parameters in $TiO_2/ZrO_2$/Carbon-Based Mesoscopic Perovskite Solar Cell," *Journal of Power Sources.* 293: 533-538, 2015.
Mitzi, "Solution-Processed Inorganic Semiconductors," *J. Mater. Chem.* 14: 2355-2365, 2004.
Miyasaka et al, "Lead Halide Perovskites as Quantum dot Sensitizers for Mesoscopic $TiO_2$ Photovoltaic Cells," *The Electrochemical Society Meeting Abstracts, 216th ECS Meeting* Abstract No. 742, 2009.
Papavassiliou, "Synthetic Three-And Lower-Dimensional Semiconductors Based on Inorganic Units," *Molecular crystals and liquid crystals science and technology. Section A. Molecular crystals and liquid crystals.* 286(1): 231-238, 1996.
Weber, "$CH_3NH_3PbX_3$, a Pb(II)-System with Cubic Perovskite Structure," Z. *Naturforsch.* 33b: 1443-1445, 1978, English Abstract only.
The Notice of Opposition filed in European Patent Application No. 13723943.0 by Oxford University Innovation Limited, pp. 1-32, Dec. 7, 2016.
Li et al., "New Organic-Inorganic Perovskite Materials With Different Optical Properties Modulated by Different Inorganic Sheets," Crystal Growth & Design, vol. 8, No. 6, 1990-1996, 2008.
Oxford University Innovation Limited, Extended European Search Report for European Patent Application No. 18155003.9, dated Mar. 27, 2018, 9 pages.

(56) References Cited

OTHER PUBLICATIONS

Choi et al., "Structure of Methylammonium Lead Iodide Within Mesoporous Titanium Dioxide: Active Material in High-Performance Perovskite Solar Cells," Nano. Lett. 14, pp. 127-133, 2014.
Edri et al., "High Open-Circuit Voltage Solar Cells Based on Organic-Inorganic Lead Bromide Perovskite," J. Phys. Chem. Lett., 4, pp. 897-902, 2013.
Jeon et al., "Solvent engineering for high-performance inorganic-organic hybrid perovskite solar cells", Nature Materials, 13, pp. 897-903, 2014.
Kim et al., "Lead Iodide Perovskite Sensitized All-Solid-State Submicron Thin Film Mesoscopic Solar Cell with Efficiency Exceeding 9%", Scientific Reports, 2:591, pp. 1-7, PMC. Web. May 8, 2017.
Liu et al., "Efficient planar heterojunction perovskite solar cells by vapour deposition", Nature, 501, pp. 395-398, 2013.
Mei et al., "A hole-conductor-free, fully printable mesoscopic perovskite solar cell with high stability", Science, 345, pp. 295-298, 2014.
Noh et al., "Chemical Management for Colorful, Efficient, and Stable Inorganic-Organic Hybrid Nanostructured Solar Cells", Nano Lett., pp. A-F, 2013.
Saliba et al., "Cesium-containing triple cation perovskite solar cells: improved stability, reproducibility and high efficiency", Energy Environ. Sci., 9, pp. 1989-1997, 2016.
Shockley et al., "Detailed Balance Limit of Efficiency of p-n Junction Solar Cells", Journal of Applied Physics 32(3), pp. 510-519, 1961.
Smestad, "Testing of Dye Sensitized $TiO_2$ Solar Cells II: Theoretical Voltage Output and Photoluminescence Efficiencies," Solar Energy Materials and Solar Cells, 32, pp. 273-288, 1994.
Smestad et al., "Testing of Dye Sensitized $TiO_2$ Solar Cells I: Experimental Photocurrent Output and Conversion Efficiencies," Solar Energy Materials and Solar Cells, 32, pp. 259-272, 1994.
Smestad, "Absorptivity as a Predictor of the Photoluminescence Spectra of Silicon Solar Cells and Photosynthesis," Solar Energy Materials and Solar Cells, 38, pp. 57-71, 1995.
Wojciechowski et al., "Sub-150° C. processed meso-superstructured perovskite solar cells with enhanced efficiency", Energy Environ. Sci., 7, pp. 1-9, 2013.
Zhou et al., "Interface engineering of highly efficient perovskite solar cells", Science, 345, pp. 542-546, 2014.
Oxford University Innovation Limited, Communication Pursuant to Article 94(3) EPC for EP 13766635.0, 6 pages, dated Sep. 28, 2017.
Oxford University Innovation Limited, First Office Action from the State Intellectual Property Office of China for CN 201610597085.5, 11 pages, dated Apr. 13, 2018.
Japanese Office Action issued in Application No. 2017-240862, dated Nov. 16, 2018, 4 pages with English translation 4 pages.
Machine translation of JP2002198551, 9 pages.
Machine translation for JP2005093485, 8 pages.
Japanese Office Action issued in Application No. 2017-140959, dated Aug. 7, 2018, 5 pages with 5 pages of translation.
Lee et al., Pressure-induced phase transitions and templating effect in three-dimensional organic-inorganic hybrid perovskites Physical Review B: Condensed Matter and Materials Physics, 2003, 68(2), pp. 020103/1-020103/4.
Worhatch et al., Study of Local Structure in Selected Organic-Inorganic Perovskites in the Pm3m Phase, Chemistry of Materials, 2008, 20(4), pp. 1272-1277.
Extended European Search Report issued in EP Application I No. 18185861.4 , dated Oct. 4, 2018, 6 pages.
Zhong et al, "Charge recombination reduction in dye-sensitized solar cells by depositing ultrapure $TiO2$ nanoparticles on inert $BaTiO3$ films", Materials Science and Engineering B, vol. 176, Jun. 29, 2011 (Jun. 29, 2011), pp. 1115-1122, DOI: 10.1016/j.mseb.2011.05.052.
Hong et al., "Viability of Lead-Free Perovskites with Mixed Chalcogen and Halogen Anions for Photovoltaic Applications," The Journal of Physical Chemistry, 120, pp. 6435-6441, 2016.
Saparov et al., "Organic-Inorganic Perovskites: Structural Versatility for Functional Materials Design," Chemical Reviews, 116, pp. 4558-4596, 2016.
Oxford University Innovation Limited, Communication pursuant to Article 94(3) EPC for European Patent Application No. 15198085.1, dated Mar. 14, 2018, 6 pages.
Kitazawa, N. et al., Optical properties of $CH3NH3PbX3$ (X=halogen) and their mixed-halide crystals, Journal of Materials Science, 2002, vol. 37, pp. 3585-3587.†
Kojima, A. et al., Organometal Halide Perovskites as Visible-Light Sensitizers for Photovoltaic Cells, J. Am. Chem. Soc., 2009, vol. 131, No. 17, pp. 6050-6051.†
Noh, J.H. et al., Chemical Management for Colorful, Efficient, and Stable Inorganic-Organic Hybrid Nanostructured Solar Cells, Nano Letters, 2013, vol. 13, No. 4, pp. 1764-1769.†
Kojima, A. et al., Novel Photoelectrochemical Cell with Mesoscopic Electrodes Sensitized by Lead-halide Compounds (11), 214th ECS Meeting, Abstract #27, The Electrochemical Society (Oct. 2008).†

\* cited by examiner
† cited by third party

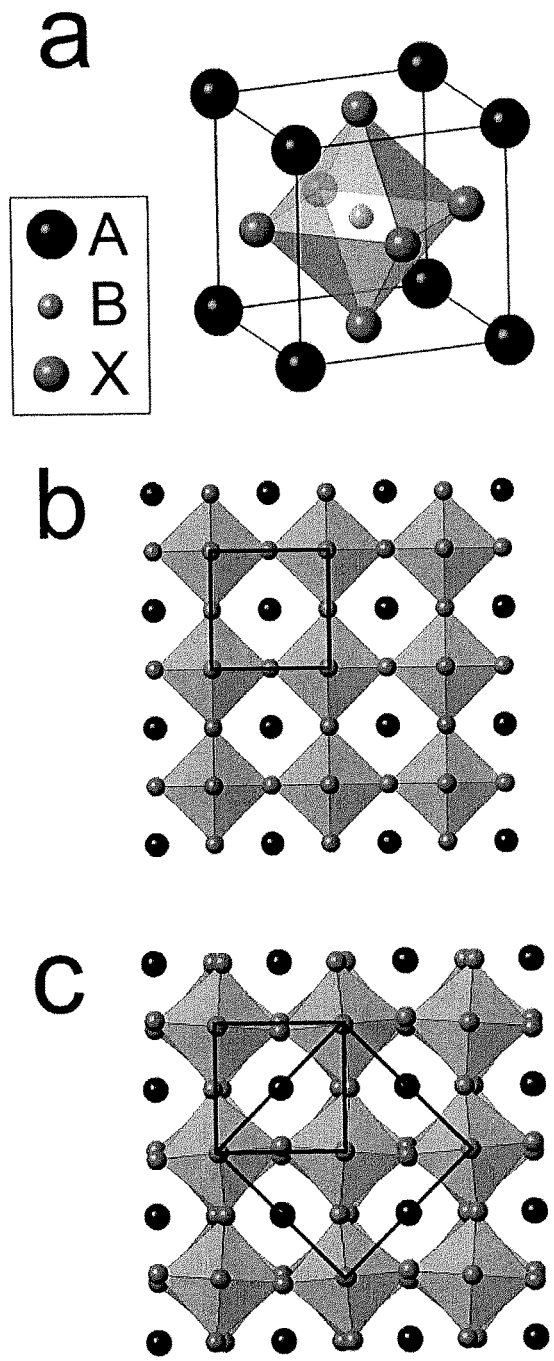
Figure 11 (a-c)

OPTOELECTRONIC DEVICE COMPRISING POROUS SCAFFOLD MATERIAL AND PEROVSKITES

FIELD OF THE INVENTION

The invention relates to optoelectronic devices, including photovoltaic devices such as solar cells, and light-emitting devices.

BACKGROUND TO THE INVENTION

Over recent years, the field of optoelectronic devices has developed rapidly, generating new and improved devices that go some way to meeting the ever increasing global demand for low-carbon emissions. However, this demand cannot be met with the devices currently available. The issues with the currently-available technology are illustrated below, using the area of photovoltaic devices.

The leading technologies pushing to realise the ultimate goal of low cost solar power generation are dye-sensitized and organic photovoltaics. Dye-sensitized solar cells are composed of a mesoporous n-type metal oxide photoanode, sensitized with organic or metal complex dye and infiltrated with a redox active electrolyte. [O'Regan, B. and M. Gratzel (1991). "A Low-Cost, High-Efficiency Solar-Cell Based On Dye-Sensitized Colloidal $TiO_2$ Films." Nature 353(6346): 737-740.] They currently have certified power conversion efficiencies of 11.4% [Martin A. Green et al. Prog. Photovolt: Res. Appl. 2011; 19:565-572] and highest reported efficiencies are 12.3% [Aswani Yella, et al. Science 334, 629 (2011)]. The current embodiment of organic solar cells, is a nanostructured composite of a light absorbing and hole-transporting polymer blended with a fullerene derivative acting as the n-type semiconductor and electron acceptor [Yu, G., J. Gao, et al. (1995) Science 270(5243): 1789-1791 and Halls, J. J. M., C. A. Walsh, et al. (1995) Nature 376(6540): 498-500]. The most efficient organic solar cells are now just over 10% [Green, M. A., K. Emery, et al. (2012). "Solar cell efficiency tables (version 39)." Progress in Photovoltaics 20(1): 12-20]. Beyond organic materials and dyes, there has been growing activity in the development of solution processable inorganic semiconductors for thin-film solar cells. Specific interest has emerged in colloidal quantum dots, which now have verified efficiencies of over 5%, [Tang, J, et al. Nature Materials 10, 765-771 (2011)] and in cheaply processable thin film semiconductors grown from solution such as copper zinc tin sulphide selenide (CZTSS) which has generated a lot of excitement recently by breaking the 10% efficiency barrier in a low cost fabrication route. [Green, M. A., K. Emery, et al. (2012). "Solar cell efficiency tables (version 39)." Progress in Photovoltaics 20(1): 12-20] The main issue currently with CZTSS system is that it is processed with hydrazine, a highly explosive reducing agent [Teodor K. Todorov et al. Adv. Matter 2010, 22, E156-E159].

For a solar cell to be efficient, the first requirement is that it absorbs most of the sun light over the visible to near infrared region (300 to 900 nm), and converts the light effectively to charge. Beyond this however, the charge needs to be collected at a high voltage in order to do useful work, and it is the generation of a high voltage with suitable current that is the most challenging aspect for the emerging solar technologies. A simple measure of how effective a solar cell is at generating voltage from the light it absorbs, is the difference energy between the optical band gap of the absorber and the open-circuit voltage generated by the solar cell under standard AM1.5G 100 $mWcm^{-2}$ solar illumination [H J Snaith et al. Adv. Func. Matter 2009, 19, 1-7]. For instance, for the most efficient single junction GaAs solar cells the open circuit voltage is 1.11 V and the band gap is 1.38 eV giving a "loss-in-potential" of approximately 270 meV [Martin A. Green et al. Prog. Photovolt: Res. Appl. 2011; 19:565-572]. For dye-sensitized and organic solar technologies these losses are usually on the order of 0.65 to 0.8 eV. The reason for the larger losses in the organics is due to a number of factors. Organic semiconductors used in photovoltaics are generally hindered by the formation of tightly bound excitons due to their low dielectric constants. In order to obtain effective charge separation after photoexcitation, the semiconducting polymer is blended with an electron accepting molecule, typically a fullerene derivative, which enables charge separation. However, in doing so, a significant loss in energy is required to do the work of separating the electron and hole. [Dennler, G., M. C. Scharber, et al. (2009). "Polymer-Fullerene Bulk-Heterojunction Solar Cells." Advanced Materials 21(13): 1323-1338] Dye-sensitized solar cells have losses, both due to electron transfer from the dye (the absorber) into the $TiO_2$ which requires a certain "driving force" and due to dye regeneration from the electrolyte which requires an "over potential". For dye-sensitized solar cells, moving from a multi-electron Iodide/triiodide redox couple to one-electron outer-sphere redox couples, such as a cobalt complexes or a solid-state hole-conductor, improves the issue but large losses still remain [Oregan 91, Aswani Yella, et al. Science 334, 629 (2011), and Bach 98 and Gratzel solid-state JACS]. There is an emerging area of "extremely thin absorber" solar cells which are a variation on the solid-state dye-sensitized solar cell.[Y. Itzhaik, O. Niitsoo, M. Page, G. Hodes, J. Phys. Chem. C 113, 4254-4256 (2009)] An extremely thin absorber (ETA) (few nm thick) layer is coated upon the internal surface of a mesoporous $TiO_2$ electrode, and subsequently contacted with a solid-state hole-conductor or electrolyte. These devices have achieved efficiencies of up to 7% for solid-state devices employing $Sb_2S_3$ as the absorber, [J. A. Chang et al., Nano Lett. 12, 1863-1867 (2012)] and up to 6.5% employing a lead-halide perovskite in photoelectrochemical solar cell.[A. Kojima, K. Teshima, Y. Shirai, T. Miyasaka, J. Am. Chem. Soc. 131, 6050-6051 (2009); J-H Im, C-R Lee, J-W Lee, S-W Park, N-G Park, Nanoscale 3, 4088-4093 (2011)] However, the ETA concept still suffer from rather low open-circuit voltages.

There is therefore a need for a new approach to developing optoelectronic devices. New systems that combine favourable properties such as high device efficiency and power conversion, with device stability are required. In addition, the devices should consist of inexpensive materials that may be easily tuned to provide the desirable properties and should be capable of being manufactured on a large scale.

SUMMARY OF THE INVENTION

The present inventors have provided optoelectronic devices which exhibit many favourable properties including high device efficiency. Record power conversion efficiencies as high as 11.5% have been demonstrated under simulated AM1.5 full sun light.

Other characteristics that have been observed in devices according to the invention are, for instance, surprisingly efficient charge collection and extremely high open-circuit voltages approaching 1.2 V. These devices show fewer fundamental loses than comparable devices currently on the market.

These advantages have been achieved using a device which comprises (a) a porous dielectric scaffold material and (b) a semiconductor having a band gap of less than or equal to 3.0 eV, in contact with the scaffold material. Typically the semiconductor is disposed on the surface of the porous dielectric scaffold material, so that it is supported on the surfaces of pores within the scaffold. A charge transporting material is typically also employed, which infiltrates into the porous structure of the scaffold material so that it is in contact with the semiconductor that is supported on the scaffold. The semiconductor typically acts as a light-absorbing, photosensitising material, as well as an charge-transporting material. When, for instance, the semiconductor is an n-type semiconductor, the porous nanostructure of the semiconductor/scaffold composite helps rapidly to remove the holes from the n-type absorber, so that purely majority carriers are present in the absorber layer. This overcomes the issue of short diffusion lengths which would arise if the semiconductor were employed in solid, thin-film form.

The materials used in the device of the invention are inexpensive, abundant and readily available and the individual components of the devices exhibit surprisingly stability. Further, the methods of producing the device are suitable for large-scale production.

For example, in some embodiments the inventors have taken advantage of the properties of inorganic semiconductors by using a layered organometal halide perovskite as the absorber, which is composed of abundant elements. This material may be processed from a precursor solution via spin-coating in ambient conditions. In a solid-thin film form, it operates moderately well as a solar cell with a maximum efficiency of 3%. However, in order to overcome the issue of short diffusion lengths, the inventors have created the above-mentioned nanostructured composite. In some embodiments the scaffold is a mesoporous insulating aluminium oxide, which is subsequently coated with the perovskite film and dried which realises a mesoporous perovskite electrode. This may then be infiltrated with a p-type hole-conductor which acts as to carry the photoinduced holes out of the device. This new architecture and material system has an optical band gap of 1.56 eV and generates up to 1.1V open-circuit voltage under AM1.5G 100 mWcm$^{-2}$ sun light. This difference, which represents the fundamental loses in the solar cell, is only 0.44 eV, lower than any other emerging photovoltaic technology. The overall power conversion efficiency of 11.5% is also one of the highest reported, and represents the starting point for this exciting technology. With mind to the very low potential drop from band gap to open-circuit voltage, this concept has scope to become the dominating low cost solar technology.

Accordingly, the invention provides an optoelectronic device comprising: (i) a porous dielectric scaffold material; and (ii) a semiconductor having a band gap of less than or equal to 3.0 eV, in contact with the scaffold material.

Typically, the semiconductor is disposed on the surface of said porous dielectric scaffold material. Thus, usually, the semiconductor is disposed on the surfaces of pores within said dielectric scaffold material.

In one embodiment, the optoelectronic device of the invention as defined above is an optoelectronic device which comprises a photoactive layer, wherein the photoactive layer comprises:
said porous dielectric scaffold material; and
said semiconductor.

The invention further provides the use, as a photoactive material in an optoelectronic device, of: (i) a porous dielectric scaffold material; and (ii) a semiconductor having a band gap of less than or equal to 3.0 eV, in contact with the scaffold material.

Further provided is the use of a layer comprising: (i) a porous dielectric scaffold material; and (ii) a semiconductor having a band gap of less than or equal to 3.0 eV, in contact with the scaffold material; as a photoactive layer in an optoelectronic device.

In another aspect, the invention provides a photoactive layer for an optoelectronic device comprising (a) a porous dielectric scaffold material; (b) a semiconductor having a band gap of less than or equal to 3.0 eV, in contact with the scaffold material; and (c) a charge transporting material.

BRIEF DESCRIPTION OF THE FIGURES

FIG. 11(a-c) provides schematic diagrams of: (a) the general perovskite $ABX_3$ unit cell; (b) the cubic perovskite lattice structure (the unit cell is shown as an overlaid square); and (c) the tetragonal perovskite lattice structure arising from a distortion of the $BX_6$ octahedra (the unit cell is shown as the larger overlaid square, and the pseudocubic unit cell that it can be described by is shown as the smaller overlaid square).

DETAILED DESCRIPTION OF THE INVENTION

Figure 1:
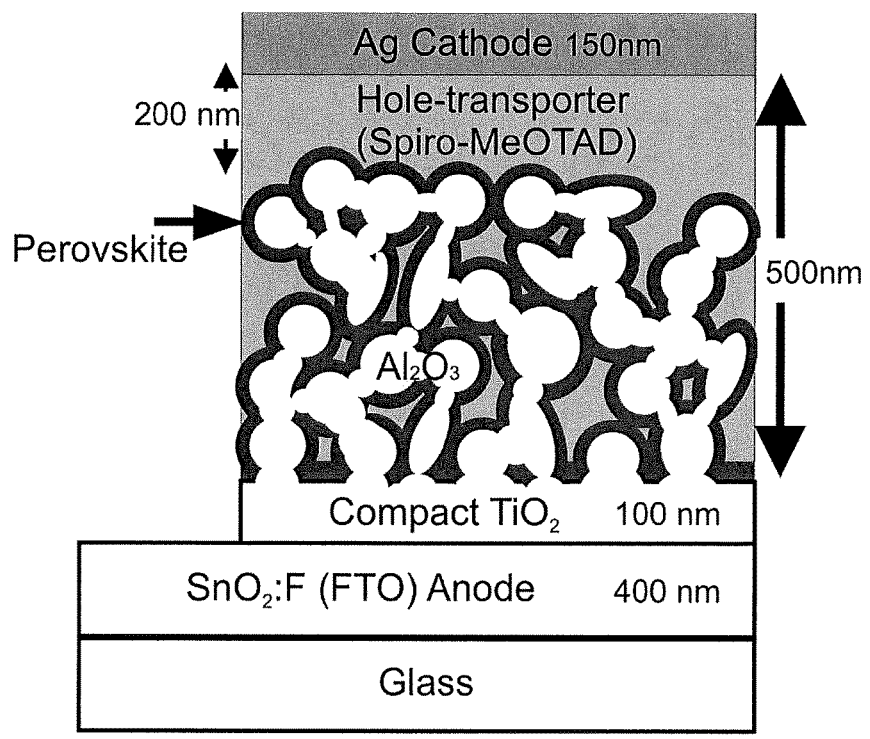
FIG. 1 is a schematic diagram of a photovoltaic device comprising a mixed-anion perovskite.

The invention provides an optoelectronic device comprising: (i) a porous dielectric scaffold material; and (ii) a semiconductor having a band gap of less than or equal to 3.0 eV, in contact with the scaffold material.

As used herein, the term "porous" refers to a material within which pores are arranged. In a "porous dielectric scaffold material" the pores are volumes within the dielectric scaffold where there is no dielectric scaffold material. The individual pores may be the same size or different sizes. The size of the pores is defined as the "pore size". For spherical pores, the pore size is equal to the diameter of the sphere. For pores that are not spherical, the pore size is equal to the diameter of a sphere, the volume of said sphere being equal to the volume of the non-spherical pore.

The term "dielectric material", as used herein, refers to material which is an electrical insulator or a very poor conductor of electric current. The term dielectric therefore excludes semiconducting materials such as titania. The term dielectric, as used herein, typically refers to materials having a band gap of equal to or greater than 4.0 eV. (The band gap of titania is about 3.2 eV.)

The term "porous dielectric scaffold material", as used herein, therefore refers to a dielectric material which is itself porous, and which is capable of acting as a support for a further material such as said coating comprising said perovskite.

The term "semiconductor" as used herein refers to a material with electrical conductivity intermediate in magnitude between that of a conductor and a dielectric. The semiconductor may be an n-type semiconductor, a p-type semiconductor or an intrinsic semiconductor. As used herein, the term "n-type", refers to an n-type, or electron transporting material. The n-type semiconductor used in the present invention may be any suitable n-type semiconductor. As used herein, the term "p-type", refers to a p-type, or hole transporting material. The p-type semiconductor used in the present invention may be any suitable p-type semiconductor. The intrinsic semiconductor used in the present invention may be any suitable intrinsic semiconductor.

Any suitable semiconductor can be used in the optoelectronic device of the invention. For instance, the semiconductor may be a compound or elemental semiconductor comprising any element in the periodic table or any combination of elements in the periodic table. Examples of semiconductors which can be used in the optoelectronic device of the invention include perovskites; and compounds comprising gallium, niobium, tantalum, tungsten, indium, neodinium, palladium, copper or lead, for instance, a chalcogenides of antimony, copper, zinc, iron, or bismuth (such as copper sulphide, iron sulphide, iron pyrite); copper zinc tin chalcogenides, for example, copper zinc tin sulphides such a $Cu_2ZnSnS_4$ (CZTS) and copper zinc tin sulphur-selenides such as $Cu_2ZnSn(S_{1-x}Se_x)_4$ (CZTSSe); copper indium chalcogenides such as copper indium selenide (CIS); copper indium gallium chalcogenides such as copper indium gallium selenides ($CuIn_{1-x}Ga_xSe_2$) (CIGS); and copper indium gallium diselenide. Further examples are group IV compound semiconductors; group III-V semiconductors (e.g. gallium arsenide); group II-VI semiconductors (e.g. cadmium selenide); group I-VII semiconductors (e.g. cuprous chloride); group IV-VI semiconductors (e.g. lead selenide); group V-VI semiconductors (e.g. bismuth telluride); and group II-V semiconductors (e.g. cadmium arsenide).

The skilled person is readily able to measure the band gap of a semiconductor, by using well-known procedures which do not require undue experimentation. For instance, the band gap of the semiconductor can be estimated by constructing a photovoltaic diode or solar cell from the semiconductor and determining the photovoltaic action spectrum. The monochromatic photon energy at which the photocurrent starts to be generated by the diode can be taken as the band gap of the semiconductor; such a method was used by Barkhouse et al., Prog. Photovolt: Res. Appl. 2012; 20:6-11. References herein to the band gap of the semiconductor mean the band gap as measured by this method, i.e. the band gap as determined by recording the photovoltaic action spectrum of a photovoltaic diode or solar cell constructed from the semiconductor and observing the monochromatic photon energy at which significant photocurrent starts to be generated.

In some embodiments, the band gap of the semiconductor is less than or equal to 2.5 eV. The band gap may for instance be less than or equal to 2.3 eV, or for instance less than or equal to 2.0 eV.

Usually, the band gap is at least 0.5 eV. However, other embodiments are also envisaged, in which the band gap of the semiconductor is close to 0, so that the semiconductor has conducting properties similar to those of a metal. Thus, the band gap of the semiconductor may be from 0.5 eV to 3.0 eV, or for instance from 0.5 eV to 2.8 eV. In some embodiments it is from 0.5 eV to 2.5 eV, or for example from 0.5 eV to 2.3 eV. The band gap of the semiconductor may for instance be from 0.5 eV to 2.0 eV. In other embodiments, the band gap of the semiconductor may be from 1.0 eV to 3.0 eV, or for instance from 1.0 eV to 2.8 eV. In some embodiments it is from 1.0 eV to 2.5 eV, or for example from 1.0 eV to 2.3 eV. The band gap of the semiconductor may for instance be from 1.0 eV to 2.0 eV.

The band gap of the semiconductor can be from 1.2 eV to 1.8 eV. The band gaps of organometal halide perovskite semiconductors, for example, are typically in this range and may for instance, be about 1.5 eV or about 1.6 eV. Thus, in one embodiment the band gap of the semiconductor is from 1.3 eV to 1.7 eV.

The semiconductor is in contact with the porous dielectric scaffold material, i.e. it is supported by the scaffold material. Thus, the semiconductor is typically disposed on the surface of the porous dielectric scaffold material, like a coating. Thus, as the skilled person will appreciate, this means that the semiconductor is usually coated on the inside surfaces of pores within the porous dielectric scaffold material, as well as on the outer surfaces of the scaffold material. This is shown schematically in FIG. 1. If the semiconductor is in contact with the scaffold material within the pores of the scaffold material, the pores are usually not completely filled by the semiconductor. Rather, the semiconductor is typically present as a coating on the inside surface of the pores.

Thus, typically the semiconductor is disposed on the surface of the porous dielectric scaffold material. Usually, the semiconductor is disposed on the surfaces of pores within the scaffold.

Typically, in the optoelectronic device of the invention the semiconductor is disposed on the surface of said porous dielectric scaffold material. Thus, as explained above, the semiconductor may be disposed on the surface of pores within said dielectric scaffold material. As the skilled person will appreciate, the semiconductor may be disposed on the surfaces of some or all pores within said dielectric scaffold material.

Usually, in the optoelectronic device of the invention, the dielectric scaffold material comprises an oxide of aluminium, germanium, zirconium, silicon, yttrium or ytterbium, or mixtures thereof, for instance, the dielectric scaffold material may comprise an oxide of aluminium, germanium, zirconium, silicon, yttrium or ytterbium; or alumina silicate. More typically, the dielectric scaffold material comprises porous alumina.

Typically, in the optoelectronic device of the invention, the dielectric scaffold material is mesoporous.

The term "mesoporous", as used herein means that the pores in the porous structure are microscopic and have a size which is usefully measured in nanometers (nm). The mean pore size of the pores within a "mesoporous" structure may for instance be anywhere in the range of from 1 nm to 100 nm, or for instance from 2 nm to 50 nm. Individual pores may be different sizes and may be any shape.

Typically, in the optoelectronic device of the invention, the dielectric scaffold material comprises mesoporous alumina.

The porosity of said dielectric scaffold material is usually at least 50%. For instance, the porosity may be about 70%. In one embodiment, the porosity is at least 60%, for instance at least 70%.

As defined above, a porous material is material within which pores are arranged. The total volume of the porous material is the volume of the material plus the volume of the pores. The term "porosity", as used herein, is the percentage of the total volume of the material that is occupied by the pores. Thus if, for example, the total volume of the porous material was 100 nm$^3$ and the volume of the pores was 70 nm$^3$, the porosity of the material would be equal to 70%.

Often, in the optoelectronic device of the invention, the dielectric scaffold material, is mesoporous.

Typically, the semiconductor used in the present invention is also a photosensitizing material, i.e. a material which is capable of performing both photogeneration and charge (electron) transportation.

In the optoelectronic device of the invention, the semiconductor may comprise a copper zinc tin chalcogenide, for example, a copper zinc tin sulphide such a $Cu_2ZnSnS_4$ (CZTS) and copper zinc tin sulphur-selenides such as $Cu_2ZnSn(S_{1-x}Se_x)_4$ (CZTSSe).

Alternatively, the semiconductor may comprise an antimony or bismuth chalcogenide, such as, for example, $Sb_2S_3$, $Sb_2Se_3$, $Bi_2S_3$ or $Bi_2Se_3$.

The semiconductor may, for instance, comprise antimony sulphide.

The semiconductor may alternatively be gallium arsenide.

Usually, the semiconductor comprises a perovskite as herein defined.

In one embodiment, in the optoelectronic device of the invention, the semiconductor is an n-type semiconductor.

Usually, in the optoelectronic device of the invention, the semiconductor comprises an n-type semiconductor comprising a perovskite.

In one embodiment, in the optoelectronic device of the invention, semiconductor comprises a perovskite, $Sb_2S_3$, $Sb_2Se_3$, $Bi_2S_3$, $Bi_2Se_3$, CIS, CIGS, CZTS, CZTSSe, $FeS_2$, CdS, CdSe, PbS, PbSe, Ge or GaAs, preferably wherein the semiconductor comprises a perovskite, CZTS, CZTSSe, gallium arsenide, an antimony chalcogenide, or a bismuth chalcogenide.

The semiconductor may, for instance, comprise antimony sulphide.

In one embodiment, in the optoelectronic device of the invention, the semiconductor is a p-type semiconductor.

Often, the p-type semiconductor comprises a perovskite or a chalcogenide.

In one embodiment, in the optoelectronic device of the invention, the semiconductor is an intrinsic semiconductor.

Usually, the intrinsic semiconductor comprises a perovskite or gallium aresenide.

In some embodiments, the semiconductor comprises an oxide of gallium, niobium, tantalum, tungsten, indium, neodymium or palladium, or a sulphide of zinc or cadmium, provided of course that the semiconductor has a band gap of less than or equal to 3.0 eV.

Alternatively, in some embodiments, the semiconductor comprises an oxide of nickel, vanadium, lead, copper or molybdenum, provided of course that the semiconductor has a band gap of less than or equal to 3.0 eV.

In one embodiment, in the optoelectronic device of the invention, the semiconductor comprises a perovskite, $Sb_2S_3$, $Sb_2Se_3$, $Bi_2S_3$, $Bi_2Se_3$, CIS, CIGS, CZTS, CZTSSe, $FeS_2$, CdS, CdSe, PbS, PbSe, Ge or GaAs, preferably wherein the semiconductor comprises a perovskite, CZTS, CZTSSe, gallium arsenide, an antimony chalcogenide, or a bismuth chalcogenide.

The semiconductor may, for instance, comprise antimony sulphide.

Typically, in the optoelectronic device of the invention, the semiconductor has a band gap of less than or equal to 2.5 eV, optionally less than or equal to 2.0 eV.

Often, the band gap is at least 0.5 eV.

In some embodiments of the optoelectronic device of the invention, the semiconductor comprises a perovskite.

The term "perovskite", as used herein, refers to a material with a three-dimensional crystal structure related to that of $CaTiO_3$ or a material comprising a layer of material, wherein the layer has a structure related to that of $CaTiO_3$. The structure of $CaTiO_3$ can be represented by the formula $ABX_3$, wherein A and B are cations of different sizes and X is an anion. In the unit cell, the A cations are at (0,0,0), the B cations are at (½, ½, ½) and the X anions are at (½, ½, 0). The A cation is usually larger than the B cation. The skilled person will appreciate that when A, B and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer of perovskite material are well known. For instance, the structure of materials adopting the $K_2NiF_4$-type structure comprises a layer of perovskite material. The skilled person will appreciate that a perovskite material can be represented by the formula $[A][B][X]_3$, wherein [A] is at least one cation, [B] is at least one cation and [X] is at least one anion. When the perovskite comprise more than one A cation, the different A cations may distributed over the A sites in an ordered or disordered way. When the perovskite comprise more than one B cation, the different B cations may distributed over the B sites in an ordered or disordered way. When the perovskite comprise more than one X anion, the different X anions may distributed over the X sites in an ordered or disordered way. The symmetry of a perovskite comprising more than one A cation, more than one B cation or more than one X cation, will be lower than that of $CaTiO_3$.

As the skilled person will appreciate, the perovskite may be a perovskite which acts as an n-type, electron-transporting semiconductor when photo-doped. Alternatively, it may be a perovskite which acts as a p-type hole-transporting semiconductor when photo-doped. Thus, the perovksite may be n-type or p-type, or it may be an intrinsic semiconductor. Typically, the perovskite employed is one which acts as an n-type, electron-transporting semiconductor when photo-doped.

The optoelectronic device of the invention usually further comprises a charge transporting material disposed within pores of said porous material. The charge transporting material may be a hole transporting material or an electron transporting material. As the skilled person will appreciate, when the perovskite is an intrinsic semiconductor the charge transporting material can be a hole transporting material or an electron transporting material. However, when the perovskite is an n-type semiconductor, the charge transporting material is typically a hole transporting material. Also, when the perovskite is a p-type semiconductor, the charge transporting material is typically an electron transporting material.

Usually, in the optoelectronic device of the invention, the perovskite comprises at least one anion selected from halide anions and chalcogenide anions.

The term "halide" refers to an anion of a group 7 element, i.e., of a halogen. Typically, halide refers to a fluoride anion, a chloride anion, a bromide anion, an iodide anion or an astatide anion.

The term "chalcogenide anion", as used herein refers to an anion of group 6 element, i.e. of a chalcogen. Typically, chalcogenide refers to an oxide anion, a sulphide anion, a selenide anion or a telluride anion.

In the optoelectronic device of the invention, the perovskite often comprises a first cation, a second cation, and said at least one anion.

As the skilled person will appreciate, the perovskite may comprise further cations or further anions. For instance, the perovskite may comprise two, three or four different first cations; two, three or four different second cations; or two, three of four different anions.

Typically, in the optoelectronic device of the invention, the second cation in the perovskite is a metal cation. More typically, the second cation is a divalent metal cation. For instance, the second cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. Usually, the second cation is selected from $Sn^{2+}$ and $Pb^{2+}$.

In the optoelectronic device of the invention, the first cation in the perovskite is usually an organic cation.

The term "organic cation" refers to a cation comprising carbon. The cation may comprise further elements, for example, the cation may comprise hydrogen, nitrogen or oxygen.

Usually, in the optoelectronic device of the invention, the organic cation has the formula $(R_1R_2R_3R_4N)^+$, wherein:

$R_1$ is hydrogen, unsubstituted or substituted $C_1$-$C_{20}$ alkyl, or unsubstituted or substituted aryl;

$R_2$ is hydrogen, unsubstituted or substituted $C_1$-$C_{20}$ alkyl, or unsubstituted or substituted aryl;

$R_3$ is hydrogen, unsubstituted or substituted $C_1$-$C_{20}$ alkyl, or unsubstituted or substituted aryl; and $R_4$ is hydrogen, unsubstituted or substituted $C_1$-$C_{20}$ alkyl, or unsubstituted or substituted aryl.

As used herein, an alkyl group can be a substituted or unsubstituted, linear or branched chain saturated radical, it is often a substituted or an unsubstituted linear chain saturated radical, more often an unsubstituted linear chain saturated radical. A $C_1$-$C_{20}$ alkyl group is an unsubstituted or substituted, straight or branched chain saturated hydrocarbon radical having from 1 to 20 carbon atoms. Typically it is $C_1$-$C_{10}$ alkyl, for example methyl, ethyl, propyl, butyl, pentyl, hexyl, heptyl, octyl, nonyl or decyl, or $C_1$-$C_6$ alkyl, for example methyl, ethyl, propyl, butyl, pentyl or hexyl, or $C_1$-$C_4$ alkyl, for example methyl, ethyl, i-propyl, n-propyl, t-butyl, s-butyl or n-butyl.

When an alkyl group is substituted it typically bears one or more substituents selected from substituted or unsubstituted $C_1$-$C_{20}$ alkyl, substituted or unsubstituted aryl (as defined herein), cyano, amino, $C_1$-$C_{10}$ alkylamino, di($C_1$-$C_{10}$)alkylamino, arylamino, diarylamino, arylalkylamino, amido, acylamido, hydroxy, oxo, halo, carboxy, ester, acyl, acyloxy, $C_1$-$C_{20}$ alkoxy, aryloxy, haloalkyl, sulfonic acid, sulfhydryl (i.e. thiol, —SH), $C_1$-$C_{10}$ alkylthio, arylthio, sulfonyl, phosphoric acid, phosphate ester, phosphonic acid and phosphonate ester. Examples of substituted alkyl groups include haloalkyl, hydroxyalkyl, aminoalkyl, alkoxyalkyl and alkaryl groups. The term alkaryl, as used herein, pertains to a $C_1$-$C_{20}$ alkyl group in which at least one hydrogen atom has been replaced with an aryl group. Examples of such groups include, but are not limited to, benzyl (phenylmethyl, $PhCH_2$—), benzhydryl ($Ph_2CH$—), trityl (triphenylmethyl, $Ph_3C$—), phenethyl (phenylethyl, Ph-$CH_2CH_2$—), styryl (Ph-CH=CH—), cinnamyl (Ph-CH=CH-$CH_2$—).

Typically a substituted alkyl group carries 1, 2 or 3 substituents, for instance 1 or 2.

An aryl group is a substituted or unsubstituted, monocyclic or bicyclic aromatic group which typically contains from 6 to 14 carbon atoms, preferably from 6 to 10 carbon atoms in the ring portion. Examples include phenyl, naphthyl, indenyl and indanyl groups. An aryl group is unsubstituted or substituted. When an aryl group as defined above is substituted it typically bears one or more substituents selected from $C_1$-$C_6$ alkyl which is unsubstituted (to form an aralkyl group), aryl which is unsubstituted, cyano, amino, $C_1$-$C_{10}$ alkylamino, di($C_1$-$C_{10}$)alkylamino, arylamino, diarylamino, arylalkylamino, amido, acylamido, hydroxy, halo, carboxy, ester, acyl, acyloxy, $C_1$-$C_{20}$ alkoxy, aryloxy, haloalkyl, sulfhydryl (i.e. thiol, —SH), $C_{1-10}$ alkylthio, arylthio, sulfonic acid, phosphoric acid, phosphate ester, phosphonic acid and phosphonate ester and sulfonyl. Typically it carries 0, 1, 2 or 3 substituents. A substituted aryl group may be substituted in two positions with a single $C_1$-$C_6$ alkylene group, or with a bidentate group represented by the formula —X—($C_1$-$C_6$)alkylene, or —X—($C_1$-$C_6$)alkylene-X—, wherein X is selected from O, S and NR, and wherein R is H, aryl or $C_1$-$C_6$ alkyl. Thus a substituted aryl group may be an aryl group fused with a cycloalkyl group or with a heterocyclyl group. The ring atoms of an aryl group may include one or more heteroatoms (as in a heteroaryl group). Such an aryl group (a heteroaryl group) is a substituted or unsubstituted mono- or bicyclic heteroaromatic group which typically contains from 6 to 10 atoms in the ring portion including one or more heteroatoms. It is generally a 5- or 6-membered ring, containing at least one heteroatom selected from O, S, N, P, Se and Si. It may contain, for example, 1, 2 or 3 heteroatoms. Examples of heteroaryl groups include pyridyl, pyrazinyl, pyrimidinyl, pyridazinyl, furanyl, thienyl, pyrazolidinyl, pyrrolyl, oxazolyl, oxadiazolyl, isoxazolyl, thiadiazolyl, thiazolyl, isothiazolyl, imidazolyl, pyrazolyl, quinolyl and isoquinolyl. A heteroaryl group may be unsubstituted or substituted, for instance, as specified above for aryl. Typically it carries 0, 1, 2 or 3 substituents.

Mainly, in the optoelectronic device of the invention, $R_1$ in the organic cation is hydrogen, methyl or ethyl, $R_2$ is hydrogen, methyl or ethyl, $R_3$ is hydrogen, methyl or ethyl, and $R_4$ is hydrogen, methyl or ethyl. For instance $R_1$ may be hydrogen or methyl, $R_2$ may be hydrogen or methyl, $R_3$ may be hydrogen or methyl, and $R_4$ may be hydrogen or methyl.

Alternatively, the organic cation may have the formula $(R_5NH_3)^+$, wherein: $R_5$ is hydrogen, or unsubstituted or substituted $C_1$-$C_{20}$ alkyl. For instance, $R_5$ may be methyl or ethyl. Typically, $R_5$ is methyl.

In some embodiments, the organic cation has the formula $(R_5R_6N=CH-NR_7R_8)^+$, wherein: $R_5$ is hydrogen, unsubstituted or substituted $C_1$-$C_{20}$ alkyl, or unsubstituted or substituted aryl; $R_6$ is hydrogen, unsubstituted or substituted $C_1$-$C_{20}$ alkyl, or unsubstituted or substituted aryl; $R_7$ is hydrogen, unsubstituted or substituted $C_1$-$C_{20}$ alkyl, or unsubstituted or substituted aryl; and $R_8$ is hydrogen, unsubstituted or substituted $C_1$-$C_{20}$ alkyl, or unsubstituted or substituted aryl.

Typically, $R_5$ in the organic cation is hydrogen, methyl or ethyl, $R_6$ is hydrogen, methyl or ethyl, $R_7$ is hydrogen, methyl or ethyl, and $R_8$ is hydrogen, methyl or ethyl. For instance $R_5$ may be hydrogen or methyl, $R_6$ may be hydrogen or methyl, $R_7$ may be hydrogen or methyl, and $R_8$ may be hydrogen or methyl.

The organic cation may, for example, have the formula $(H_2N=CH-NH_2)+$.

In one embodiment, the perovskite is a mixed-anion perovskite comprising a first cation, a second cation, and two or more different anions selected from halide anions and chalcogenide anions. For instance, the mixed-anion perovskite may comprise two different anions and, for instance, the anions may be a halide anion and a chalcogenide anion, two different halide anions or two different chalcogenide anions. The first and second cations may be as further defined hereinbefore. Thus the first cation may be an organic cation, which may be as further defined herein. For instance it may be a cation of formula $(R_1R_2R_3R_4N)^+$, or formula $(R_5NH_3)^+$, as defined above. The second cation may be a divalent metal cation. For instance, the second cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. Usually, the second cation is selected from $Sn^{2+}$ and $Pb^{2+}$.

In another embodiment, the perovskite is a mixed-anion perovskite comprising a first cation, a second cation, and two or more different anions selected from halide anions and chalcogenide anions. For instance, the mixed-anion perovskite may comprise two different anions and, for instance, the anions may be a halide anion and a chalcogenide anion, two different halide anions or two different chalcogenide anions. The first and second cations may be as further defined hereinbefore. Thus the first cation may be an organic cation, which may be as further defined herein. For instance it may be a cation of formula $(R_5R_6N=CH-NR_7R_8)^+$, or formula $((H_2N=CH-NH_2)^+$, as defined above. The second cation may be a divalent metal cation. For instance, the second cation may be selected from $Ca^{2+}$, $Sr^{2+}$, $Cd^{2+}$, $Cd^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. Usually, the second cation is selected from $Sn^{2+}$ and $Pb^{2+}$.

In the optoelectronic device of the invention, the perovskite is usually a mixed-halide perovskite, wherein said two or more different anions are two or more different halide anions. Typically, they are two or three halide anions, more typically, two different halide anions. Usually the halide anions are selected from fluoride, chloride, bromide and iodide, for instance chloride, bromide and iodide.

Often, in the optoelectronic device of the invention, the perovskite is a perovskite compound of the formula (I):

$$[A][B][X]_3 \qquad (I)$$

wherein:

[A] is at least one organic cation;
[B] is at least one metal cation; and
[X] is said at least one anion.

For instance, the perovskite of the formula (I) may comprise one, two, three or four different metal cations, typically one or two different metal cations. The perovskite of the formula (I), may, for instance, comprise one, two, three or four different organic cations, typically one or two different organic cations. The perovskite of the formula (I), may, for instance, comprise one two, three or four different anions, typically two or three different anions.

The organic and metal cations may be as further defined hereinbefore. Thus the organic cations may be selected from cations of formula $(R_1R_2R_3R_4N)^+$ and cations of formula $(R_5NH_3)^+$, as defined above. The metal cations may be selected from divalent metal cations. For instance, the metal cations may be selected from $Ca^{2+}$, $Sr^{2+}$, $Cd^{2+}$, $Cd^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. Usually, the metal cation is $Sn^{2+}$ or $Pb^{2+}$.

The organic cation may, for instance, be selected from cations of formula $(R_5R_6N=CH-NR_7R_8)^+$, and cations of formula $((H_2N=CH-NH_2)^+$. The metal cations may be selected from divalent metal cations. For instance, the metal cations may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. Usually, the metal cation is $Sn^{2+}$ or $Pb^{2+}$.

Typically, in the optoelectronic device of the invention, [X] in formula (I) is two or more different anions selected from halide anions and chalcogenide anions. More typically, [X] is two or more different halide anions.

In one embodiment, the perovskite is a perovskite compound of the formula (IA):

$$AB[X]_3 \quad (IA)$$

wherein:
A is an organic cation;
B is a metal cation; and
[X] is at least one anion.

Often, in the optoelectronic device of the invention, [X] in formula (IA) is two or more different anions selected from halide anions and chalcogenide anions. Usually, [X] is two or more different halide anions. Preferably, [X] is two or three different halide anions. More preferably, [X] is two different halide anions. In another embodiment [X] is three different halide anions.

The organic and metal cations may be as further defined hereinbefore. Thus the organic cation may be selected from cations of formula $(R_1R_2R_3R_4N)^+$ and cations of formula $(R_5NH_3)^+$, as defined above. The metal cation may be a divalent metal cation. For instance, the metal cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. Usually, the metal cation is $Sn^{2+}$ or $Pb^{2+}$.

The organic cation may, for instance, be selected from cations of formula $(R_5R_6N=CH—NR_7R_8)^+$, and cations of formula $(H_2N=CH—NH_2)^+$, as defined above. The metal cation may be a divalent metal cation. For instance, the metal cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. Usually, the metal cation is $Sn^{2+}$ or $Pb^{2+}$.

Typically, in the optoelectronic device of the invention, the perovskite is a perovskite compound of formula (II):

$$ABX_{3-y}X'_y \quad (II)$$

wherein:
A is an organic cation;
B is a metal cation;
X is a first halide anion;
X' is a second halide anion which is different from the first halide anion; and
y is from 0.05 to 2.95.

Usually, y is from 0.5 to 2.5, for instance from 0.75 to 2.25. Typically, y is from 1 to 2.

Again, the organic and metal cations may be as further defined hereinbefore. Thus the organic cation may be a cation of formula $(R_1R_2R_3R_4N)^+$ or, more typically, a cation of formula $(R_5NH_3)^+$, as defined above. The metal cation may be a divalent metal cation. For instance, the metal cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. Usually, the metal cation is $Sn^{2+}$ or $Pb^{2+}$.

In some embodiments, the perovskite is a perovskite compound of formula (IIa):

$$ABX_{3z}X'_{3(1-z)} \quad (IIa)$$

wherein:
A is an organic cation of the formula $(R_5R_6N=CH—NR_7R_8)^+$, wherein: $R_5$ is hydrogen, unsubstituted or substituted $C_1$-$C_{20}$ alkyl, or unsubstituted or substituted aryl; $R_6$ is hydrogen, unsubstituted or substituted $C_1$-$C_{20}$ alkyl, or unsubstituted or substituted aryl; $R_7$ is hydrogen, unsubstituted or substituted $C_1$-$C_{20}$ alkyl, or unsubstituted or substituted aryl; and $R_8$ is hydrogen, unsubstituted or substituted $C_1$-$C_{20}$ alkyl, or unsubstituted or substituted aryl;
B is a metal cation;
X is a first halide anion;
X' is a second halide anion which is different from the first halide anion; and
z is greater than 0 and less than 1.

Usually, z is from 0.05 to 0.95.

Preferably, z is from 0.1 to 0.9. z may, for instance, be 0.1, 0.2, 0.3, 0.4, 0.5, 0.6, 0.7, 0.8 or 0.9, or z may be a range of from any one of these values, to any other of these values (for instance from 0.2 to 0.7, or from 0.1 to 0.8).

Typically, X is a halide anion and X' is a chalcogenide anion, or X and X' are two different halide anions or two different chalcogenide anions. Usually, X and X' are two different halide anions. For instance, one of said two or more different halide anions may be iodide and another of said two or more different halide anions may be bromide.

Usually, B is a divalent metal cation. For instance, B may be a divalent metal cation, selected from $Ca^{2+}$, $Sr^{2+}$, $Cd^{2+}$, $Co^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. Usually, B is a divalent metal cation selected from $Sn^{2+}$ and $Pb^{2+}$. For instance, B may be $Pb^{2+}$.

The organic cation may, for instance, be $(R_5R_6N=CH—NR_7R_8)^+$, wherein: $R_5$, $R_6$, $R_7$ and $R_8$ are independently selected from hydrogen and unsubstituted or substituted $C_1$-$C_6$ alkyl. For instance, the organic cation may be $(H_2N=CH—NH_2)^+$.

Often, in the optoelectronic device of the invention, the perovskites are selected from $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$. For instance, in the optoelectronic device of the invention, the perovskites may be selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$. Typically, the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3 SnF_2Br$, $CH_3NH_3 SnICl_2$, $CH_3NH_3SnF_2I$, $CH_3NH_3SnI_2Cl$ and $CH_3NH_3SnF_2Cl$. More typically, the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3 SnF_2Br$, $CH_3NH_3 SnF_2I$ and $CH_3NH_3 SnF_2Cl$. Usually, the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3 SnF_2Br$, and $CH_3NH_3 SnF_2I$.

In some embodiments, the perovskite may be a perovskite of formula $(H_2N=CH—NH_2)PbI_{3z}Br_{3(1-z)}$, wherein z is greater than 0 or less than 1. z may be as further defined herein.

The optoelectronic device of the invention may comprise said perovskite and a single-anion perovskite, wherein said single anion perovskite comprises a first cation, a second cation and an anion selected from halide anions and chalcogenide anions; wherein the first and second cations are as herein defined for said mixed-anion perovskite. For instance, the optoelectronic device may comprise: $CH_3NH_3PbICl_2$ and CH$_3$NH$_3$PbI$_3$; CH$_3$NH$_3$PbICl$_2$ and CH$_3$NH$_3$PbBr$_3$; CH$_3$NH$_3$PbBrCl$_2$ and CH$_3$NH$_3$PbI$_3$; or CH$_3$NH$_3$PbBrCl$_2$ and CH$_3$NH$_3$PbBr$_3$.

The optoelectronic device may comprise a perovskite of formula (H$_2$N=CH—NH$_2$)PbI$_{3z}$Br$_{3(1-z)}$, wherein z is as defined herein, and a single-anion perovskite such as (H$_2$N=CH—NH$_2$)PbI$_3$ or (H$_2$N=CH—NH$_2$)PbBr$_3$.

Alternatively, the optoelectronic device of the invention may comprise more than one perovskite, wherein each perovskite is a mixed-anion perovskite, and wherein said mixed-anion perovskite is as herein defined. For instance, the optoelectronic device may comprise two or three said perovskites. The optoelectronic device of the invention may, for instance, comprise two perovskites wherein both perovskites are mixed-anion perovskites. For instance, the optoelectronic device may comprise: CH$_3$NH$_3$PbICl$_2$ and CH$_3$NH$_3$PbIBr$_2$; CH$_3$NH$_3$PbICl$_2$ and CH$_3$NH$_3$PbBrI$_2$; CH$_3$NH$_3$PbBrCl$_2$ and CH$_3$NH$_3$PbIBr$_2$; or CH$_3$NH$_3$PbBrCl$_2$ and CH$_3$NH$_3$PbIBr$_2$.

The optoelectronic device may comprise two different perovskites, wherein each perovskite is a perovskite of formula (H$_2$N=CH—NH$_2$)PbI$_{3z}$Br$_{3(1-z)}$, wherein z is as defined herein.

In some embodiments of the optoelectronic device of the invention, when [B] is a single metal cation which is Pb$^{2+}$, one of said two or more different halide anions is iodide or fluoride; and when [B] is a single metal cation which is Sn$^{2+}$ one of said two or more different halide anions is fluoride. Usually, in some embodiments of the optoelectronic device of the invention, one of said two or more different halide anions is iodide or fluoride. Typically, in some embodiments of the optoelectronic device of the invention, one of said two or more different halide anions is iodide and another of said two or more different halide anions is fluoride or chloride. Often, in some embodiments of the optoelectronic device of the invention, one of said two or more different halide anions is fluoride. Typically, in some embodiments of the optoelectronic device of the invention, either: (a) one of said two or more different anions is fluoride and another of said said two or more different anions is chloride, bromide or iodide; or (b) one of said two or more different anions is iodide and another of said two or more different anions is fluoride or chloride. Typically, [X] is two different halide anions X and X'. Often, in the optoelectronic device of the invention, said divalent metal cation is Sn$^{2+}$. Alternatively, in the optoelectronic device of the invention, said divalent metal cation may be Pb$^{2+}$.

Usually, the optoelectronic device of the invention comprises a layer comprising said porous dielectric scaffold material and said semiconductor.

Typically, the photoactive layer comprises: said porous dielectric scaffold material; and said semiconductor.

In one embodiment, the optoelectronic device of the invention further comprises a charge transporting material.

The charge transporting material may, for instance, be a hole transporting material or an electron transporting material.

When the charge transporting material is an hole transporting material, the hole transporting material in the optoelectronic device of the invention may be any suitable p-type or hole-transporting, semiconducting material. Typically, the hole transporting material is a small molecular or polymer-based hole conductor.

Typically, when the charge transporting material is an hole transporting material, the charge transporting material is a solid state hole transporting material or a liquid electrolyte.

Often, when the charge transporting material is an hole transporting material, the charge transporting material is a polymeric or molecular hole transporter. Typically, the charge transporting material comprises spiro-OMeTAD (2,2',7,7'-tetrakis-(N,N-di-p-methoxyphenylamine)9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-b']dithiophene-2,6-diyl]]), PVK (poly(N-vinylcarbazole)), HTM-TFSI (1-hexyl-3-methylimidazolium bis(trifluoromethylsulfonyl)imide), Li-TFSI (lithium bis(trifluoromethanesulfonyl)imide) or tBP (tert-butylpyridine). Usually, the charge transporting material is selected from spiro-OMeTAD, P3HT, PCPDTBT and PVK. Preferable, the hole transporting material is spiro-OMeTAD.

When the charge transporting material is an hole transporting material, the charge transporting material may be a molecular hole transporter, or a polymer or copolymers. Often, the charge transporting material is a molecular hole transporting material, a polymer or copolymer comprises one or more of the following moieties: thiophenyl, phenelenyl, dithiazolyl, benzothiazolyl, diketopyrrolopyrrolyl, ethoxydithiophenyl, amino, triphenyl amino, carbozolyl, ethylene dioxythiophenyl, dioxythiophenyl, or fluorenyl.

Alternatively, when the charge transporting material is an hole transporting material, the charge transporting material may be an inorganic hole transporter, for instance, the charge transporting material may be CuI, CuBr, CuSCN, Cu$_2$O, CuO or CIS.

When the charge transporting material is an electron transporting material, the charge transporting material often comprises a fullerene or perylene, or derivatives thereof, or P(NDI2OD-T2). For instance, the charge transporting material may be P(NDI2OD-T2).

In some embodiments, the charge transporting material comprises a perovskite.

When the charge transporting material is a hole transporting material, the hole transporting material may comprise a perovskite.

Likewise, when the charge transporting material is an electron transporting material, the electron transporting material may comprise a perovskite.

Usually, said semiconductor comprises a first perovskite, wherein the first perovskite is as defined hereinabove, and said charge transporting material comprises a second perovskite, wherein the first and second perovskites are the same or different.

As described above, the semiconductor must have a band gap of equal to or less than 3.0 eV. The skilled person will appreciate that the second perovskite is not necessarily a perovskite that has a band gap of equal to or less than 3.0 eV. Thus the second perovskite may have a band gap of equal to or less than 3.0 eV or, in some embodiments, the second perovskite may have a band gap of greater than 3.0 eV.

The skilled person will also appreciate that, usually, either (i) the first perovskite is an n-type material and the second perovskite is a p-type material, or (ii) the first perovskite is a p-type material and the second perovskite is an n-type material. The skilled person will also appreciate that the addition of a doping agent to a perovskite may be used to control the charge transfer properties of that perovskite. Thus, for instance, a perovskite that is an instrinic material may be doped to form an n-type or a p-type material. Accordingly, the first perovskite and/or the second perovskite may comprise one or more doping agent. Typically the doping agent is a dopant element.

The addition of different doping agents to different samples of the same material may result in the different samples having different charge transfer properties. For instance, the addition of one doping agent to a first sample of perovskite material may result in the first sample becoming an n-type material, whilst the addition of a different doping agent to a second sample of the same perovskite material may result in the second sample becoming a p-type material.

In some embodiments of the optoelectronic device of the invention, the first and second perovskites may be the same.

Alternatively, the first and second perovskites may be different. When the first and second perovskites are different, at least one of the first and second perovskites may comprise a doping agent. The first perovskite may for instance comprise a doping agent that is not present in the second perovsite. Additionally or alternatively, the second perovskite may for instance comprise a doping agent that is not present in the first perovskite. Thus the difference between the first and second perovskites may be the presence or absence of a doping agent, or it may be the use of a different doping agent in each perovskite. Alternatively, the first and second perovskites may comprise the same doping agent. Thus the difference between the first and second perovskites may not lie in the doping agent but instead the difference may lie in the overall structure of the first and second perovskites. In other words, the first and second perovskites may be different perovskite compounds.

Usually, in the optoelectronic device of the invention, the perovskite of the charge transporting material is a perovskite comprising a first cation, a second cation, and at least one anion.

In some embodiments, the perovskite of the charge transporting material is a perovskite compound of formula (IB):

$$[A][B][X]_3 \quad \text{(IB)}$$

wherein:
[A] is at least one organic cation or at least one group 1 metal cation;
[B] is at least one metal cation; and
[X] is said at least one anion.

As the skilled person will appreciate, [A] may comprise $Cs^+$.

Usually, [B] comprises $Pb^{2+}$ or $Sn^{2+}$. More typically, [B] comprises $Pb^{2+}$.

Typically, [X] comprises a halide anion or a plurality of different halide anions.

Usually, [X] comprises $I^-$.

In some embodiments, [X] is two or more different anions, for instance, two or more different halide anions. For instance, [X] may comprise $I^-$ and $F^-$, $I^-$ and $Br^-$ or $I^-$ and $Cl^-$.

Usually, in the optoelectronic device of the invention, the perovskite compound of formula (IB) is $CsPbI_3$ or $CsSnI_3$. For instance, the perovskite compound of formula (IB) may be $CsPbI_3$.

Alternatively, the perovskite compound of formula (IB) may be $CsPbI_2Cl$, $CsPbICl_2$, $CsPbI_2F$, $CsPbIF_2$, $CsPbI_2Br$, $CsPbIBr_2$, $CsSnI_2Cl$, $CsSnICl_2$, $CsSnI_2F$, $CsSnIF_2$, $CsSnI_2Br$ or $CsSnIBr_2$. For instance, the perovskite compound of formula (IB) may be $CsPbI_2Cl$ or $CsPbICl_2$. Typically, the perovskite compound of formula (IB) is $CsPbICl_2$.

In the perovskite compound of formula (IB): [X] may be one, two or more different anions as defined herein, for instance, one, two or more different anions as defined herein for the first perovskite; [A] usually comprises an organic cation as defined herein, as above for the first perovskite; and [B] typically comprises a metal cation as defined herein. The metal cation may be defined as hereinbefore for the first perovskite.

In some embodiments, the perovskite of the charge transporting material may be a perovskite as defined for the first perovskite hereinabove. Again, the second perovskite may be the same as or different from the first perovskite, typically it is different.

Typically, in the optoelectronic device of the invention, the charge transporting material is disposed within pores of said porous dielectric scaffold material. Thus, when the optoelectronic device of the invention comprises a layer comprising said porous dielectric scaffold material and said semiconductor, the layer usually further comprises said charge transporting material, within pores of the porous dielectric scaffold material.

Typically, the optoelectronic device of the invention comprises a photoactive layer, wherein the photoactive layer comprises: said porous dielectric scaffold material; said semiconductor; and said charge transporting material.

The term "photoactive layer", as used herein, refers to a layer in the optoelectronic device which comprises a material that (i) absorbs light, which may then generate free charge carriers; or (ii) accepts charge, both electrons and holes, which may subsequently recombine and emit light.

As would be understood by the skilled person when the material absorbs light, the energy of the photon is used to promote an electron to a higher energy state in the absorber. The photon energy is converted into electrical potential energy.

Usually, in the photoactive layer, the semiconductor is an n-type semiconductor as defined herein and the charge transporting material is a hole transporting material as defined herein.

Alternatively, in the photoactive layer, the semiconductor may be a p-type semiconductor as defined herein and the charge transporting material may be an electron transporting material as defined herein.

As a further alternative, in the photoactive layer, the semiconductor may be an intrinsic semiconductor as defined herein and the charge transport material is a hole transport material as defined herein or an electron transport material as defined herein.

Typically, in the optoelectronic device of the invention, in the photoactive layer, the semiconductor is a perovskite as defined herein.

Usually, the photoactive layer comprises a layer comprising said porous dielectric scaffold material and said semiconductor, wherein the semiconductor is disposed on the surface of pores within said dielectric scaffold material, and wherein said charge transporting material is disposed within pores of said porous dielectric scaffold material.

More typically, the photoactive layer comprises a layer comprising said charge transporting material disposed on a layer comprising said porous dielectric scaffold material and said semiconductor, wherein the semiconductor is disposed on the surface of pores within said dielectric scaffold material, and wherein the device further comprises said charge transporting material disposed within pores of said porous dielectric scaffold material.

Often, the thickness of the photoactive layer is from 100 nm to 3000 nm. Usually, the thickness of the photoactive layer is from 100 nm to 1000 nm As used herein, the term "thickness" refers to the average thickness of a component of an optoelectronic device.

In one embodiment, the optoelectronic device of the invention comprises:
a first electrode;
a second electrode; and disposed between the first and second electrodes:
said photoactive layer.

The first and second electrodes are an anode and a cathode, and usually one or both of the anode and cathode is transparent to allow the ingress of light. The choice of the first and second electrodes of the optoelectronic devices of the present invention may depend on the structure type. Typically, the n-type layer is deposited onto a tin oxide, more typically onto a fluorine-doped tin oxide (FTO) anode, which is usually a transparent or semi-transparent material. Thus, the first electrode is usually transparent or semi-transparent and typically comprises FTO. Usually, the thickness of the first electrode is from 200 nm to 600 nm, more usually, from 300 to 500 nm. For instance the thickness may be 400 nm. Typically, FTO is coated onto a glass sheet. Usually, the second electrode comprises a high work function metal, for instance gold, silver, nickel, palladium or platinum, and typically silver. Usually, the thickness of the second electrode is from 50 nm to 250 nm, more usually from 100 nm to 200 nm. For instance, the thickness of the second electrode may be 150 nm.

Typically, in the optoelectronic device of the invention, the thickness of the photoactive layer is from 200 nm to 1000 nm, for instance the thickness may be from 400 nm to 800 nm. Often, thickness of the photoactive layer is from 400 nm to 600 nm. Usually the thickness is about 500 nm.

Usually, the optoelectronic device of the invention comprises:
a first electrode;
a second electrode; and disposed between the first and second electrodes:
(a) said photoactive layer; and
(b) a compact layer comprising a metal oxide.

As the skilled person will appreciate, when the semiconductor is an n-type semiconductor (for instance an n-type perovskite, or a perovskite which acts as an n-type, electron-transporting material when photo-doped) an n-type compact layer should also be used. On the other hand, when the semiconductor is p-type, the compact layer should be p-type too. Examples of p-type semiconductors that can be used in the compact layer include oxides of nickel, vanadium, copper or molybdenum. Additionally, p-type organic hole-conductors may also be useful as p-type compact layers. Examples of such p-type hole-conductors are PEDO:PSS (poly(3,4-ethylenedioxythiophene):poly-(styrenesulfonate)), and polyanilene. Examples of n-type semiconductors that can be used in the compact layer include oxides of titanium, tin, zinc, gallium, niobium, tantalum, neodymium, palladium and cadmium, or a mixture thereof, and sulphides of zinc or cadmium, or mixtures thereof.

Often, the semiconductor used in the compact layer will be different from said semiconductor having a band gap of less than or equal to 3.0 eV.

Alternatively, the semiconductor used in the compact layer may be the same as said semiconductor having a band gap of less than or equal to 3.0 eV. The compact layer may, for instance, comprise said perovskite.

Often, the compact layer comprises a metal oxide or a metal sulphide.

Usually, in the optoelectronic device of the invention, the compact layer comprises an n-type semiconductor comprising an oxide of titanium, tin, zinc, gallium, niobium, tantalum, neodymium, palladium or cadmium, or a sulphide of zinc or cadmium.

Typically, in the optoelectronic device of the invention, the compact layer comprises $TiO_2$.

Usually, the compact layer has a thickness of from 20 nm to 200 nm, typically a thickness of about 100 nm.

Alternatively, in the optoelectronic device of the invention, the compact layer may comprise a p-type semiconductor comprising an oxide of nickel, vanadium or copper.

In one embodiment, in the optoelectronic device of the invention, the compact layer may comprise a semiconductor comprising an oxide of molybdenum or tungsten.

In one embodiment, the optoelectronic device of the invention further comprises an additional layer, disposed between the compact layer and the photoactive layer, which additional layer comprises a metal oxide or a metal chalcogenide which is the same as or different from the metal oxide or a metal chalcogenide employed in the compact layer.

Typically, the additional layer comprises alumina, magnesium oxide, cadmium sulphide, silicon dioxide, or yttrium oxide.

Usually, the optoelectronic device of the invention is selected from a photovoltaic device; a photodiode; a phototransistor; a photomultiplier; a photo resistor; a photo detector; a light-sensitive detector; solid-state triode; a battery electrode; a light-emitting device; a light-emitting diode; a transistor; a solar cell; a laser; and a diode injection laser.

In a preferred embodiment, the optoelectronic device of the invention is a photovoltaic device.

Usually, the optoelectronic device of the invention is a solar cell.

In an alternative embodiment, the optoelectronic device of the invention is a light-emitting device, for instance a light-emitting diode.

In one embodiment the optoelectronic device of the invention is a photovoltaic device, wherein the device comprises:
a first electrode;
a second electrode; and disposed between the first and second electrodes:
a photoactive layer;
wherein the photoactive layer comprises a charge transporting material and a layer comprising (i) said porous dielectric scaffold material and (ii) said semiconductor, wherein the semiconductor is a photosensitizing material and is disposed on the surface of pores within said dielectric scaffold material, and wherein said charge transporting material is disposed within pores of said porous dielectric scaffold material; and
said semiconductor comprises a perovskite which is a perovskite compound of formula (I):

$$[A][B][X]_3 \qquad (I)$$

wherein:
[A] is at least one organic cation;
[B] is at least one metal cation; and
[X] is at least one anion selected from halide anions and chalcogenide anions.

The organic and metal cations may be as further defined hereinbefore. Thus the organic cations may be selected from cations of formula $(R_1R_2R_3R_4N)^+$ and cations of formula $(R_5NH_3)^+$, as defined above. The metal cations may be selected from divalent metal cations. For instance, the metal cations may be selected from $Ca^{2+}$, $Sr^{2+}$, $Cd^{2+}$, $Cu^{2+}$, $Ni^{2+}$, Mn$^{2+}$, Fe$^{2+}$, Co$^{2+}$, Pd$^{2+}$, Ge$^{2+}$, Sn$^{2+}$, Pb$^{2+}$, Sn$^{2+}$, Yb$^{2+}$ and Eu$^{2+}$. Usually, the metal cation is Sn$^{2+}$ or Pb$^{2+}$.

The organic cations may, for instance, be selected from cations of formula (R$_5$R$_6$N=CH—NR$_7$R$_8$)$^+$ and cations of formula (H$_2$N=CH—NH$_2$)$^+$, as defined above. The metal cations may be selected from divalent metal cations. For instance, the metal cations may be selected from Ca$^{2+}$, Sr$^{2+}$, Cd$^{2+}$, Cu$^{2+}$, Ni$^{2+}$, Mn$^{2+}$, Fe$^{2+}$, Co$^{2+}$, Pd$^{2+}$, Ge$^{2+}$, Sn$^{2+}$, Pb$^{2+}$, Sn$^{2+}$, Yb$^{2+}$ and Eu$^{2+}$. Usually, the metal cation is Sn$^{2+}$ or Pb$^{2+}$.

[X] may also be as further defined herein. Usually, [X] is two or more different anions selected from halide anions and chalcogenide anions. More typically, [X] is two or more different halide anions.

The porous dielectric scaffold material and the charge transporting material may also be as further defined herein.

In a further embodiment the optoelectronic device of the invention is a photovoltaic device, wherein the device comprises:
  a first electrode;
  a second electrode; and disposed between the first and second electrodes:
  a compact layer comprising a metal oxide; and
  a photoactive layer;
wherein the photoactive layer comprises a charge transporting material and a layer comprising said porous dielectric scaffold material and said semiconductor, wherein the semiconductor is a photosensitizing material and is disposed on the surface of pores within said dielectric scaffold material, and wherein said charge transporting material is disposed within pores of said porous dielectric scaffold material; and
said semiconductor comprises a perovskite which is a perovskite compound of formula (I):

$$[A][B][X]_3 \qquad (I)$$

wherein:
  [A] is at least one organic cation;
  [B] is at least one metal cation; and
  [X] is at least one anion selected from halide anions and chalcogenide anions.

The organic and metal cations may be as further defined hereinbefore. Thus the organic cations may be selected from cations of formula (R$_1$R$_2$R$_3$R$_4$N)$^+$ and cations of formula (R$_5$NH$_3$)$^+$, as defined above. The metal cations may be selected from divalent metal cations. For instance, the metal cations may be selected from Ca$^{2+}$, Sr$^{2+}$, Cd$^{2+}$, Cu$^{2+}$, Ni$^{2+}$, Mn$^{2+}$, Fe$^{2+}$, Co$^{2+}$, Pd$^{2+}$, Ge$^{2+}$, Sn$^{2+}$, Pb$^{2+}$, Sn$^{2+}$, Yb$^{2+}$ and Eu$^{2+}$. Usually, the metal cation is Sn$^{2+}$ or Pb$^{2+}$.

The organic cations may, for instance, be selected from cations of formula (R$_5$R$_6$N=CH—NR$_7$R$_8$)$^+$ and cations of formula (H$_2$N=CH—NH$_2$)$^+$, as defined above. The metal cations may be selected from divalent metal cations. For instance, the metal cations may be selected from Ca$^{2+}$, Sr$^{2+}$, Cd$^{2+}$, Cu$^{2+}$, Ni$^{2+}$, Mn$^{2+}$, Fe$^{2+}$, Co$^{2+}$, Pd$^{2+}$, Ge$^{2+}$, Sn$^{2+}$, Pb$^{2+}$, Sn$^{2+}$, Yb$^{2+}$ and Eu$^{2+}$. Usually, the metal cation is Sn$^{2+}$ or Pb$^{2+}$.

[X] may also be as further defined herein. Usually, [X] is two or more different anions selected from halide anions and chalcogenide anions. More typically, [X] is two or more different halide anions.

The porous dielectric scaffold material and the hole transporting material may also be as further defined herein, as may be the metal oxide in the compact layer.

Usually, the semiconductor is an n-type semiconductor and the charge transporting material is a hole transporting material as defined herein.

Alternatively, the semiconductor is a p-type semiconductor and the charge transporting material is an electron transporting material as defined herein.

The fundamental losses in a solar cell can be quantified as the difference in energy between the open-circuit voltage and the band-gap of the absorber, which may be considered the loss in potential. The theoretical maximum open-circuit voltage can be estimated as a function of band gap following the Schokley-Quasar treatment, and for a material with a band gap of 1.55 eV the maximum possible open-circuit voltage under full sun illumination is 1.3 V, giving a minimum loss-in-potential 0.25 eV.

Often, in the optoelectronic device of the invention, x is less than or equal to 0.6 eV, wherein:

$x$ is equal to $A-B$, wherein:
  A is the optical band gap of said thin-film semiconductor; and
  B is the open-circuit voltage generated by the optoelectronic device under standard AM1.5G 100 mWcm$^{-2}$ solar illumination.

Usually, in the optoelectronic device of the invention, x is less than or equal to 0.45 eV.

The invention also provides the use of: (i) a porous dielectric scaffold material; and (ii) a semiconductor having a band gap of less than or equal to 3.0 eV, in contact with the scaffold material; in an optoelectronic device.

Often, in the use of the invention, the use is of: (i) a porous dielectric scaffold material; and (ii) a semiconductor having a band gap of less than or equal to 3.0 eV, which is in contact with the scaffold material, as a photoactive material in an optoelectronic device.

Typically, the use is of: (i) said porous dielectric scaffold material; (ii) said semiconductor, in contact with the scaffold material; and (iii) a charge transporting material; as a photoactive material in an optoelectronic device.

The invention also provides the use of a layer comprising: (i) a porous dielectric scaffold material; and (ii) a semiconductor having a band gap of less than or equal to 3.0 eV, in contact with the scaffold material; as a photoactive layer in an optoelectronic device.

Typically, the layer further comprises a charge transporting material.

In the uses of the invention the porous dielectric scaffold material may be as further defined herein; and/or the semiconductor may be as further defined herein. The charge transporting material may also be as further defined herein.

Usually, the semiconductor comprises an n-type semiconductor comprising a perovskite.

Alternatively, in one embodiment, in the uses of the invention, the semiconductor is a p-type semiconductor.

Typically, the semiconductor comprises a p-type semiconductor comprising a perovskite.

In some embodiments, the semiconductor comprises an oxide of gallium, niobium, tantalum, tungsten, indium, neodymium or palladium, or a sulphide of zinc or cadmium, provided of course that the semiconductor has a band gap of less than or equal to 3.0 eV.

Additionally or alternatively, in some embodiments, the semiconductor comprises an oxide of nickel, vanadium, lead, copper or molybdenum, provided of course that the semiconductor has a band gap of less than or equal to 3.0 eV.

In another embodiment, in the uses of the invention, the semiconductor is an intrinsic semiconductor.

Often, the semiconductor comprises an intrinsic semiconductor comprises a perovskite.

Typically, in the uses of the invention, the semiconductor is disposed on the surface of said porous dielectric scaffold material. Thus, usually, the semiconductor is disposed on the surfaces of pores within said porous dielectric scaffold material.

Also, the charge transporting material, where present, is typically disposed within pores of said porous dielectric scaffold material. Often, the charge transporting material is a hole transporting material as defined herein. Alternatively, the charge transporting material is an electron transporting material as defined herein.

In one embodiment, in the uses of the invention, (a) the porous dielectric scaffold material comprises an oxide of aluminium, germanium, zirconium, silicon, yttrium or ytterbium; or alumina silicate; and/or (b) the semiconductor is a perovskite.

For instance, in the uses of the invention, (a) the porous dielectric scaffold material is as further defined herein; and/or (b) the semiconductor is as further defined herein.

Typically, in the uses of the invention, the optoelectronic device is a photovoltaic device. Usually, the optoelectronic device is a solar cell.

Alternatively, in the uses of the invention, the optoelectronic device may be a light-emitting device, for instance a light-emitting diode.

The invention also provides a photoactive layer for an optoelectronic device comprising: (a) a porous dielectric scaffold material; (b) a semiconductor having a band gap of less than or equal to 3.0 eV, in contact with the scaffold material; and (c) a charge transporting material.

Typically, in the photoactive layer of the invention, the semiconductor is disposed on the surface of said porous dielectric scaffold material. Thus, usually, the semiconductor is disposed on the surfaces of pores within said porous dielectric scaffold material. Also, the charge transporting material is typically disposed within pores of said porous dielectric scaffold material.

Usually, in the photoactive layer of the invention, the semiconductor is an n-type semiconductor. Typically, the semiconductor comprises an n-type semiconductor comprising a perovskite, Alternatively, in the photoactive layer of the invention, the semiconductor may be a p-type semiconductor. Often, the semiconductor comprises a p-type semiconductor comprising a perovskite, As a further alternative, in the photoactive layer of the invention, the semiconductor may be an intrinsic semiconductor. Usually, the semiconductor comprises an intrinsic semiconductor comprises a perovskite In some embodiments, in the photoactive layer, the semiconductor comprises an oxide of gallium, niobium, tantalum, tungsten, indium, neodymium or palladium, or a sulphide of zinc or cadmium, provided of course that the semiconductor has a band gap of less than or equal to 3.0 eV.

Additionally or alternatively, in some embodiments, in the photoactive layer, the semiconductor comprises an oxide of nickel, vanadium, lead, copper or molybdenum, provided of course that the semiconductor has a band gap of less than or equal to 3.0 eV.

Typically, in the photoactive layer of the invention: (a) the porous dielectric scaffold material comprises an oxide of aluminium, germanium, zirconium, silicon, yttrium or ytterbium; or alumina silicate; (b) the semiconductor is a perovskite; and/or (c) the charge transporting material is a hole transporting material.

For instance, (a) the porous dielectric scaffold material may be as further defined herein; (b) the semiconductor may be as further defined herein; and/or (c) the charge transporting material may be as further defined herein.

Alternatively, often, in the photoactive layer of the invention: (a) the porous dielectric scaffold material comprises an oxide of aluminium, germanium, zirconium, silicon, yttrium or ytterbium; or alumina silicate; (b) the semiconductor is a perovskite; and/or (c) the charge transporting material is an electron conductor.

For instance, (a) the porous dielectric scaffold material may be as further defined herein; (b) the semiconductor is as further defined herein; and/or (c) the charge transporting material is as further defined herein.

The porous dielectric scaffold material used in the devices of the invention can be produced by a process comprising: (i) washing a first dispersion of a dielectric material; and (ii) mixing the washed dispersion with a solution comprising a pore-forming agent which is a combustible or dissolvable organic compound. The pore-forming agent is removed later in the process by burning the agent off or by selectively dissolving it using an appropriate solvent. Any suitable pore-forming agent may be used. The pore-forming agent may be a carbohydrate, for instance a polysaccharide, or a derivative thereof. Typically, ethyl cellulose is used as the pore-forming agent.

The term "carbohydrate" refers to an organic compound consisting of carbon, oxygen and hydrogen. The hydrogen to oxygen atom ratio is usually 2:1. It is to be understood that the term carbohydrate encompasses monosaccharides, disaccharides, oligosaccharides and polysaccharides. Carbohydrate derivatives are typically carbohydrates comprising additional substituents. Usually the substituents are other than hydroxyl groups. When an carbohydrate is substituted it typically bears one or more substituents selected from substituted or unsubstituted $C_1$-$C_{20}$ alkyl, substituted or unsubstituted aryl, cyano, amino, $C_1$-$C_{10}$ alkylamino, di($C_1$-$C_{10}$)alkylamino, arylamino, diarylamino, arylalkylamino, amido, acylamido, oxo, halo, carboxy, ester, acyl, acyloxy, $C_1$-$C_{20}$ alkoxy, aryloxy, haloalkyl, sulfonic acid, sulfhydryl (i.e. thiol, —SH), $C_1$-$C_{10}$ alkylthio, arylthio, sulfonyl, phosphoric acid, phosphate ester, phosphonic acid and phosphonate ester. Examples of substituted alkyl groups include haloalkyl, hydroxyalkyl, aminoalkyl, alkoxyalkyl and alkaryl groups. The term alkaryl, as used herein, pertains to a $C_1$-$C_{20}$ alkyl group in which at least one hydrogen atom has been replaced with an aryl group. Examples of such groups include, but are not limited to, benzyl (phenylmethyl, PhCH$_2$—), benzhydryl (Ph$_2$CH—), trityl (triphenylmethyl, Ph$_3$C—), phenethyl (phenylethyl, Ph-CH$_2$CH$_2$—), styryl (Ph-CH=CH—), cinnamyl (Ph-CH=CH—CH$_2$—). In a carbohydrate derivative, the substituent on the carbohydrate may, for instance, be a $C_1$-$C_6$ alkyl, wherein a $C_1$-$C_6$ alkyl is as defined herein above. Often the substituents are substituents on the hydroxyl group of the carbohydrate. Typically, the pore-forming agent used in the step of mixing the dispersion with a solution is a carbohydrate or a derivative thereof, more typically a carbohydrate derivative. Thus, for instance, the carbohydrate or a derivative thereof is ethyl cellulose.

Usually, the first dispersion used in the process for producing the porous dielectric scaffold material is a solution comprising an electrolyte and water. Typically, the first dispersion is about 10 wt % of the electrolyte in water. For some dielectrics, for instance, silica, the process further comprises a step of forming the electrolyte from a precursor material. For instance, when the dielectric is silica, the process may further comprises a step of forming the electrolyte from a silicate, such as tetraethyl orthosilicate. Usually the precursor material is added to water. Typically, the first dispersion is produced by mixing an alcohol, such as ethanol, with water, then adding a base, such as ammonium hydroxide, in water and the precursor material. When the dielectric is silica, usually from 2 to 3 ml of deionized water are added to from 55 to 65 ml of absolute ethanol. Typically, about 2.52 ml of deionized water are added to about 59.2 ml of absolute ethanol.

This mixture is usually then stirred vigorously. Then, typically, from 0.4 to 0.6 ml of the base in water are added along with from 5 to 10 ml of the precursor. More typically, about 0.47 ml of ammonium hydroxide 28% in water are added along with about 7.81 ml of the precursor.

In the step of washing the first dispersion of a dielectric material often the first dispersion is centrifuged at from 6500 to 8500 rpm, usually at about 7500 rpm. Usually, the first dispersion is centrifuged for from 2 to 10 hours, typically for about 6 hours. The centrifuged dispersion is then usually redispersed in an alcohol, such as absolute ethanol. Often, the centrifuged dispersion is redispersed in an alcohol with an ultrasonic probe. The ultrasonic probe is usually operated for a total sonication time of from 3 minutes to 7 minutes, often about 5 minutes. Typically, the sonication is carried out in cycles. Usually, sonication is carried out in cycles of approximately 2 seconds on and approximately 2 seconds off. The step of washing the first dispersion is often repeated two, three or four times, typically three times.

Usually, in the step of mixing the washed dispersion with a solution comprising a carbohydrate or a derivative thereof, the solution comprises a solvent for the carbohydrate or a derivative thereof. For instance, when the carbohydrate or a derivative thereof is ethyl cellulose, the solvent may be α-terpineol.

Typically, the amount of the product from the step of washing the first dispersion used in the step of mixing the washed dispersion with the solution is equivalent to using from 0.5 to 1.5 g of the dielectric, for instance, about 1 g of the dielectric. When the carbohydrate or derivative thereof is ethyl cellulose, usually, a mix of different grades of ethyl cellulose are used. Typically a ratio of approximately 50:50 of 10 cP:46 cP of ethyl cellulose is used. Usually, from 4 to 6 g of the carbohydrate or derivative is used. More usually, about 5 g of the carbohydrate or derivative is used. Typically the amount of solvent used is from 3 to 3.5 g, for instance 3.33 g.

Typically, in the step of mixing the washed dispersion with a solution comprising a carbohydrate or a derivative thereof, each component is added in turn. Usually, after each component is added, the mixture is stirred for from 1 to 3 minutes, for instance, for 2 minutes. Often, after the mixture is stirred, it is sonicated with an ultrasonic probe for a total sonication time of from 30 to 90 seconds, often about 1 minute. Typically, the sonication is carried out in cycles. Usually, sonication is carried out in cycles of approximately 2 seconds on and approximately 2 seconds off.

Usually, in the step of mixing the washed dispersion with a solution comprising a carbohydrate or a derivative thereof, after the components have been mixed, the resulting mixture is introduced into a rotary evaporator. The rotary evaporator is typically used to remove any excess alcohol, such as ethanol, and/or to achieve a thickness of solution appropriate for spin coating, doctor blading or screen printing the material.

The perovskite used in the devices of the invention, can be produced by a process comprising mixing:
  (a) a first compound comprising (i) a first cation and (ii) a first anion; with
  (b) a second compound comprising (i) a second cation and (ii) a second anion:
  wherein:
    the first and second cations are as defined herein; and
    the first and second anions may be the same or different anions.

The perovskites which comprise at least one anion selected from halide anions and chalcogenide anions, may, for instance, be produced by a process comprising mixing:
  (a) a first compound comprising (i) a first cation and (ii) a first anion; with
  (b) a second compound comprising (i) a second cation and (ii) a second anion:
  wherein:
    the first and second cations are as herein defined; and
    the first and second anions may be the same or different anions selected from halide anions and chalcogenide anions. Typically, the first and second anions are different anions. More typically, the first and second anions are different anions selected from halide anions.

The perovskite produced by the process may comprise further cations or further anions. For example, the perovskite may comprise two, three or four different cations, or two, three of four different anions. The process for producing the perovskite may therefore comprise mixing further compounds comprising a further cation or a further anion. Additionally or alternatively, the process for producing the perovskite may comprise mixing (a) and (b) with: (c) a third compound comprising (i) the first cation and (ii) the second anion; or (d) a fourth compound comprising (i) the second cation and (ii) the first anion.

Typically, in the process for producing the perovskite, the second cation in the mixed-anion perovskite is a metal cation. More typically, the second cation is a divalent metal cation. For instance, the first cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Y^{2+}$ and $Eu^{2+}$. Usually, the second cation is selected from $Sn^{2+}$ and $Pb^{2+}$.

Often, in the process for producing the perovskite, the first cation in the mixed-anion perovskite is an organic cation.

Usually, the organic cation has the formula $(R_1R_2R_3R_4N)^+$, wherein:
  $R_1$ is hydrogen, unsubstituted or substituted $C_1$-$C_{20}$ alkyl, or unsubstituted or substituted aryl;
  $R_2$ is hydrogen, unsubstituted or substituted $C_1$-$C_{20}$ alkyl, or unsubstituted or substituted aryl;
  $R_3$ is hydrogen, unsubstituted or substituted $C_1$-$C_{20}$ alkyl, or unsubstituted or substituted aryl; and
  $R_4$ is hydrogen, unsubstituted or substituted $C_1$-$C_{20}$ alkyl, or unsubstituted or substituted aryl.

Mainly, in the organic cation, $R_1$ is hydrogen, methyl or ethyl, $R_2$ is hydrogen, methyl or ethyl, $R_3$ is hydrogen, methyl or ethyl, and $R_4$ is hydrogen, methyl or ethyl. For instance $R_1$ may be hydrogen or methyl, $R_2$ may be hydrogen or methyl, $R_3$ may be hydrogen or methyl, and $R_4$ may be hydrogen or methyl.

Alternatively, the organic cation may have the formula $(R_5NH_3)^+$, wherein: $R_5$ is hydrogen, or unsubstituted or substituted $C_1$-$C_{20}$ alkyl. For instance, $R_5$ may be methyl or ethyl. Typically, $R_5$ is methyl.

In some embodiments, the organic cation has the formula $(R_5R_6N=CH-NR_7R_8)^+$, wherein: $R_5$ is hydrogen, unsubstituted or substituted $C_1$-$C_{20}$ alkyl, or unsubstituted or substituted aryl; $R_6$ is hydrogen, unsubstituted or substituted $C_1$-$C_{20}$ alkyl, or unsubstituted or substituted aryl; $R_7$ is hydrogen, unsubstituted or substituted $C_1$-$C_{20}$ alkyl, or unsubstituted or substituted aryl; and $R_8$ is hydrogen, unsubstituted or substituted C₁-C₂₀ alkyl, or unsubstituted or substituted aryl. The organic cation may, for instance, be (R₅R₆N═CH—NR₇R₈)⁺, wherein: R₅, R₆, R₇ and R₈ are independently selected from hydrogen, unsubstituted or substituted C₁-C₂₀ alkyl, and unsubstituted or substituted aryl. For instance, the organic cation may be (H₂N═CH—NH₂)⁺.

In the process for producing the perovskite, the perovskite is usually a mixed-halide perovskite, wherein said two or more different anions are two or more different halide anions.

Typically, in the process for producing the perovskite, the perovskite is a perovskite compound of the formula (I):

$$[A][B][X]_3 \quad (I)$$

wherein:
[A] is at least one organic cation;
[B] is at least one metal cation; and
[X] is said two or more different anions; and
the process comprises mixing:
(a) a first compound comprising (i) a metal cation and (ii) a first anion; with
(b) a second compound comprising (i) an organic cation and (ii) a second anion:
wherein:
the first and second anions are different anions selected from halide anions or chalcogenide anions.

Alternatively the process may comprising (1) treating: (a) a first compound comprising (i) a first cation and (ii) a first anion; with (b) a second compound comprising (i) a second cation and (ii) a first anion, to produce a first product, wherein: the first and second cations are as herein defined; and the first anion is selected from halide anions and chalcogenide anions; and (2) treating (a) a first compound comprising (i) a first cation and (ii) a second anion; with (b) a second compound comprising (i) a second cation and (ii) a second anion, to produce a second product, wherein: the first and second cations are as herein defined; and the second anion is selected from halide anions and chalcogenide anions. Usually, the first and second anions are different anions selected from halide anions and chalcogenide anions. Typically, the first and second anions are different anions selected from halide anions. The process usually further comprises treating a first amount of the first product with a second amount of the second product, wherein the first and second amounts may be the same or different.

The perovskite of the formula (I) may, for instance, comprise one, two, three or four different metal cations, typically one or two different metal cations. The perovskite of the formula (I), may, for instance, comprise one, two, three or four different organic cations, typically one or two different organic cations. The perovskite of the formula (I), may, for instance, comprise two, three or four different anions, typically two or three different anions. The process may, therefore, comprising mixing further compounds comprising a cation and an anion.

Typically, [X] is two or more different halide anions. The first and second anions are thus typically halide anions. Alternatively [X] may be three different halide ions. Thus the process may comprise mixing a third compound with the first and second compound, wherein the third compound comprises (i) a cation and (ii) a third halide anion, where the third anion is a different halide anion from the first and second halide anions.

Often, in the process for producing the perovskite, the perovskite is a perovskite compound of the formula (IA):

$$AB[X]_3 \quad (IA)$$

wherein:
A is an organic cation;
B is a metal cation; and
[X] is said two or more different anions.
the process comprises mixing:
(a) a first compound comprising (i) a metal cation and (ii) a first halide anion; with
(b) a second compound comprising (i) an organic cation and (ii) a second halide anion:
wherein:
the first and second halide anions are different halide anions.

Usually, [X] is two or more different halide anions. Preferably, [X] is two or three different halide anions. More preferably, [X] is two different halide anions. In another embodiment [X] is three different halide anions.

Typically, in the process for producing the perovskite, the perovskite is a perovskite compound of formula (II):

$$ABX_{3-y}X'_y \quad (II)$$

wherein:
A is an organic cation;
B is a metal cation;
X is a first halide anion;
X' is a second halide anion which is different from the first halide anion; and
y is from 0.05 to 2.95; and
the process comprises mixing:
(a) a first compound comprising (i) a metal cation and (ii) X; with
(b) a second compound comprising (i) an organic cation and (ii) X':
wherein the ratio of X to X' in the mixture is equal to (3−y):y.

In order to achieve said ratio of X to X' equal to (3−y):y, the process may comprise mixing a further compound with the first and second compounds. For example, the process may comprise mixing a third compound with the first and second compounds, wherein the third compound comprises (i) the metal cation and (ii) X'. Alternative, the process may comprising mixing a third compound with the first and second compounds, wherein the third compound comprises (i) the organic cation and (ii) X.

Usually, y is from 0.5 to 2.5, for instance from 0.75 to 2.25. Typically, y is from 1 to 2.

Typically, in the process for producing the perovskite, the first compound is BX₂ and the second compound is AX'.

Often the second compound is produce by reacting a compound of the formula (R₅NH₂), wherein: R₅ is hydrogen, or unsubstituted or substituted C₁-C₂₀ alkyl, with a compound of formula HX'. Typically, R₅ may be methyl or ethyl, often R₅ is methyl.

Usually, the compound of formula (R₅NH₂) and the compound of formula HX' are reacted in a 1:1 molar ratio. Often, the reaction takes place under nitrogen atmosphere and usually in anhydrous ethanol. Typically, the anhydrous ethanol is about 200 proof. More typically from 15 to 30 ml of the compound of formula (R₅NH₂) is reacted with about 15 to 15 ml of HX', usually under nitrogen atmosphere in from 50 to 150 ml anhydrous ethanol. The process may also comprise a step of recovering said mixed-anion perovskite. A rotary evaporator is often used to extract crystalline AX'.

Usually, the step of mixing the first and second compounds is a step of dissolving the first and second compounds in a solvent. The first and second compounds may be dissolved in a ratio of from 1:20 to 20:1, typically a ratio of 1:1. Typically the solvent is dimethylformamide (DMF) or water. When the metal cation is Pb²⁺ the solvent is usually dimethylformamide. When the metal cation is $Sn^{2+}$ the solvent is usually water. The use of DMF or water as the solvent is advantageous as these solvents are not very volatile.

Often, in the process for producing the perovskite, the perovskite is a perovskite selected from $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$. More often, the perovskite is a perovskite selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$. Typically, the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnF_2Br$, $CH_3NH_3SnICl_2$, $CH_3NH_3SnF_2I$, $CH_3NH_3SnI_2Cl$ and $CH_3NH_3SnF_2Cl$. More typically, the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnF_2Br$, $CH_3NH_3SnF_2I$ and $CH_3NH_3SnF_2Cl$. Usually, the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3SnF_2Br$, and $CH_3NH_3SnF_2I$.

In some embodiments, in the process for producing the mixed-anion perovskite, the perovskite is a perovskite compound of formula (IIa):

$$ABX_{3z}X'_{3(1-z)} \qquad \text{(IIa)}$$

wherein:

A is an organic cation of the formula $(R_5R_6N=CH-NR_7R_8)^+$, wherein: (i) $R_5$ is hydrogen, unsubstituted or substituted $C_1$-$C_{20}$ alkyl, or unsubstituted or substituted aryl; (ii) $R_6$ is hydrogen, unsubstituted or substituted $C_1$-$C_{20}$ alkyl, or unsubstituted or substituted aryl; (iii) $R_7$ is hydrogen, unsubstituted or substituted $C_1$-$C_{20}$ alkyl, or unsubstituted or substituted aryl; and (iv) $R_8$ is hydrogen, unsubstituted or substituted $C_1$-$C_{20}$ alkyl, or unsubstituted or substituted aryl;

B is an metal cation selected from $Sn^{2+}$ and $Pb^{2+}$;

X is a first halide anion;

X' is a second halide anion which is different from the first halide anion; and z is greater than 0 and less than 1;

and the process comprises (1) treating: (a) a first compound comprising (i) the metal cation and (ii) X, with (b) a second compound comprising (i) the organic cation and (ii) X, to produce a first product;

(2) treating: (a) a first compound comprising (i) the metal cation and (ii) X', with (b) a second compound comprising (i) the organic cation and (ii) X', to produce a second product; and (3) treating a first amount of the first product with a second amount of the second product, wherein the first and second amounts may be the same or different.

Usually z is from 0.05 to 0.95.

In the process for producing a mixed-anion perovskite, the perovskite may, for instance, have the formula $(H_2N=CH-NH_2)PbI_{3z}Br_{3(1-z)}$, wherein z is as defined hereinabove.

Other semiconductors used in the devices of the invention may be prepared using known synthetic techniques.

The photoactive layer of the invention, or the photoactive layer present in the optoelectronic device of the invention, may further comprise encapsulated metal nanoparticles.

The process for producing an optoelectronic device is usually a process for producing a device selected from: a photovoltaic device; a photodiode; a phototransistor; a photomultiplier; a photo resistor; a photo detector; a light-sensitive detector; solid-state triode; a battery electrode; a light-emitting device; a light-emitting diode; a transistor; a solar cell; a laser; and a diode injection laser. Typically, the optoelectronic device is a photovoltaic device. Alternatively, the optoelectronic device may be a light-emitting device.

The process for producing an optoelectronic device of the invention, wherein the optoelectronic device comprises:

a first electrode;

a second electrode; and disposed between the first and second electrodes:

a photoactive layer, which photoactive layer comprises a porous dielectric scaffold material and a semiconductor having a band gap of less than or equal to 3.0 eV, in contact with the scaffold material;

is usually a process comprising:

(i) providing a first electrode;

(ii) depositing said photoactive layer; and (iii) providing a second electrode.

As the skilled person will appreciate, the process of producing an optoelectronic device will vary depending on the optoelectronic device being made, and in particular depending upon the different components of the device. The process which is discussed below and exemplified is a process for producing an optoelectronic device which comprises a first electrode; a second electrode; and disposed between the first and second electrodes: (a) a photoactive layer comprising: (i) a charge transporting material, which is a hole transporting material; (ii) a layer comprising said porous dielectric scaffold material and (iii) a semiconductor, which semiconductor is a perovskite, wherein the semiconductor is a photosensitizing material and is disposed on the surface of pores within said dielectric scaffold material, and wherein said charge transporting material is disposed within pores of said porous dielectric scaffold material; and (b) a compact layer comprising an n-type semiconductor. However, as the skilled person will appreciate, the same process may be used or adapted to produce other devices of the invention, having different components and different layer structures. These include, for instance, optoelectronic devices of the invention which comprise: a first electrode; a second electrode; and disposed between the first and second electrodes: (a) a photoactive layer comprising: (i) a charge transporting material, which is an electron transporting material; (ii) a layer comprising said porous dielectric scaffold material and (iii) a semiconductor, which semiconductor is a perovskite; and (b) a compact layer comprising an-type semiconductor. Also, the process described herein can be used to produce optoelectronic devices comprising: a first electrode; a second electrode; and disposed between the first and second electrodes: a photoactive layer comprising: (i) a layer comprising said porous dielectric scaffold material and (ii) a semiconductor having a band gap of less than or equal to 3.0 eV, which semiconductor is any suitable n-type semiconductor, any suitable p-type semiconductor or any suitable intrinsic semiconductor, or, for instance, optoelectronic devices comprising a first electrode; a second electrode; and disposed between the first and second electrodes: (a) a photoactive layer comprising: (i) a charge transporting material, which is an hole transporting material; (ii) a layer comprising said porous dielectric scaffold material and (iii)

a semiconductor having a band gap of less than or equal to 3.0 eV, which semiconductor is any suitable n-type semiconductor; and (b) a compact layer comprising an n-type semiconductor, or, for instance, optoelectronic devices comprising a first electrode; a second electrode; and disposed between the first and second electrodes: (a) a photoactive layer comprising: (i) a charge transporting material, which is an electron transporting material; (ii) a layer comprising said porous dielectric scaffold material and (iii) a semiconductor having a band gap of less than or equal to 3.0 eV, which semiconductor is any suitable p-type semiconductor; and (b) a compact layer comprising a p-type semiconductor.

The process for producing an optoelectronic device of the invention, wherein the optoelectronic device comprises:
  a first electrode;
  a second electrode; and disposed between the first and second electrodes:
  (a) said photoactive layer; and
  (b) a compact layer comprising a metal oxide.
is usually a process comprising:
  (i) providing a first electrode;
  (ii) depositing said photoactive layer;
  (iii) depositing said compact layer; and
  (iv) providing a second electrode.

The first and second electrodes are an anode and a cathode, one or both of which is transparent to allow the ingress of light. The choice of the first and second electrodes of the optoelectronic devices of the present invention may depend on the structure type. Typically, the n-type layer is deposited onto a tin oxide, more typically onto a fluorine-doped tin oxide (FTO) anode, which is usually a transparent or semi-transparent material. Thus, the first electrode is usually transparent or semi-transparent and typically comprises FTO. Usually, the thickness of the first electrode is from 200 nm to 600 nm, more usually, from 300 to 500 nm. For example the thickness may be 400 nm. Typically, FTO is coated onto a glass sheet. Often, the TFO coated glass sheets are etched with zinc powder and an acid to produce the required electrode pattern. Usually the acid is HCl. Often the concentration of the HCl is about 2 molar. Typically, the sheets are cleaned and then usually treated under oxygen plasma to remove any organic residues. Usually, the treatment under oxygen plasma is for less than or equal to 1 hour, typically about 5 minutes.

Usually, the second electrode comprises a high work function metal, for instance gold, silver, nickel, palladium or platinum, and typically silver. Usually, the thickness of the second electrode is from 50 nm to 250 nm, more usually from 100 nm to 200 nm. For example, the thickness of the second electrode may be 150 nm.

Usually, the compact layer of an semiconductor comprises an oxide of titanium, tin, zinc, gallium, niobium, tantalum, tungsten, indium, neodymium, palladium or cadmium, or mixtures thereof, or a sulphide of zinc or cadmium. Typically, the compact layer of a semiconductor comprises $TiO_2$. Often, the compact layer is deposited on the first electrode. The process for producing the photovoltaic device thus usually comprise a step of depositing a compact layer of an n-type semiconductor.

The step of depositing a compact layer of a semiconductor may, for instance, comprise depositing the compact layer of a semiconductor by aerosol spray pyrolysis deposition. Typically, the aerosol spray pyrolysis deposition comprises deposition of a solution comprising titanium diisopropoxide bis(acetylacetonate), usually at a temperature of from 200 to 300° C., often at a temperature of about 250° C. Usually the solution comprises titanium diisopropoxide bis(acetylacetonate) and ethanol, typically in a ratio of from 1:5 to 1:20, more typically in a ratio of about 1:10.

Often, the step of depositing a compact layer of a semiconductor is a step of depositing a compact layer of a semiconductor of thickness from 50 nm to 200 nm, typically a thickness of about 100 nm.

The photoactive layer usually comprises: (a) said porous dielectric scaffold material; (b) said semiconductor; and (c) said charge transporting material. Typically, the step of depositing the photoactive layer comprises: (i) depositing the porous dielectric scaffold material; (ii) depositing the semiconductor; and (iii) depositing the charge transporting material. More typically, step of depositing the photoactive layer comprises: (i) depositing the porous dielectric scaffold material; then (ii) depositing the semiconductor; and then (iii) depositing the charge transporting material.

Mainly, the porous dielectric scaffold material is deposited on to the compact layer. Usually, the porous dielectric scaffold material is deposited on to the compact layer using a method selected from screen printing, doctor blade coating and spin-coating. As the skilled person will appreciate: (i) the method of screen printing usually requires the deposition to occur through a suitable mesh; (ii) if doctor blade coating is used, a suitable doctor blade height is usually required; and (iii) when spin-coating is used, a suitable spin speed is needed.

The porous dielectric scaffold material is often deposited with an thickness of between 100 to 1000 nm, typically 200 to 500 nm, and more typically about 300 nm.

After the porous dielectric scaffold material has been deposited, the material is usually heated to from 400 to 500° C., typically to about 450° C. Often, the material is held at this temperature for from 15 to 45 minutes, usually for about 30 minutes. This dwelling step is usually used in order to degrade and remove material from within the pores of the scaffold material. For instance, the dwelling step may be used to remove cellulose from the pores.

In the step of depositing the perovskite, said perovskite is a perovskite as described herein. The step of depositing the perovskite usually comprises depositing the perovskite on the porous dielectric scaffold material. Often, the step of depositing the perovskite comprises spin coating said perovskite. The spin coating usually occurs in air, typically at a speed of from 1000 to 2000 rpm, more typically at a speed of about 1500 rpm and/or often for a period of from 15 to 60 seconds, usually for about 30 seconds. The perovskite is usually placed in a solvent prior to the spin coating. Usually the solvent is DMF (dimethylformamide) and typically the volume of solution used id from 1 to 200 µl, more typically from 20 to 100 µl. The concentration of the solution is often of from 1 to 50 vol % perovskite, usually from 5 to 40 vol %. The solution may be, for instance, dispensed onto the porous dielectric scaffold material prior to said spin coating and left for a period of about 5 to 50 second, typically for about 20 seconds. After spin coating the perovskite is typically placed at a temperature of from 75 to 125° C., more typically a temperature of about 100° C. The perovskite is then usually left at this temperature for a period of at least 30 minutes, more usually a period of from 30 to 60 minutes. Often, the perovskite is left at this temperature for a period of about 45 minutes. Typically, the perovskite will change colour, for example from light yellow to dark brown. The colour change may be used to indicate the formation of the perovskite layer. Usually, at least some of the perovskite, once deposited, will be in the pores of the porous dielectric scaffold material.

Usually, the perovskite does not decompose when exposed to oxygen or moisture for a period of time equal to or greater than 10 minutes. Typically, the perovskite does not decompose when exposed to oxygen or moisture for a period of time equal to or greater than 24 hours.

Often the step of depositing the perovskite, may comprise depositing said perovskite and a single-anion perovskite, wherein said single anion perovskite comprises a first cation, a second cation and an anion selected from halide anions and chalcogenide anions; wherein the first and second cations are as herein defined for said mixed-anion perovskite. For instance, the photoactive layer may comprise: $CH_3NH_3PbCl_2$ and $CH_3NH_3PbI_3$; $CH_3NH_3PbCl_2$ and $CH_3NH_3PbBr_3$; $CH_3NH_3PbBrCl_2$ and $CH_3NH_3PbI_3$; or $CH_3NH_3PbBrCl_2$ and $CH_3NH_3PbBr_3$.

Alternatively, the step of depositing the perovskite, may comprise depositing more than one perovskite, wherein each perovskite is a mixed-anion perovskite, and wherein said mixed-anion perovskite is as herein defined. For instance, the photoactive layer may comprise two or three said perovskites. The photoactive layer may comprise two perovskites wherein both perovskites are mixed-anion perovskites. For instance, the photoactive layer may comprise: $CH_3NH_3PbICl_2$ and $CH_3NH_3PbIBr_2$; $CH_3NH_3PbICl_2$ and $CH_3NH_3PbBrI_2$; $CH_3NH_3PbBrCl_2$ and $CH_3NH_3PbIBr_2$; or $CH_3NH_3PbBrCl_2$ and $CH_3NH_3PbIBr_2$.

As a further alternative, the step of depositing a sensitizer comprising said perovskite, may comprise depositing at least one perovskite, for instance, at least one perovskite having the formula $(H_2N=CH-NH_2)PbI_{3z}Br_{3(1-z)}$.

The step of depositing a charge transporting material usually comprises depositing a hole transporting material that is a solid state hole transporting material or a liquid electrolyte. The charge transporting material in the optoelectronic device of the invention may be any suitable p-type or hole-transporting, semiconducting material. The charge transporting material may comprise spiro-OMeTAD (2,2',7,7'-tetrakis-(N,N-di-p-methoxyphenylamine)9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-bldithiophene-2,6-diyl]]), PVK (poly(N-vinylcarbazole)), HTM-TFSI (1-hexyl-3-methylimidazolium bis(trifluoromethylsulfonyl)imide), Li-TFSI (lithium bis(trifluoromethanesulfonyl)imide) or tBP (tert-butylpyridine). For instance, the charge transporting material may be HTM-TFSI or spiro-OMeTAD. Preferable, the charge transporting material is spiro-OMeTAD. Alternatively, the charge transporting material may be an inorganic charge transporter, for example the charge transporting material selected from CuNSC, $CuI_2$ and $CuO_2$.

Prior to the step of depositing a charge transporting material, the charge transporting material is often dissolved in a solvent, typically chlorobenzene. Usually the concentration of cholorbenzene is from 150 to 225 mg/ml, more usually the concentration is about 180 mg/ml. Typically, the hole transporting material is dissolved in the solvent at a temperature of from 75 to 125° C., more typically at a temperature of about 100° C. Usually the charge transporting material is dissolved for a period of from 25 minutes to 60 minutes, more usually a period of about 30 minutes. An additive may be added to the charge transporting material. The additive may be, for instance, tBP, Li-TFSi, an ionic liquid or an ionic liquid with a mixed halide(s).

Usually, the charge transporting material is spiro-OMeTAD. Often, tBP is also added to the charge transporting material prior to the step of depositing a charge transporting material. For instance, tBP may be added in a volume to mass ratio of from 1:20 to 1:30 µl/mg tBP:spiro-OMeTAD. Typically, tBP may be added in a volume to mass ratio of about 1:26 µl/mg tBP:spiro-OMeTAD. Additionally or alternatively, Li-TFSi may be added to the charge transporting material prior to the step of depositing a charge transporting material. For instance, Li-TFSi may be added at a ratio of from 1:5 to 1:20 µl/mg Li-TFSi:spiro-OMeTAD. Usually Li-TFSi may be added at a ratio of about 1:12 µl/mg Li-TFSi:spiro-OMeTAD.

The step of depositing a charge transporting material often comprises spin coating a solution comprising the charge transporting material onto the layer comprising said perovskite. Usually, prior to spin coating, a small quantity of the solution comprising the charge transporting material is deposited onto the layer comprising said perovskite. The small quantity is usually from 5 to 100 µl, more usually from 20 to 70 µl. The solution comprising the charge transporting material is typically left for a period of at least 5 seconds, more typically a period of from 5 to 60 seconds, prior to spin coating. For instance, the solution comprising the charge transporting material be left for a period of about 20 seconds prior to spin coating. The spin coating of the charge transporting material is usually carried out at from 500 to 3000 rpm, typically at about 1500 rpm. The spin coating is often carried our for from 10 to 40 seconds in air, more often for about 25 seconds.

The step of producing a second electrode usually comprises a step of depositing the second electrode on to the charge transporting material. Typically, the second electrode is an electrode comprising silver. Often, the step of producing a second electrode comprises placing a film comprising the hole transporting material in a thermal evaporator. Usually, the step of producing a second electrode comprises deposition of the second electrode through a shadow mask under a high vacuum. Typically, the vacuum is about $10^{-6}$ mBar. The second electrode may, for example, be an electrode of a thickness from 100 to 200 nm. Typically, the second electrode is an electrode of a thickness from 150 nm.

Typically, the distance between the second electrode and the porous dielectric scaffold material is from is from 50 nm to 400 nm, more typically from 150 nm to 250 nm. Often, the distance between the second electrode and the porous dielectric scaffold material is around 200 nm.

Often, the process for producing an the optoelectronic device of the invention is a process for producing a photovoltaic device, wherein the AM1.5G 100 mWcm$^{-2}$ power conversion efficiency of the photovoltaic device is equal to or greater than 7.3%. Typically, the AM1.5G 100 mWcm$^{-2}$ power conversion efficiency is equal to or greater than 11.5%.

Typically, the process for producing an the optoelectronic device of the invention is a process for producing a photovoltaic device, wherein the photocurrent of the photovoltaic device is equal to or greater than 15 mAcm$^{-2}$. More typically, the photocurrent is equal to or greater than 20 mAcm$^{-2}$.

The invention is further described in the Examples which follow.

EXAMPLES

Experimental Description

1. Synthesis of Organometal Halide Perovskites:
1.1. Preparation of Methylammonium Iodide Precursor Methylamine ($CH_3NH_2$) solution 33 wt. % in absolute ethanol (Sigma-Aldrich) was reacted with hydriodic acid 57 wt. % in water (Sigma-Aldrich) at 1:1 molar ratio under nitrogen atmosphere in anhydrous ethanol 200 proof (Sigma-Aldrich). Typical quantities were 24 ml methylamine, 10 ml hydroiodic acid and 100 ml ethanol. Crystallisation of methylammonium iodide ($CHNH_3I$) was achieved using a rotary evaporator a white coloured precipitate was formed indicating successful crystallisation.

The methylamine can be substituted for other amines, such as ethylamine, n-butylamine, tert-butylamine, octylamine etc. in order to alter the subsequent perovskite properties. In addition, the hydriodic acid can be substituted with other acids to form different perovskites, such as hydrochloric acid.

1.2. Preparation of Methylammonium Iodide Lead (II) Chloride ($CH_3NH_3PbCl_2I$) Perovskite Solution Methylammonium iodide ($CHNH_3I$) precipitate and lead (II) chloride (Sigma-Aldrich) was dissolved in dimethylformamide ($C_3H_7NO$) (Sigma-Aldrich) at 1:1 molar ratio at 20 vol. %.

For making different perovskites, different precursors, such as different lead(II)halides or indeed different metals halides all together, such as Sn iodide.

1.3. Generalising the Organometal Halide Perovskite Structure

The perovskite structure is defined as $ABX_3$, where A=cation (0,0,0)-ammonium ion, B=cation (½, ½, ½)-divalent metal ion, and X=anion (½, ½, 0)-halogen ion. The table below indicates possible mixed-anion peroskites.

Fixing: [A]=Methylammonium, [B]=Pb, varying [X]=any halogen

| Perovskite | Methylammonium-[X] | Lead halide ($Pb[X]_2$) |
|---|---|---|
| $CH_3NH_3PbBr_3$ | $CH_3NH_3Br$ | $PbBr_2$ |
| $CH_3NH_3PbBrI_2$ | $CH_3NH_3Br$ | $PbI_2$ |
| $CH_3NH_3PbBrCl_2$ | $CH_3NH_3Br$ | $PbCl_2$ |
| $CH_3NH_3PbIBr_2$ | $CH_3NH_3I$ | $PbBr_2$ |
| $CH_3NH_3PbI_3$ | $CH_3NH_3I$ | $PbI_2$ |
| $CH_3NH_3PbICl_2$ | $CH_3NH_3I$ | $PbCl_2$ |
| $CH_3NH_3PbClBr_2$ | $CH_3NH_3Cl$ | $PbBr_2$ |
| $CH_3NH_3PbI_2Cl$ | $CH_3NH_3Cl$ | $PbI_2$ |
| $CH_3NH_3PbCl_3$ | $CH_3NH_3Cl$ | $PbCl_2$ |

Fixing: [A]=Methylammonium, [B]=Sn, varying [X]=any halogen

| Perovskite | Methylammonium-[X] | Tin halide ($Sn[X]_2$) |
|---|---|---|
| $CH_3NH_3SnBr_3$ | $CH_3NH_3Br$ | $SnBr_2$ |
| $CH_3NH_3SnBrI_2$ | $CH_3NH_3Br$ | $SnI_2$ |
| $CH_3NH_3SnBrCl_2$ | $CH_3NH_3Br$ | $SnCl_2$ |
| $CH_3NH_3SnF_2Br$ | $CH_3NH_3Br$ | $SnF_2$ |
| $CH_3NH_3SnIBr_2$ | $CH_3NH_3I$ | $SnBr_2$ |
| $CH_3NH_3SnI_3$ | $CH_3NH_3I$ | $SnI_2$ |
| $CH_3NH_3ISnICl_2$ | $CH_3NH_3I$ | $SnCl_2$ |
| $CH_3NH_3SnF_2I$ | $CH_3NH_3I$ | $SnF_2$ |
| $CH_3NH_3SnClBr_2$ | $CH_3NH_3Cl$ | $SnBr_2$ |
| $CH_3NH_3SnI_2Cl$ | $CH_3NH_3Cl$ | $SnI_2$ |
| $CH_3NH_3SnCl_3$ | $CH_3NH_3Cl$ | $SnCl_2$ |
| $CH_3NH_3SnF_2Cl$ | $CH_3NH_3Cl$ | $SnF_2$ |

[A] may be varied using different organic elements, for example as in Liang et al., U.S. Pat. No. 5,882,548, (1999) and Mitzi et al., U.S. Pat. No. 6,429,318, (2002).

1.4 Blended Perovskites

| Perovksite 1 | Perovskite 2 | Outcome |
|---|---|---|
| $CH_3NH_3PbICl_2$ | $CH_3NH_3PbIBr_2$ | Red |
| $CH_3NH_3PbICl_2$ | $CH_3NH_3PbBrI_2$ | Yellow |
| $CH_3NH_3PbICl_2$ | $CH_3NH_3PbI_3$ | Dark brown |
| $CH_3NH_3PbICl_2$ | $CH_3NH_3PbBr_3$ | Yellow |
| $CH_3NH_3PbBrCl_2$ | $CH_3NH_3PbIBr_2$ | Yellow |
| $CH_3NH_3PbBrCl_2$ | $CH_3NH_3PbBrI_2$ | Yellow |
| $CH_3NH_3PbBrCl_2$ | $CH_3NH_3PbI_3$ | Brown |
| $CH_3NH_3PbBrCl_2$ | $CH_3NH_3PbBr_3$ | Yellow |

1.5 Stability of Mixed-Halide Perovskites Against Single-Halide Perovskites

The inventors have found that photovoltaic devices comprising a mixed-halide perovskite do absorb light and operate as solar cells. When fabricating films from the single halide perovskites in ambient conditions. The perovskites form, but quickly bleach in colour. This bleaching is likely to be due to the adsorption of water on to the perovskite surface, which is known to bleach the materials. When the complete solar cells are constructed in ambient conditions using these single hailde perovskites, they perform very poorly with full sun light power conversion efficiencies of under 1%. In contrast, the mixed halide perovskites can be processed in air, and show negligible colour bleaching during the device fabrication process. The complete solar cell incorporating the mixed halide perovskites perform exceptionally well in ambient conditions, with full sun power conversion efficiency of over 10%.

1.6 Preparation of Perovskites Comprising a Formamidinium Cation

Formamidinium iodide (FOI) and formamidinium bromide (FOBr) were synthesised by reacting a 0.5M molar solution of formamidinium acetate in ethanol with a 3× molar excess of hydroiodic acid (for FOI) or hydrobromic acid (for FOBr). The acid was added dropwise whilst stirring at room temperature, then left stirring for another 10 minutes. Upon drying at 100° C., a yellow-white powder is formed, which is then dried overnight in a vacuum oven before use. To form $FOPbI_3$ and $FOPbBr_3$ precursor solutions, FOI and $PbI_2$ or FOBr and $PbBr_2$ were dissolved in anhydrous N,N-dimethylformamide in a 1:1 molar ratio, 0.88 millimoles of each per ml, to give 0.88M perovskite solutions. To form the $FOPbI_{3z}Br_{3(1-z)}$ perovskite precursors, mixtures were made of the $FOPbI_3$ and $FOPbBr_3$ 0.88 M solutions in the required ratios, where z ranges from 0 to 1.

Films for characterisation or device fabrication were spin-coated in a nitrogen-filled glovebox, and annealed at 170° C. for 25 minutes in the nitrogen atmosphere.

2. Insulating Mesoporous Paste:

2.1: $Al_2O_3$ Paste:

Aluminum oxide dispersion was purchased from Sigma-Aldrich (10% wt in water) and was washed in the following manner: it was centrifuged at 7500 rpm for 6 h, and redispersed in Absolute Ethanol (Fisher Chemicals) with an ultrasonic probe; which was operated for a total sonication time of 5 minutes, cycling 2 seconds on, 2 seconds off. This process was repeated 3 times.

For every 10 g of the original dispersion (1 g total $Al_2O_3$) the following was added: 3.33 g of α-terpineol and 5 g of a 50:50 mix of ethyl-cellulose 10 cP and 46 cP purchased from Sigma Aldrich in ethanol, 10% by weight. After the addition of each component, the mix was stirred for 2 minutes and sonicated with the ultrasonic probe for 1 minute of sonication, using a 2 seconds on 2 seconds off cycle. Finally, the resulting mixture was introduced in a Rotavapor to remove excess ethanol and achieve the required thickness when doctor blading, spin-coating or screen printing.

2.2 SiO$_2$ Paste:

SiO$_2$ particles were synthesized utilizing the following procedure (see G. H. Bogush, M. A. Tracy, C. F. Zukoski, Journal of Non-Crystalline Solids 1988, 104, 95.):

2.52 ml of deionized water were added into 59.2 ml of absolute ethanol (Fisher Chemicals). This mixture was then stirred violently for the sequential addition of the following reactives: 0.47 ml of Ammonium Hydroxide 28% in water (Sigma Aldrich) and 7.81 ml of Tetraethyl Orthosilicate (TEOS) 98% (Sigma Aldrich). The mixture was then stirred for 18 hours to allow the reaction to complete.

The silica dispersion was then washed following the same washing procedure as outlined previously for the Al$_2$O$_3$ paste (Example 2.1).

The amount of silica was then calculated assuming that all the TEOS reacts. In our case, 2.1 g of SiO$_2$ was the result of the calculation. For every 1 g of calculated SiO$_2$ the following were added: 5.38 g of anhydrous terpineol (Sigma Aldrich) and 8 g of a 50:50 mix of ethyl-cellulose 5-15 mPa·s and 30-70 mPa·s purchased from Sigma Aldrich in ethanol, 10% by weight. After the addition of each component, the mix was stirred for 2 minutes and sonicated with the ultrasonic probe for 1 minute of sonication, using a 2 seconds on 2 seconds off cycle.

3. Cleaning and Etching of the Electrodes:

The perovskite solar cells used and presented in these examples were fabricated as follows: Fluorine doped tin oxide (F:SnO$_2$/FTO) coated glass sheets (TEC 15, 15 Ω/square, Pilkington USA) were etched with zinc powder and HCl (2 M) to give the required electrode pattern. The sheets were subsequently cleaned with soap (2% Hellemanex in water), distilled water, acetone, ethanol and finally treated under oxygen plasma for 5 minutes to remove any organic residues.

4. Deposition of the Compact TiO$_2$ Layer:

The patterned FTO sheets were then coated with a compact layer of TiO$_2$ (100 nm) by aerosol spray pyrolysis deposition of a titanium diisopropoxide bis(acetylacetonate) ethanol solution (1:10 titanium diisopropoxide bis(acetylacetonate) to ethanol volume ratio) at 250° C. using air as the carrier gas (see Kavan, L. and Gratzel, M., Highly efficient semiconducting TiO$_2$ photoelectrodes prepared by aerosol pyrolysis, Electrochim. Acta 40, 643 (1995); Snaith, H. J. and Gratzel, M., The Role of a "Schottky Barrier" at an Electron-Collection Electrode in Solid-State Dye-Sensitized Solar Cells. Adv. Mater. 18, 1910 (2006)).

5. Deposition of the Mesoporous Insulating Metal Oxide Scaffold:

The insulating metal oxide paste (e.g. the Al$_2$O$_3$ paste) was applied on top of the compact metal oxide layer (typically compact TiO$_2$), via screen printing, doctor blade coating or spin-coating, through a suitable mesh, doctor blade height or spin-speed to create a film with an average thickness of between 100 to 1000 nm, preferably 200 to 500 nm, and most preferably 300 nm. The films were subsequently heated to 450 degrees Celsius and held there for 30 minutes in order to degrade and remove the cellulose, and the cooled ready for subsequent perovskite solution deposition.

6. Deposition of the Perovskite Precursor Solution and Formation of the Mesoporous Perovskite Semiconducting Electrode A small volume, between 20 to 100 μl of the solution of the perovskite precursor solution in DMF (methylammonium iodide lead (II) chloride (CH$_3$NH$_3$PbCl$_2$I)) at a volume concentration of between 5 to 40 vol % was dispensed onto each preprepared mesoporous electrode film and left for 20 s before spin-coating at 1500 rpm for 30 s in air. The coated films were then placed on a hot plate set at 100 degrees Celsius and left for 45 minutes at this temperature in air, prior to cooling. During the drying procedure at 100 degrees, the coated electrode changed colour from light yellow to dark brown, indicating the formation of the desired perovskite film with the semiconducting properties.

7. Hole-Transporter Deposition and Device Assembly

The hole transporting material used was spiro-OMeTAD (Lumtec, Taiwan), which was dissolved in chlorobenzene at a typical concentration of 180 mg/ml. After fully dissolving the spiro-OMeTAD at 100° C. for 30 minutes the solution was cooled and tertbutyl pyridine (tBP) was added directly to the solution with a volume to mass ratio of 1:26 μl/mg tBP:spiro-MeOTAD. Lithium bis(trifluoromethylsulfonyl) amine salt (Li-TFSI) ionic dopant was pre-dissolved in acetonitrile at 170 mg/ml, then added to the hole-transporter solution at 1:12 μl/mg of Li-TFSI solution:spiro-MeOTAD. A small quantity (20 to 70 μl) of the spiro-OMeTAD solution was dispensed onto each perovskite coated mesoporous film and left for 20 s before spin-coating at 1500 rpm for 30 s in air. The films were then placed in a thermal evaporator where 200 nm thick silver electrodes were deposited through a shadow mask under high vacuum ($10^{-6}$ mBar).

8. Fabrication of Devices Comprising FOPbI$_{3z}$Br$_{3(1-z)}$

Devices were fabricated on fluorine-doped tin oxide coated glass substrates. These were cleaned sequentially in hallmanex, acetone, propan-2-ol and oxygen plasma. A compact layer of TiO$_2$ was deposited by spin-coating a mildly acidic solution of titanium isopropoxide in ethanol. This was dried at 150° C. for 10 minutes. The TiO$_2$ mesoporous layer was deposited by spin-coating at 2000 rpm a 1:7 dilution by weight of Dyesol 18NR-T paste in ethanol, forming a layer of ~150 nm. The layers were then sintered in air at 500° C. for 30 minutes. Upon cooling, perovskite precursors were spin-coated at 2000 rpm in a nitrogen-filled glovebox, followed by annealing at 170° C. for 25 minutes in the nitrogen atmosphere. The hole-transport layer was deposited by spin-coating an 8 wt. % 2,2',7,7'-tetrakis-(N, N-di-pmethoxyphenylamine)9,9'-spirobifluorene (spiro-OMeTAD) in chlorobenzene solution with added tert-butylpyridine (tBP) and lithium bis(trifluoromethanesulfonyl) imide (Li-TFSI). Devices were completed by evaporation of 60 nm Au contacts.

9. Antimony Sulphide Sensitized and Meso-Superstructured Solar Cells

Devices comprising antimony sulphide were also fabricated. The device fabrication was the same as for the standard dye sensitized and perovskite meso-superstructured cells discussed above, except for the thickness of the mesoporous layer. The mesoporous layer was (i) ~1.5 microns for TiO$_2$ and (ii) ~700 nm for Al$_2$O$_3$. After sintering the mesoporous TiO$_2$ or Al$_2$O$_3$ coated substrates (FTO/compact TiO$_2$/mesoporous oxide) the substrates were put into a cold chemical bath and kept at 10 deg.C. for 3 hours. The antimony sulphide was grown on the internal surface of the meosporous films within the chemical bath. After removing from the chemical bath, the substrates were rinsed in deionized (DI) water and annealed at 300 deg° C. in inert atmosphere (nitrogen glove box) for 30 minutes, then allowed to cool in air. The hole transporter (P3HT, 15 mg/ml in chlorobenzene) was dispensed on top of the antimony sulphide coated substrates and spin-coated at 1000 rpm for 45 seconds to form a dry film. Electrodes were then deposited under high vacuum via thermal evaporation to form a gold/silver 10/150 nm cathode. The resulting cells had the structure: FTO/compact TiO$_2$/mesoporous oxide (TiO$_2$ or Al$_2$O$_3$) coated with antimony sulphide/P3HT/gold/silver. The cells were then tested after leaving in air overnight.

The chemical bath deposition was carried out as follows: 0.625 mg SbCl$_3$ was dissolved in 2.5 ml acetone. 25 ml Na$_2$SO$_3$ (1M) was then slowly added, with stirring. The volume was then made up to 100 ml by adding cold DI water, and a few drops of HCl were added, until the resulting pH was 3.0.

Figure 13:
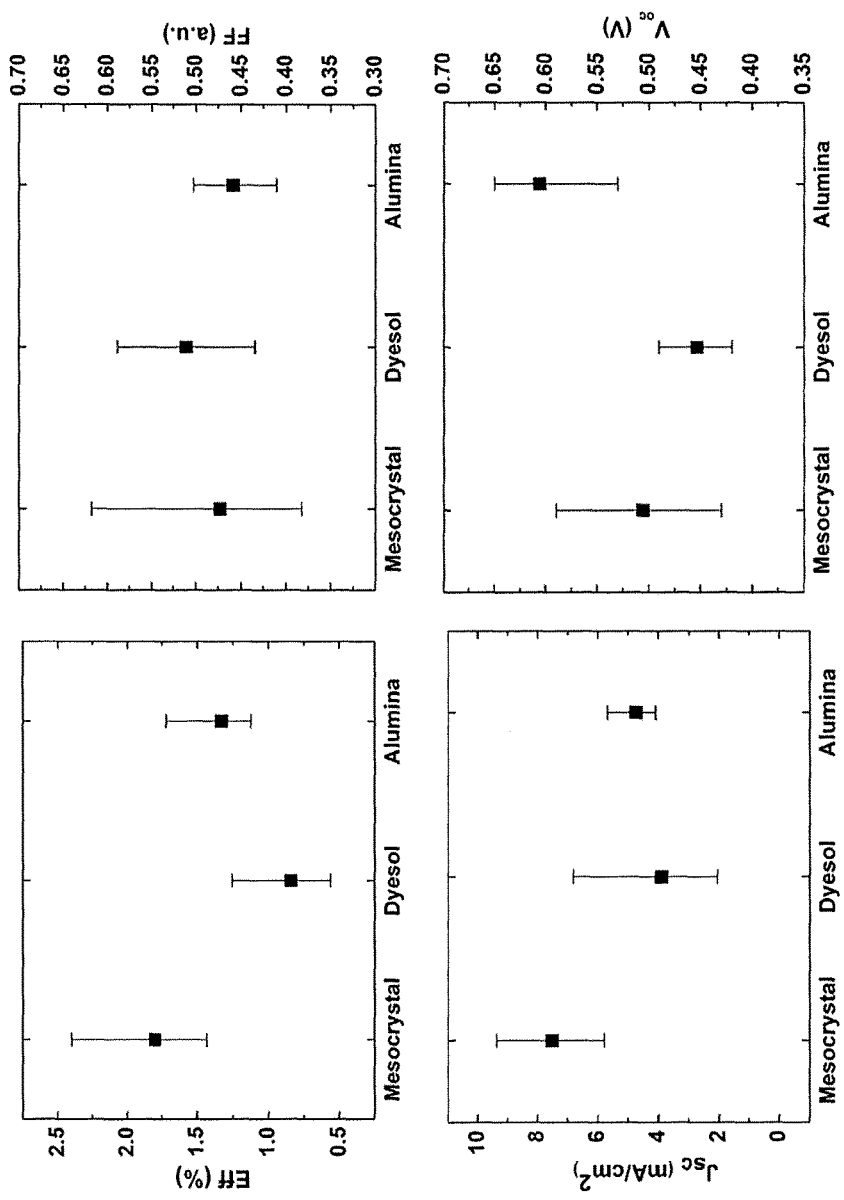
FIG. 13 shows plots of device parameters of merit for (i) a meso-superstructured solar cell device (mesocrystal or MSSC), (ii) a $TiO_2$ nanoparticle device and (iii) an alumina device.
Figure 14:
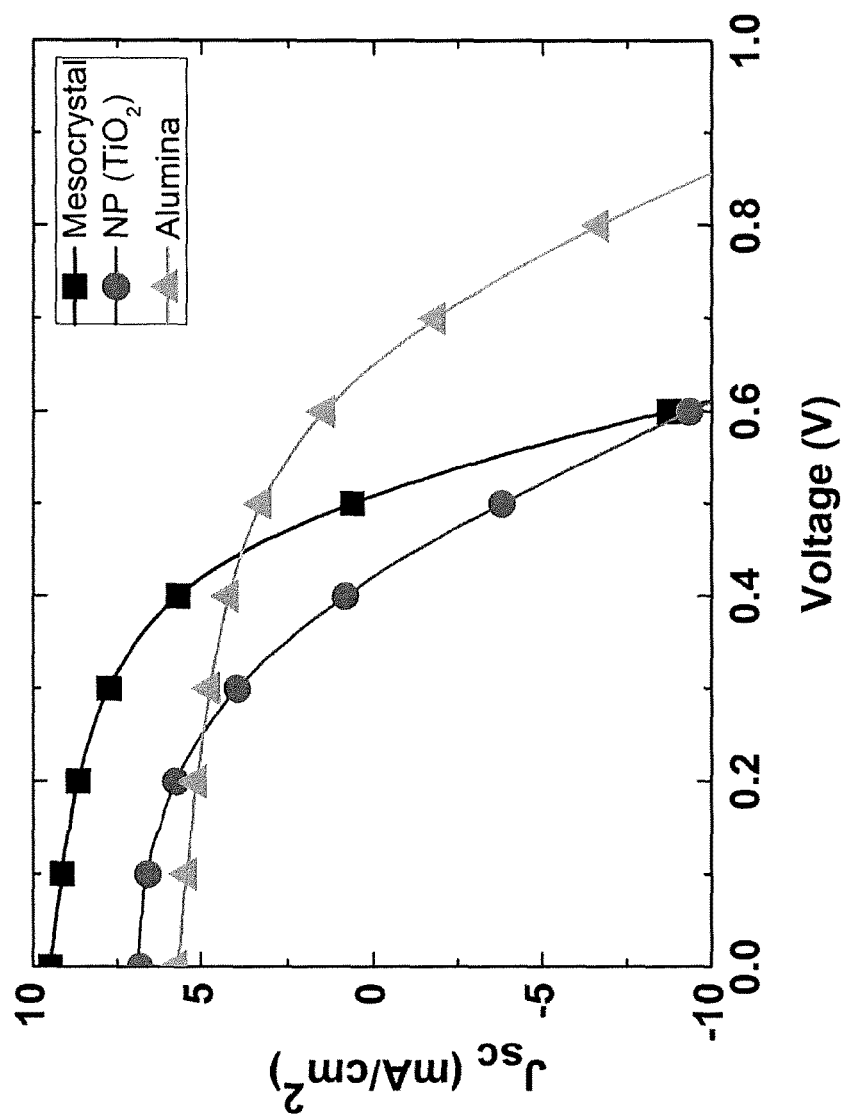
FIG. 14 shows the characteristic current voltage of the three device types shown in FIG. 13.

The results are shown in FIGS. 13 and 14. Data for three devices are shown: (i) a "MSSCs" or meso-superstructured solar cell device, in which the mesoporous oxide comprises a TiO$_2$ mesoporous single crystal electrode where the metal oxide paste was made using the following: 165 mg TiO$_2$ (assumed); 28 uL acetic acid; 72 uL water; 550 mg terpineol; and 825 mg cellulose (10% in EtOH); (ii) a "NP" or dyesol device, in which the mesoporous oxide comprises TiO$_2$ nanoparticles, the standard dyesol paste; and (iii) an alumina device, in which the mesoporous oxide comprises alumina as the porous dielectric scaffold material.

Experimental Results

Figure 2:
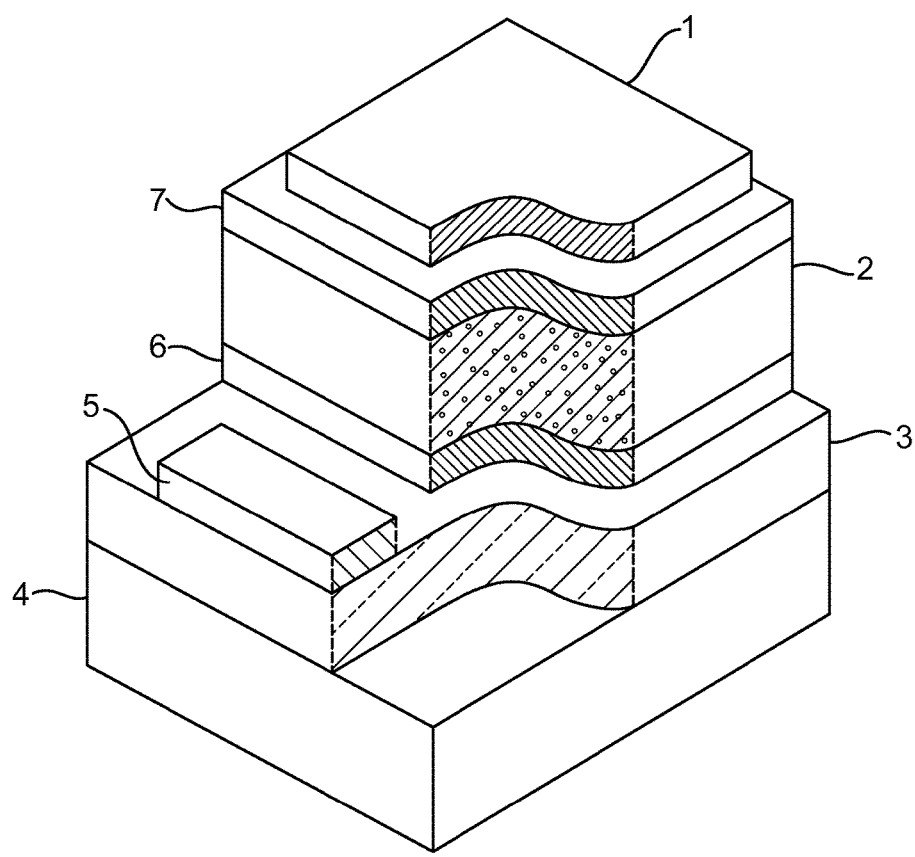
FIG. 2 is an isometric cross-section drawing of a generic meso-superstructured solar cell: (1) metal cathode, (2) hole-conducting material, mesoporous insulating metal oxide with absorber and hole-conducting material (see FIG. 4 for clarification), (3) transparent conducting metal oxide (anode), (4) transparent substrate, (5) metal anode, (6) compact n-type metal oxide.
Figure 3:
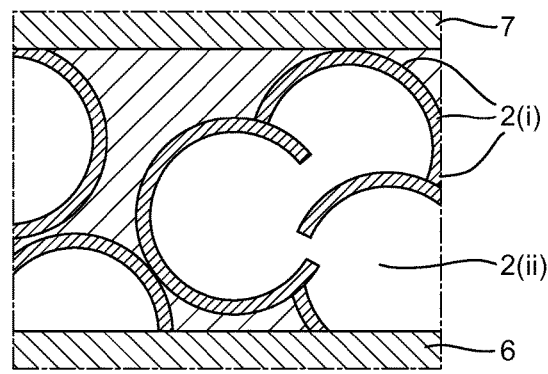
FIG. 3 is a schematic showing cross-section of the 'active layer' of a generic nanostructured solar cell: (2(i)) light sensitive absorber, (2(ii)) insulating metal oxide, metal cathode, (6) compact n-type metal oxide, (7) hole-conducting material.
Figure 4:
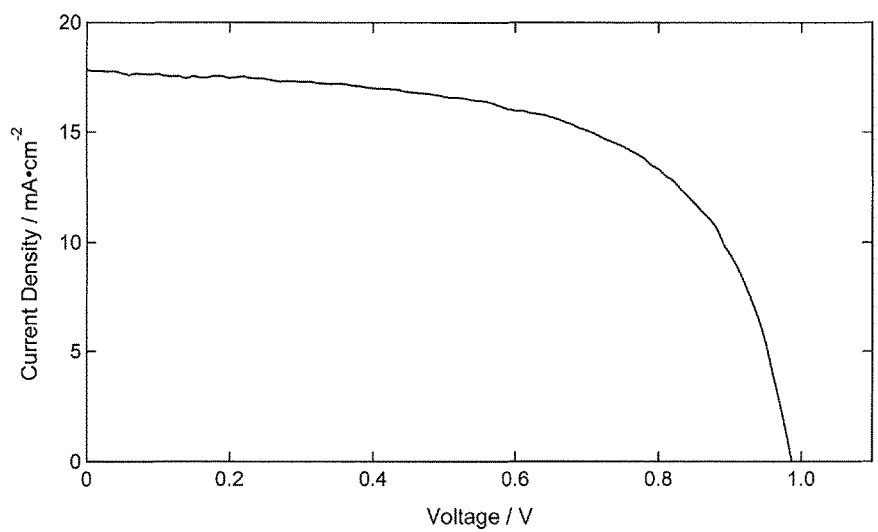
FIG. 4 shows the current-voltage characteristics under simulated AM1.5G illumination of a device assembled in mesoporous absorber structure with hole-conductor: F:SnO$_2$/Compact TiO$_2$/Mesoporous Al$_2$O$_3$/CH$_3$NH$_3$PbCl$_2$I/Spiro OMeTAD/Ag. On the graph the voltage in volts is plotted on the x-axis and the current density in mAcm$^{-2}$ is plotted on the y-axis.

The motivation of the present inventors has been to realize a solution processable solar cell which overcomes the inherent issues with organic absorbers and disordered metal oxides. They have followed a similar approach to ETA solar cells, thus capitalizing on the inorganic absorber, but entirely eliminated the mesoporous n-type metal oxide. They have employed mesoporous alumina as an "insulating scaffold" upon which an organometal halide perovskite is coated as the absorber and n-type component. This is contacted with the molecular hole-conductor, (2,2(7,7(-tetrakis-(N,N-dipmethoxyphenylamine)9,9(-spirobifluorene) (spiro-OMeTAD) (U. Bach et al., Nature 395, 583-585 (1998)) which completes the photoactive layer. The photoactive layer is sandwiched between a semi-transparent fluorine doped tin oxide (F:SnO$_2$/FTO) and metal electrode to complete the device. A schematic illustration of a cross section of a device is shown in FIG. 1, and sketches illustrating the different layers in the solar cell and components in the solar cell are shown in FIGS. 2 and 3. Upon photoexcitation, light is absorbed in the perovskite layer, generating charge carriers. Holes are transferred to the hole-transporter and carried out of the solar cell, while the electrons percolate through the perovskite film and are collected at the FTO electrode. The displacement of the holes to the hole-transporter, removes the "minority" carrier from the absorber and is key to enabling efficient operation. Record power conversion efficiencies of 10.9% are demonstrated under simulated AM1.5 full sun light, representing the most efficient solid-state hybrid solar cell reported to date. A current voltage curve for such a solar cell is shown in FIG. 4.

Absorber and Thin Film Characterisation

The perovskite structure provides a framework to embody organic and inorganic components into a neat molecular composite, herein lie possibilities to manipulate material properties governed by the atomic orbitals of the constituent elements. By experimenting with the interplay between organic-inorganic elements at the molecular scale and controlling the size-tunable crystal framework cell it is possible to create new and interesting materials using rudimentary wet chemical methods. Indeed, seminal work by Era and Mitzi champion the layered perovskite based on organometal halides as worthy rivals to more established materials, demonstrating excellent performance as light-emitting diodes (H. D. Megaw, Nature 155, 484-485 (1945); M. Era, T. Tsutsui, S. Saito, Appl. Phys. Lett. 67, 2436-2438 (1995)) and transistors with mobilities competitive comparable with amorphous silicon (C. R. Kagan, D. B. Mitzi, C. D. Dimitrakopoulos, Science 286, 945-947 (1999)).

Figure 5:
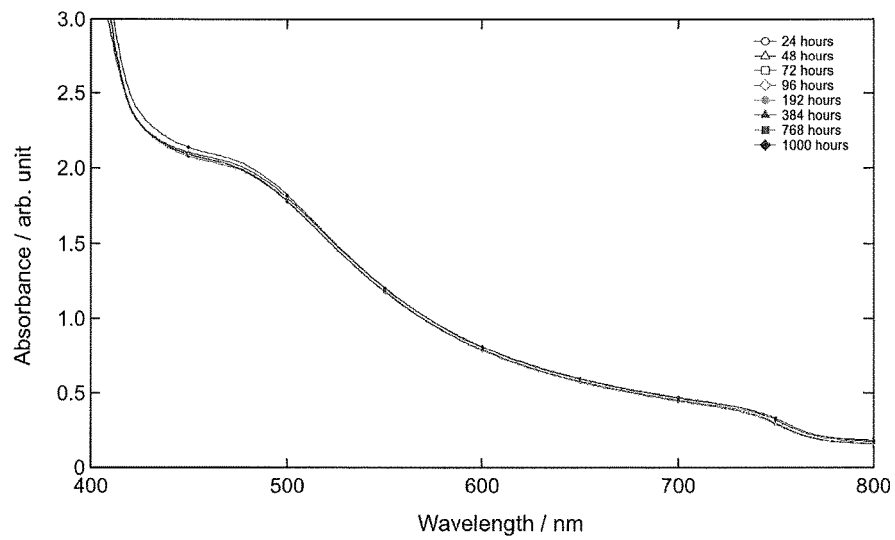
FIG. 5 shows the UV-Vis absorbance spectra for a device assembled in absorber-sensitised structure with hole-conductor: F:SnO$_2$/Compact TiO$_2$/mesoporous oxide/CH$_3$NH$_3$PbCl$_2$I/Spiro OMeTAD sealed using surlyn and epoxy with light soaking under simulated AM1.5G illumination over time. On the graph wavelength in nm is plotted on the x-axis and the absorbance in arbitrary units is plotted on the y-axis.

The specific perovskite the inventors introduce here is of mixed-halide form: methylammonium iodide lead (II) chloride, (CH$_3$NH$_3$PbCl$_2$I) which is processed from a precursor solution in N,N-Dimethylformamide as the solvent via spin-coating in ambient conditions. Unlike the single-halide lead perovskite absorbers previously reported in solar cells (A. Kojima, K. Teshima, Y. Shirai, T. Miyasaka, J. Am. Chem. Soc. 131, 6050-6051 (2009); J-H Im, C-R Lee, J-W Lee, S-W Park, N-G Park, Nanoscale 3, 4088-4093 (2011)), this iodide-chloride mixed-halide perovskite is remarkably stable and easily processable in air. In FIG. 5 the UV-Vis-NIR absorption spectra of the mixed halide perovskite in the solar cell composite demonstrates good light harvesting capabilities over the visible to near infrared spectrum. Also shown is the light absorption of the active layer of a complete solar cell sealed in a nitrogen atmosphere, during 1000 hours constant illumination under full sunlight. Negligible change in spectra is clearly illustrated by the inset, which shows the optical density of the film at 500 nm remaining around 1.8 throughout the entire measurement period (OD 1.8 corresponds to 98.4% attenuation).

Solar Cell Fabrication

Figure 9:
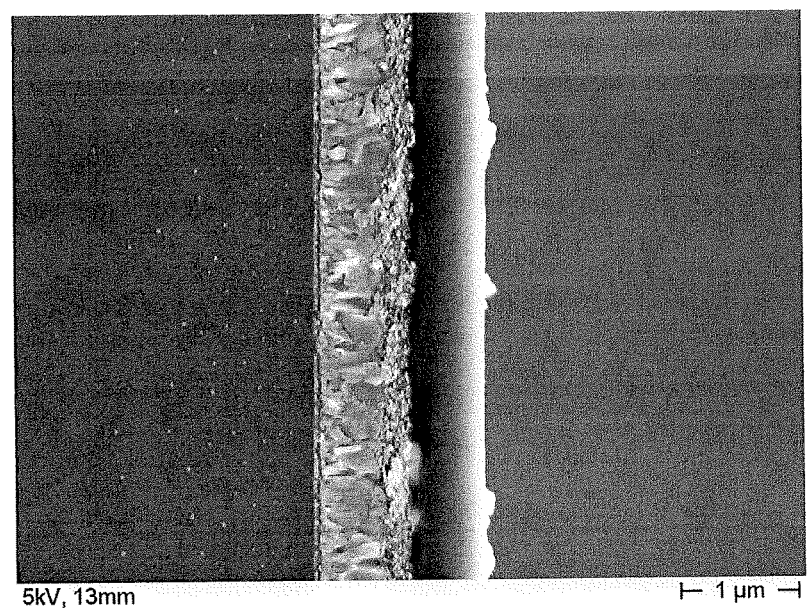
FIG. 9 shows a cross sectional SEM image of a complete photoactive layer; Glass-FTO-mesoporous Al2O3-K330-spiro-OMeTAD.

To construct the solar cells fluorine doped tin oxide (F:SnO$_2$/FTO) is coated with a compact layer of TiO$_2$ via spray-pyrolysis (L. Kavan, M. Gratzel, Electrochim. Acta 40, 643-652 (1995)), which assures selective collection of electrons at the anode. The film is then coated with a paste of alumina, Al$_2$O$_3$, nanoparticles and cellulose via screen printing, which is subsequently sintered at 500° C. to decompose and remove the cellulose, leaving a film of mesoporous Al$_2$O$_3$ with a porosity of approximately 70%. The perovskite precursor solution is coated within the porous alumina film via spin-coating. To elaborate upon this coating process, there has been extensive previous work investigating how solution-cast materials infiltrate into mesoporous oxides (H. J. Snaith et al., Nanotechnology 19, 424003-424015 (2008); T. Leijtens et al., ACS Nano 6, 1455-1462 (2012); J. Melas-Kyriazi et al., Adv. Energy. Mater. 1, 407-414 (2011); I-K. Ding et al., Adv. Funct. Mater. 19, 2431-2436 (2009); A. Abrusci et al., Energy Environ. Sci. 4, 3051-3058 (2011)). If the concentration of the solution is low enough, and the solubility of the cast material high enough, the material will completely penetrate the pores as the solvent evaporates. The usual result is that the material forms a "wetting" layer upon the internal surface of the mesoporous film, and uniformly, but not completely, fills the pores throughout the thickness of the electrode. (H. J. Snaith et al., Nanotechnology 19, 424003-424015 (2008); T. Leijtens et al., ACS Nano 6, 1455-1462 (2012); J. Melas-Kyriazi et al., Adv. Energy. Mater. 1, 407-414 (2011); I-K. Ding et al., Adv. Funct. Mater. 19, 2431-2436 (2009); A. Abrusci et al., Energy Environ. Sci. 4, 3051-3058 (2011)).) The degree of "pore-filling" is controlled by varying the solution concentration (J. Melas-Kyriazi et al., Adv. Energy. Mater. 1, 407-414 (2011); I-K. Ding et al., Adv. Funct. Mater. 19, 2431-2436 (2009); A. Abrusci et al., Energy Environ. Sci. 4, 3051-3058 (2011)). If the concentration of the casting solution is high, a "capping layer" will be formed on top of the mesoporous oxide in addition to a high degree of pore-filling. In the films created here, there is no appearance of a capping layer of perovskite when the mesoporous Al$_2$O$_3$ films are coated with the perovskite, indicating that the perovskite is predominantly located within the porous film. To complete the photoactive layer, the hole-transporter, spiro-OMeTAD, is spin-coated on top of the perovskite coated electrode. The spiro-OMeTAD does predominantly fill the pores and forms a capping layer on top of the whole film. The film is capped with a silver electrode to complete the device. A schematic illustration of the device structure is shown in FIG. 1, along with further illustrations of the device structure in FIG. 2 and FIG. 3. We term this type of solar cell, where the photoactive layer is assembled upon a porous insulating scaffold as meso-superstructured solar cells (MSSCs). A cross sectional SEM image of a complete photoactive layer; Glass-FTO-mesoporous Al2O3-K330-spiro-OMeTAD, is shown in FIG. 9.

Solar Cell Characterization

Figure 6:
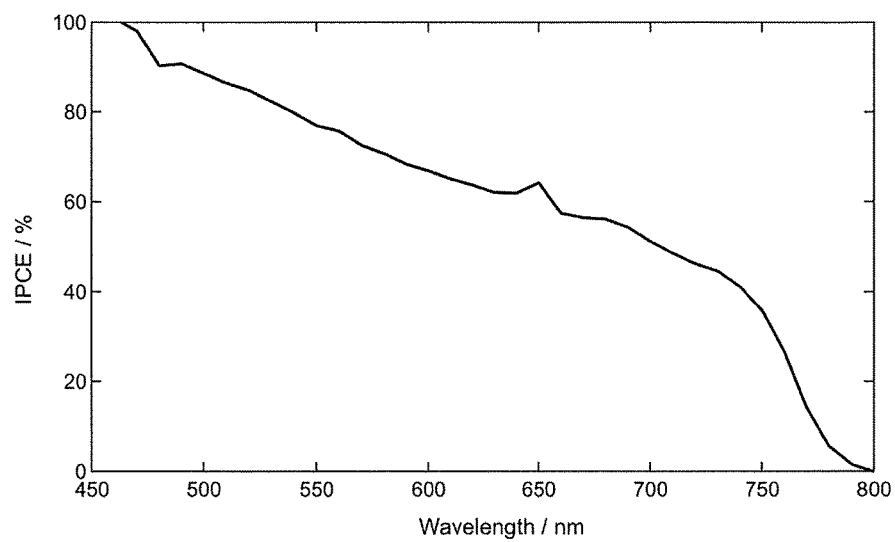
FIG. 6 shows the Incident Photon-to-Electron Conversion Efficiency (IPCE) action spectra of a device assembled in mesoporous absorber structure with hole-conductor: F:SnO$_2$/Compact TiO$_2$/Mesoporous Al$_2$O$_3$/CH$_3$NH$_3$PbCl$_2$I/Spiro-OMeTAD/Ag. On the graph the wavelength in nm is plotted on the x-axis and the IPCE in plotted on the y-axis.

In FIG. 4 the current-voltage curve for a solar cell composed of FTO-compact TiO2-mesoporous $Al_2O_3$—$CH_3NH_3PbCl_2I$ perovskite-spiro-OMeTAD-Ag measured under simulated full sun illumination is shown. The short-circuit photocurrent is 17 mA cm$^{-2}$ and the open-circuit voltage is close to 1 V giving an overall power conversion efficiency of 10.9%. For the most efficient devices the open-circuit voltage is between 1 to 1.1 V. In FIG. 6, the photovoltaic action spectrum is shown for the solar cell, which gives a peak incident photon-to-electron conversion efficiency above 80% and spans the photoactive region from 450 to 800 nm.

Comparison to Existing Technology

Figure 7:
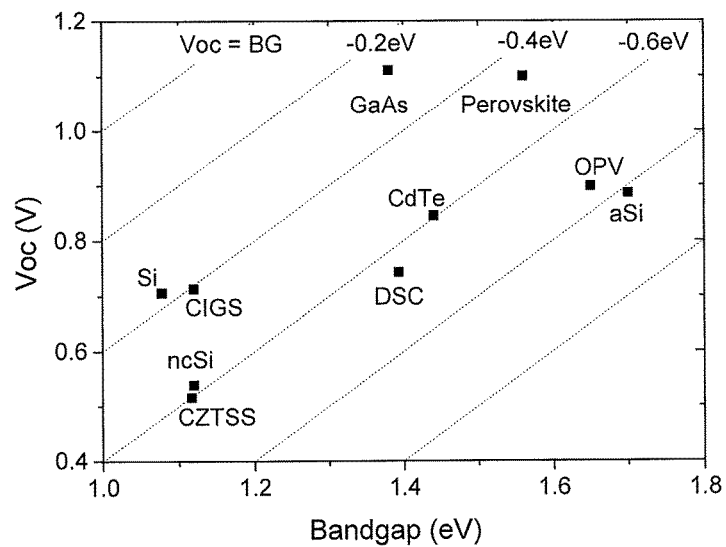
FIG. 7 is a graph of optical band gap on the x-axis against the open-circuit voltage on the y-axis for the "best-in-class" solar cells for most current solar technologies. All the data for the GaAs, Si, CIGS, CdTe, nanocrystaline Si (ncSi), amorphous Si (aSi), CZTSS organic photovoltaics (OPV) and dye-sensitized solar cells (DSC) was taken from Green, M. A., K. Emery, et al. (2012). "Solar cell efficiency tables version 39)." Progress in Photovoltaics 20(1): 12-20. The optical band gap has been estimated by taking the onset of the incident photon-to-electron conversion efficiency, as described in [Barkhouse DAR, Gunawan O, Gokmen T, Todorov T K, Mitzi D B. Device characteristics of a 10.1% hydrazineprocessed Cu2ZnSn(Se,S)4 solar cell. Progress in Photovoltaics: Research and Applications 2012; published online DOI: 10.1002/pip.1160.]

The power-conversion efficiency for this system is at the very highest level for new and emerging solar technologies (M. A. Green, K. Emery, Y. Hishikawa, W. Warta, E. D. Dunlop, Prog. Photovolt. Res. Appl. 19, 565-572 (2011)), but more exciting than the efficiency is the extremely high open-circuit voltage generated. GaAs is the only other photovoltaic technology which both absorbs over the visible to nearIR region and generates such a high open-circuit voltage. The "fundamental energy loss" in a solar cell can be quantified as the difference in energy between the open-circuit voltage generated under full sun light and the band-gap of the absorber (H. J. Snaith, Adv. Funct. Mater. 20, 13-19 (2010)). The theoretical maximum open-circuit voltage can be estimated as a function of band gap following the Shockley-Queisser treatment (I-K. Ding et al., Adv. Funct. Mater. 19, 2431-2436 (2009)), and for a material with a band gap of 1.55 eV the maximum possible open-circuit voltage under full sun illumination is 1.3 V, giving a minimum "loss-in-potential" 0.25 eV. In FIG. 7, the open-circuit voltage is plotted versus the optical-band gap of the absorber, for the "best-in-class" of most established and emerging solar technologies. For the meso-superstructured perovskite solar cell the optical band gap is taken to be 1.55 eV and the open-circuit voltage to be 1.1 V. With loss-in-potential as the only metric, the new technology is very well positioned in fourth out of all solar technologies behind GaAs, crystalline silicon and copper indium gallium (di) selenide. Remarkably, the perovskite solar cells have fundamental losses than are lower than CdTe, which is the technology of choice for the world's largest solar company.

Perovskite Crystal Structure

Figure 8:
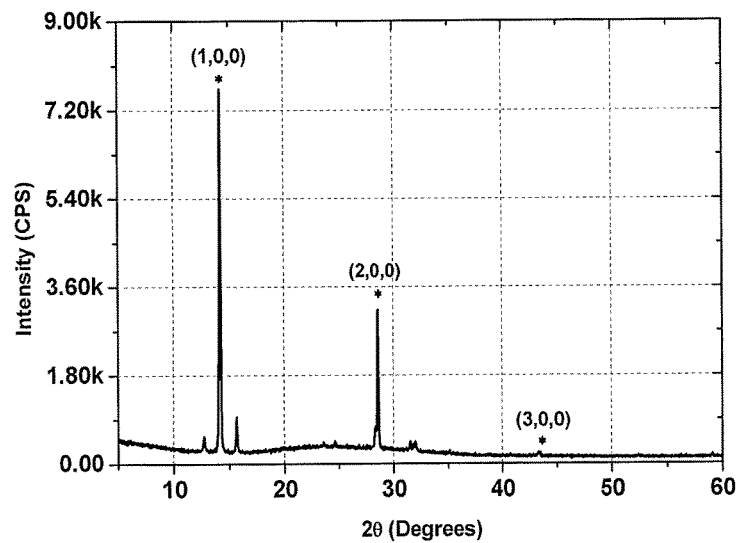
FIG. 8 is an X-ray diffraction pattern extracted at room temperature from $CH_3NH_3PbCl_2I$ thin film coated onto glass slide by using X'pert Pro X-ray Diffractometer. #

The X-ray diffraction pattern, shown in FIG. 8 was extracted at room temperature from $CH_3NH_3PbCl_2I$ thin film coated onto glass slide by using X'pert Pro X-ray Diffractometer.

FIG. 8 shows the typical X-ray diffraction pattern of the (Methylammonium Dichloromonoiodo plumbate(II); $CH_3NH_3PbCl_2I$ film on glass substrate. X-ray diffraction pattern confirms the ABX$_3$ type of cubic (a=b=c=90) perovskite structure (Pm3m). $CH_3NH_3PbCl_2I$ gave diffraction peaks at 14.20, 28.58, and 43.27°, assigned as the (100), (200), and (300) planes, respectively of a cubic perovskite structure with lattice parameter a) 8.835 Å, b) 8.835 and c) 11.24 Å. A sharp diffraction peaks at (h 0 0; where h=1-3) suggest that the films fabricated on glass substrate were predominantly single phase and were highly oriented with the a-axis self-assembly ["Organometal Halide Perovskites as Visible-Light Sensitizers for Photovoltaic Cells" Akihiro Kojima, Kenjiro Teshima, Yasuo Shirai and Tsutomu Miyasaka, J. Am. Chem. Soc. 2009, 131, 6050].

$CH_3NH_3^+$ cation cannot be assigned in the X ray given its dynamic orientation, $CH_3NH_3^+$ is incompatible with the molecular symmetry, and hence the cation is still disordered in this phase at room temperature. And thus, the effective contribution of the C and N atoms to the total diffracted intensity is very small relative to the contributions from Pb and X (Cl and I) ["Alkylammonium lead halides. Part 2. $CH_3NH_3PbX_3$ (X=Cl, Br, I) perovskites: cuboctahedral halide cages with isotropic cation reorientation", Osvaldkn OP and Rodericke Wasylishenm et al. Can. J. Chem. 1990, 68, 412.].

The peak positions for the synthesised mixed $CH_3NH_3PbCl_2I$ at (h,0,0) were observed to be shifted towards lower 2θ and were positioned in between the pure methylammonium trihalogen plumbate i.e. $CH_3NH_3PbI_3$ and $CH_3NH_3PbCl_3$ ["Dynamic disorder in methylammoniumtrihalogenoplumbates (II) observed by millimeter-wave spectroscopy", A. Poglitsch and D. Weber, J. Chem. Phys. 1987, 87, 6373.] respectively, and also the increased lattice parameter (a=8.835 Å) of the $CH_3NH_3PbCl_2I$ film as compared to pure "Cl" based perovskite i.e. $CH_3NH_3PbCl_3$ (a=5.67 Å) with the addition of "I" content gives an evidence of the formation of mixed halide perovskite ["Optical properties of $CH_3NH_3PbX_3$ (X=halogen) and their mixed-halide crystals", N. Kitazawa, Y. Watanabe and Y Nakamura, J. Mat Sci. 2002, 37, 3585.].

The diffraction pattern of the product contained a few unidentified peaks, they can attributed to the various factors including the presence of some impurity (e.g. Pb(OH)Cl, $CH_3NH_3X$; X=Cl and/or I, or a related compounds that may generate during the synthesis even if slightly excess of reactants are used, and also to the hygroscopic nature of the compound which can resultantly form unwanted impurity ["Alkylammonium lead halides. Part 2. $CH_3NH_3PbX_3$ (X=Cl, Br, I) perovskites: cuboctahedral halide cages with isotropic cation reorientation", Osvaldkn OP and Rodericke Wasylishenm et al. Can. J. Chem. 1990, 68, 412.] Additionally, "I" ion present in the lattice may split some of the peaks at room temperature given the fact that the pure "I" based perovskite ($CH_3NH_3PbI_3$) forms tetragonal structure ["Alkylammonium lead halides. Part 1. Isolated ~b 1 6 i~on-s in $(CH_3NH_3)_4Pb_{16}$-$_2H_2O$" Beverlyr Vincent K, Robertsont, Stanlecya merona, N Dosvaldk, Can. J. Chem. 1987, 65, 1042; "Organometal Halide Perovskites as Visible-Light Sensitizers for Photovoltaic Cells" Akihiro Kojima, Kenjiro Teshima, Yasuo Shirai and Tsutomu Miyasaka, J. Am. Chem. Soc. 2009, 131, 6050].

Figure 10A:
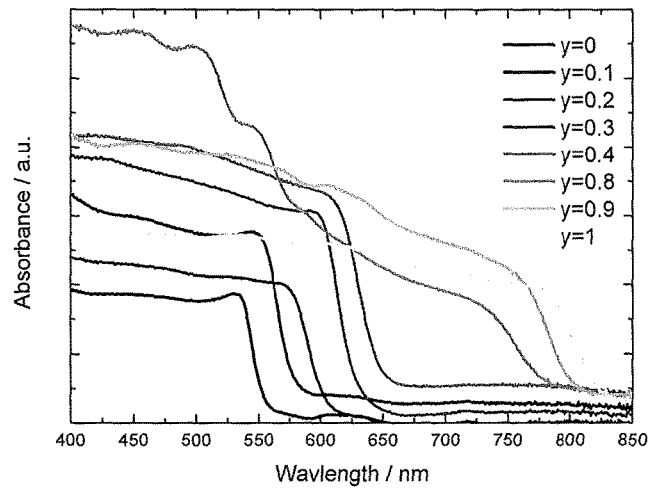
FIG. 10(a) shows UV-vis absorption spectra of the range of $FOPbI_{3y}Br_{3(1-y)}$ perovskites and FIG. 10(b) shows steady-state photoluminescence spectra of the same samples.
Figure 10B:
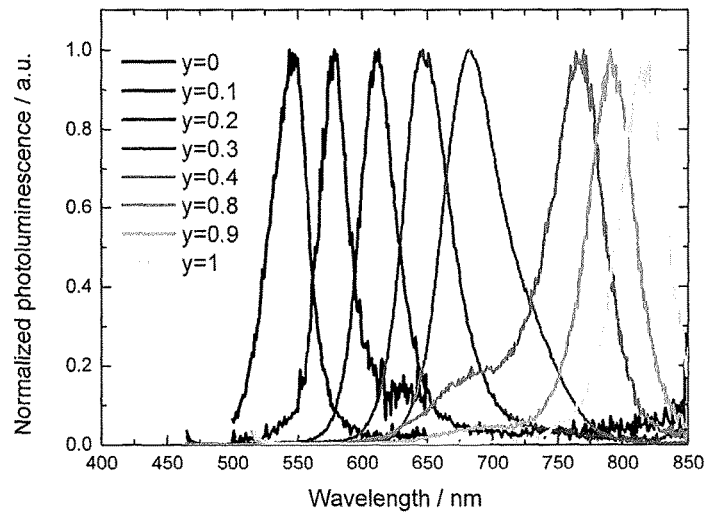
Figure 11D:
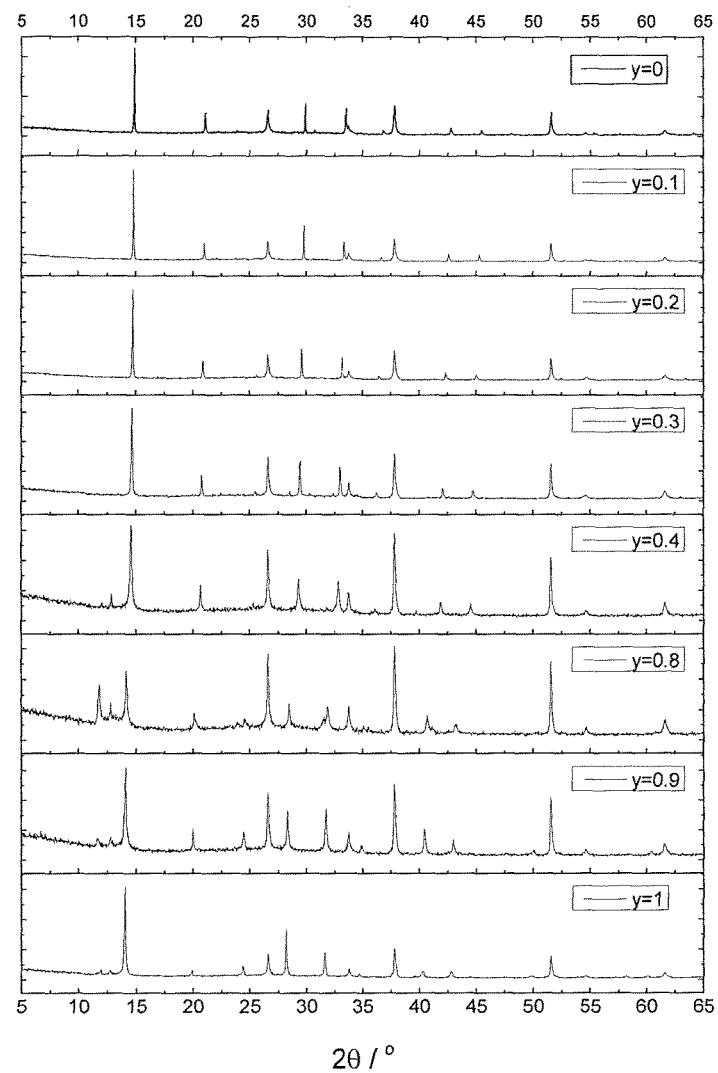
FIG. 11(d) shows X-ray diffraction data for the $FOPbI_{3y}Br_{3(1-y)}$ perovskites, for various values of y ranging from 0 to 1.
Figure 11E:
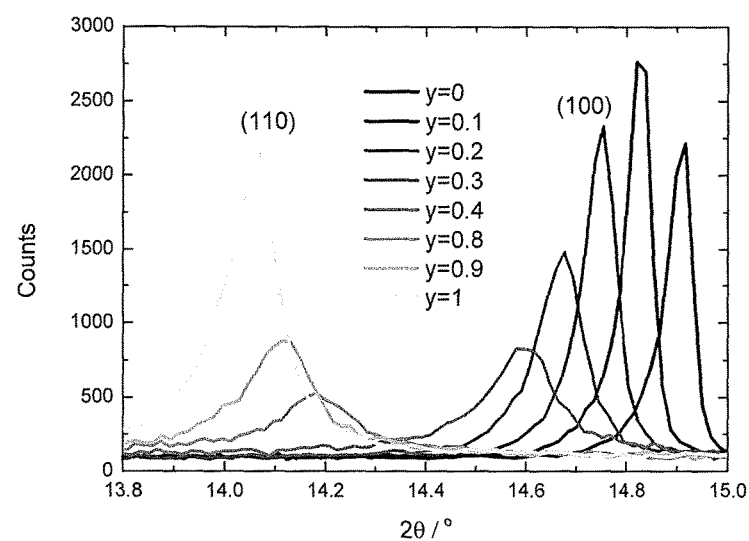
FIG. 11(e) shows a magnification of the transition between the (100) cubic peak and the (110) tetragonal peak, corresponding to the (100) pseudocubic peak, as the system moves from bromide to iodide.
Figure 11F:
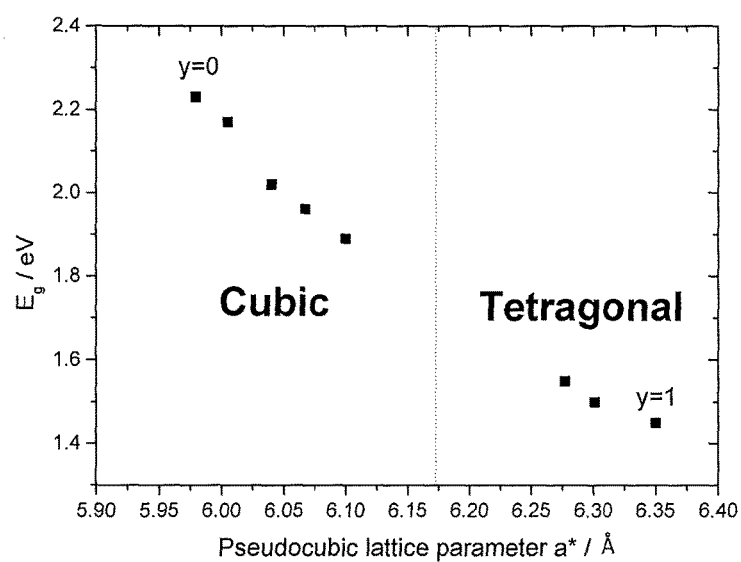
FIG. 11(f) shows a plot of bandgap against calculated pseudocubic lattice parameter.
Figure 12A:
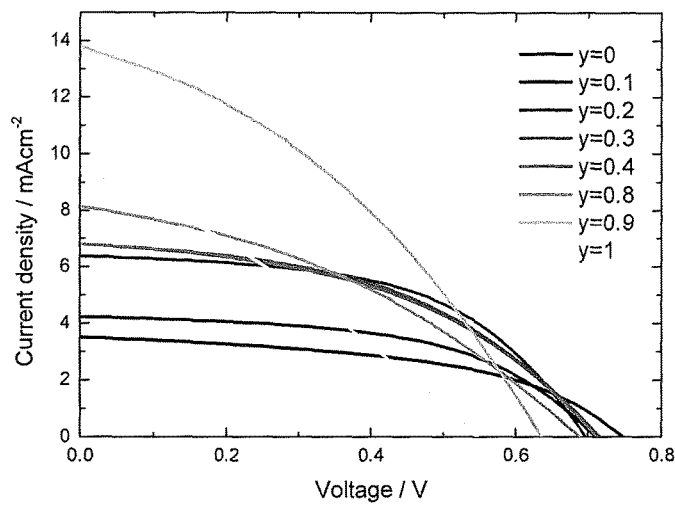
FIG. 12(a) shows average current-voltage characteristics for a batch of solar cells comprising $FOPbI_{3y}Br_{3(1-y)}$ perovskites sensitizing mesoporous titania, with spiro-OMeTAD as the hole transporter, measured under simulated AM1.5 sunlight.
Figure 12:
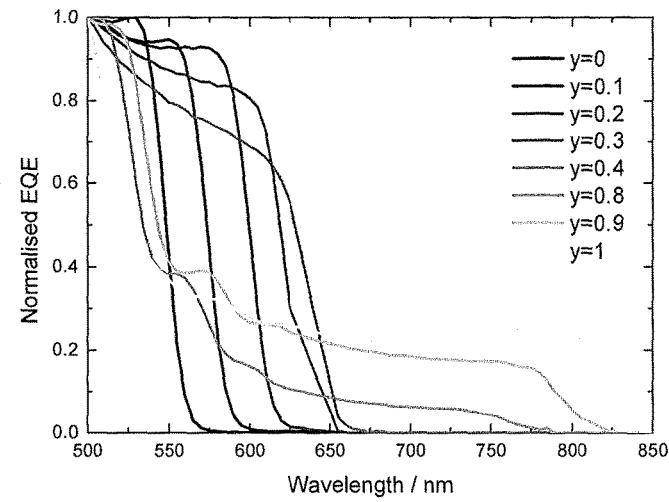
FIG. 12(b) shows a normalised external quantum efficiency for representative cells.
FIG. 12(c) shows a plot of the device parameters of merit for the batch, as a function of the iodine fraction, y, in the $FOPbI_{3y}Br_{3(1-y)}$ perovskite.
Figure 12C:
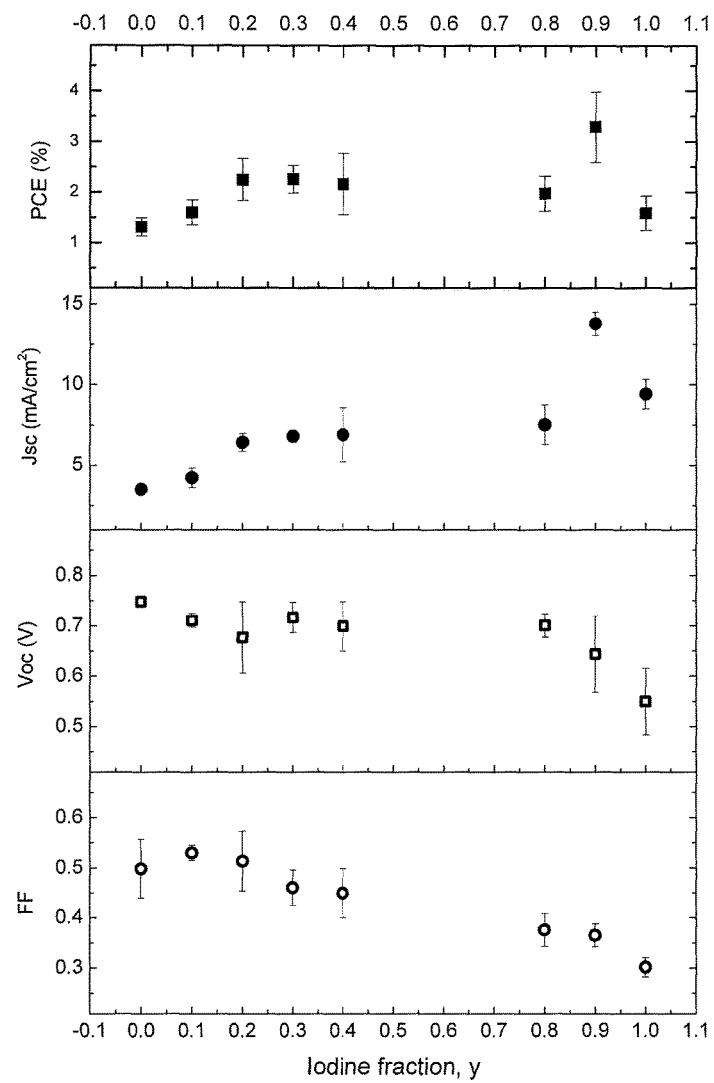

FIGS. 10 to 12 relate to perovskites comprising a formamidinium cation and devices comprising $FOPbI_{3y}Br_{3(1-y)}$. In general, it is considered to be advantageous to retain a 3D crystal structure in the perovskite, as opposed to creating layered perovskites which will inevitably have larger exciton binding energies (Journal of Luminescence 60&61 (1994) 269 274). It is also advantageous to be able to tune the band gap of the perovskite. The band gap can be changed by either changing the metal cations or halides, which directly influence both the electronic orbitals and the crystal structure. Alternatively, by changing the organic cation (for example from a methylammonium cation to a formamidinium cation), the crystal structure can be altered. However, in order to fit within the perovskite crystal, the following $$(R_A+R_X)=t\sqrt{2}(R_B+R_X)$$

geometric condition must be met: wherein $R_{A,B,\&X}$ are the ionic radii of ABX ions. The inventor have unexpectedly found that formamidinium cation (FO) does indeed form the perovskite structure in a the cubic structure in a FOPbBr$_3$ or FOPbI$_3$ perovskite, and mixed halide perovskites thereof.

The work leading to this invention has received funding from the European Research Council under the European Union's Seventh Framework Programme (FP7/2007-2013/ERC grant agreement no 279881).

The invention claimed is:

1. A photovoltaic device comprising:
   a first electrode;
   a second electrode; and disposed between the first and second electrodes:
   a photoactive layer; and
   a compact layer comprising a metal oxide or a metal chalcogenide;
   wherein the photoactive layer comprises:
   (i) a porous dielectric scaffold consisting of a material having a band gap of equal to or greater than 4.0 eV; and
   (ii) a perovskite semiconductor having a band gap of less than or equal to 3.0 eV, in contact with the porous dielectric scaffold material; and
   (iii) a charge transporting material, wherein the charge transporting material is a hole transporting material,
   wherein the perovskite semiconductor comprises at least one halide anion.

2. The photovoltaic device according to claim 1 wherein the perovskite semiconductor has a band gap of less than or equal to 2.8 eV.

3. The photovoltaic device according to claim 1 wherein the perovskite semiconductor is disposed on the surface of the porous dielectric scaffold material, and the perovskite semiconductor is disposed on the surfaces of pores within the porous dielectric scaffold material.

4. The photovoltaic device according to claim 1 wherein the porous dielectric scaffold material comprises an oxide of aluminium, germanium, zirconium, silicon, yttrium or ytterbium; or alumina silicate.

5. The photovoltaic device according to claim 1 wherein the porous dielectric scaffold material comprises porous alumina.

6. The photovoltaic device according to claim 1, wherein the porosity of the porous dielectric scaffold material is equal to or greater than 50%.

7. The photovoltaic device according to claim 1 wherein the porous dielectric scaffold material is mesoporous.

8. The photovoltaic device according to claim 1 wherein the perovskite semiconductor is also a photosensitizing material.

9. The photovoltaic device according to claim 1 wherein the perovskite semiconductor is any one of an n-type semiconductor, a p-type semiconductor, and an intrinsic semiconductor.

10. The photovoltaic device according to claim 1 wherein the perovskite semiconductor comprises a first cation, a second cation, and said at least one halide anion.

11. The photovoltaic device according to claim 10 wherein the second cation is a metal cation selected from Sn$^{2+}$ and Pb$^{2+}$.

12. The photovoltaic device according to claim 10 wherein the first cation is an organic cation, and the organic cation has a formula (R$_5$NH$_3$)$^+$, wherein R$_5$ is hydrogen, or unsubstituted or substituted C$_1$-C$_{20}$ alkyl.

13. The photovoltaic device according to claim 1 wherein the perovskite semiconductor is a mixed-anion perovskite comprising a first cation, a second cation, and two or more different anions selected from halide anions and chalcogenide anions.

14. The photovoltaic device according to claim 13 wherein the perovskite semiconductor is a mixed-halide perovskite, wherein said two or more different anions are two or more different halide anions.

15. The photovoltaic device according to claim 1 wherein the perovskite semiconductor is a perovskite semiconductor compound of formula (I):

$$[A][B][X]_3 \tag{I}$$

wherein:
[A] is at least one organic cation;
[B] is at least one metal cation; and
[X] is at least one anion.

16. The photovoltaic device according to claim 15 wherein [X] is two or more different halide anions.

17. The photovoltaic device according to claim 1 wherein the perovskite semiconductor is a perovskite compound of a formula (IA):

$$AB[X]_3 \tag{IA}$$

wherein:
A is an organic cation;
B is a metal cation; and
[X] is two or more different halide anions.

18. The photovoltaic device according to claim 1 wherein the perovskite semiconductor is a perovskite compound of formula (II):

$$ABX_{3-y}X'_y \tag{II}$$

wherein:
A is an organic cation;
B is an metal cation;
X is a first halide anion;
X' is a second halide anion that is different from the first halide anion; and
y is from 0.05 to 2.95.

19. The photovoltaic device according to claim 1, wherein the perovskite semiconductor is selected from CH$_3$NH$_3$PbBrI$_2$, CH$_3$NH$_3$PbBrCl$_2$, CH$_3$NH$_3$PbIBr$_2$, CH$_3$NH$_3$PbICl$_2$, CH$_3$NH$_3$PbClBr$_2$, CH$_3$NH$_3$PbI$_2$Cl, CH$_3$NH$_3$SnBrI$_2$, CH$_3$NH$_3$SnBrCl$_2$, CH$_3$NH$_3$SnF$_2$Br, CH$_3$NH$_3$SnIBr$_2$, CH$_3$NH$_3$SnICl$_2$, CH$_3$NH$_3$SnF$_2$I, CH$_3$NH$_3$SnClBr$_2$, CH$_3$NH$_3$SnI$_2$Cl and CH$_3$NH$_3$SnF$_2$Cl.

20. The photovoltaic device according to claim 1 wherein the hole transporting material is a polymeric or molecular hole transporter.

21. The photovoltaic device according to claim 1 wherein the hole transporting material is one selected from:
   2,2',7,7'-tetrakis-(N,N-di-p-methoxyphenylamine)9,9'-spirobifluorene) (spiro-OMeTAD);
   poly(3-hexylthiophene)(P3HT);
   Poly[2,1,3-benzothiadiazole-4,7-diyl[4,4-bis(2-ethylhexyl)-4H-cyclopenta[2,1-b:3,4-b']dithiophene-2,6-diyl]] (PCPDTBT); and
   poly(N-vinylcarbazole) (PVK).

22. The photovoltaic device according to claim 1 wherein the hole transporting material is an inorganic hole transporter, and the inorganic hole transporter is CuI, CuBr, CuSCN, Cu$_2$O, CuO or CIS.

23. The photovoltaic device according to claim 1 wherein the charge transporting material is disposed within pores of the porous dielectric scaffold material.

24. The photovoltaic device according to claim 1, wherein the perovskite semiconductor is disposed on the surface of pores within the porous dielectric scaffold material, and wherein said charge transporting material is disposed within pores of the porous dielectric scaffold material.

25. The photovoltaic device according claim 1 wherein the photoactive layer comprises said charge transporting material disposed on a layer comprising the porous dielectric scaffold material and said perovskite semiconductor, wherein the perovskite semiconductor is disposed on the surface of pores within the porous dielectric scaffold material, and wherein the photovoltaic device further comprises said charge transporting material disposed within pores of the porous dielectric scaffold material.

26. The photovoltaic device according to claim 1 wherein a thickness of the photoactive layer is from 100 nm to 3000 nm.

27. The photovoltaic device according to claim 1 wherein the compact layer comprises a metal oxide or a metal sulphide.

28. The photovoltaic device according to claim 1 further comprising an additional layer, disposed between the compact layer and the photoactive layer, wherein: the additional layer comprises a metal oxide or a metal chalcogenide that may be: (a) a same metal oxide or metal chalcogenide of the compact layer; or (b) a different metal oxide or metal chalcogenide of the compact layer.

29. The photovoltaic device according to claim 28 wherein the compact layer comprises an n-type semiconductor comprising an oxide of titanium, tin, zinc, gallium, niobium, tantalum, indium, neodymium, palladium or cadmium, or a sulphide of zinc or cadmium, and wherein the additional layer comprises alumina, magnesium oxide, cadmium sulphide, silicon dioxide or yttrium oxide.

30. The photovoltaic device according to claim 1, wherein said photoactive layer further comprises encapsulated metal nanoparticles.

31. A photoactive layer for a photovoltaic device comprising (a) a porous dielectric scaffold consisting of a material having a band gap of equal to or greater than 4.0 eV; (b) a perovskite semiconductor having a band gap of less than or equal to 3.0 eV, in contact with the porous dielectric scaffold material, wherein the perovskite semiconductor comprises at least one halide anion; and (c) a charge transporting material, wherein the charge transporting material is a hole transporting material.

32. The photoactive layer according to claim 31, wherein said photoactive layer further comprises encapsulated metal nanoparticles.

* * * * *